(12) United States Patent
Files et al.

(10) Patent No.: US 12,308,507 B2
(45) Date of Patent: May 20, 2025

(54) INFORMATION HANDLING SYSTEM ANTENNA MODULE INTEGRATED IN THERMAL SOLUTION

(71) Applicant: Dell Products L.P., Round Rock, TX (US)

(72) Inventors: Jace W. Files, Round Rock, TX (US); John Trevor Morrison, Round Rock, TX (US); Chiu-Jung Tsen, Zhubei (TW)

(73) Assignee: Dell Products L.P., Round Rock, TX (US)

( * ) Notice: Subject to any disclaimer, the term of this patent is extended or adjusted under 35 U.S.C. 154(b) by 250 days.

(21) Appl. No.: 18/081,148

(22) Filed: Dec. 14, 2022

(65) Prior Publication Data
US 2024/0204387 A1 Jun. 20, 2024

(51) Int. Cl.
*H05K 7/20* (2006.01)
*H01Q 1/02* (2006.01)
*H01Q 1/22* (2006.01)
*H01Q 1/48* (2006.01)

(52) U.S. Cl.
CPC ............. *H01Q 1/02* (2013.01); *H01Q 1/2266* (2013.01); *H01Q 1/48* (2013.01); *H05K 7/20136* (2013.01)

(58) Field of Classification Search
CPC .................................................. H05K 7/20136
See application file for complete search history.

(56) References Cited

U.S. PATENT DOCUMENTS

| | | | |
|---|---|---|---|
| 6,266,241 B1 | 7/2001 | Van Brocklin | |
| 6,798,669 B1 | 9/2004 | Hsu | |
| 6,813,165 B2 | 11/2004 | Cheng | |
| 6,999,313 B2 | 2/2006 | Shih | |
| 7,413,402 B2 | 8/2008 | Kang | |
| 8,917,501 B2 | 12/2014 | Hokugou et al. | |
| 9,232,171 B2 * | 1/2016 | Sugiura | H05K 7/20136 |
| 9,307,677 B2 | 4/2016 | Huang | |
| 9,769,958 B2 | 9/2017 | Jaskela | |
| 10,184,478 B2 | 1/2019 | Lai | |
| 10,481,658 B1 | 11/2019 | Curtis | |
| 10,606,323 B1 * | 3/2020 | Chang | H05K 5/0226 |
| 10,852,782 B2 * | 12/2020 | Chang | G06F 1/1681 |
| 10,860,112 B1 | 12/2020 | Knoppert et al. | |
| 11,245,174 B2 * | 2/2022 | Hirota | H01Q 1/48 |

(Continued)

*Primary Examiner* — Lisa Lea-Edmonds
(74) *Attorney, Agent, or Firm* — Zagorin Cave LLP; Robert W. Holland

(57) ABSTRACT

A portable information handling system is assembled and disassembled by a keystone assembly that couples at an upper surface of the portable housing to overlap a keyboard assembly that covers processing components disposed in the portable housing. A motherboard couples to the portable housing under the keyboard assembly with retaining nuts extending from the housing, the motherboard retained in an engaged position by a cooling fan that directs cooling airflow out an exhaust. The exhaust integrates an antenna and coaxial cable in a nonconductive material, such as plastic, and has connectors exposed at the motherboard to interface with a radio, such as for WiFi or Bluetooth. A metallic cooling channel exposed in the exhaust and thermally coupled to the CPU by a heat pipe provides an antenna ground plane and/or a floating portion that acts as a directional parabolic element.

17 Claims, 55 Drawing Sheets

(56) References Cited

U.S. PATENT DOCUMENTS

| | | | |
|---|---|---|---|
| 11,294,435 B2* | 4/2022 | Lin | G06F 1/203 |
| 11,349,193 B2* | 5/2022 | Ramasamy | H01Q 1/2266 |
| 11,513,568 B2* | 11/2022 | Chang | H05K 5/03 |
| 11,662,784 B2* | 5/2023 | Lin | G06F 1/181 |
| | | | 361/679.02 |
| 11,740,707 B1 | 8/2023 | Files | |
| 11,832,069 B1 | 11/2023 | Morrison | |
| 11,905,742 B2 | 2/2024 | Morrison | |
| 11,914,428 B1 | 2/2024 | Files | |
| 11,930,622 B2* | 3/2024 | He | H05K 7/20409 |
| 11,983,049 B2* | 5/2024 | Chang | G06F 1/1618 |
| 11,991,850 B2 | 5/2024 | Hung | |
| 12,001,250 B2* | 6/2024 | Kim | H01Q 1/2266 |
| 2001/0029128 A1 | 10/2001 | Horiuchi | |
| 2004/0114333 A1 | 6/2004 | Gonzalez | |
| 2004/0256334 A1 | 12/2004 | Chen | |
| 2008/0019085 A1 | 1/2008 | Nakajima | |
| 2008/0253076 A1 | 10/2008 | Chen | |
| 2008/0285217 A1 | 11/2008 | Nakajima | |
| 2011/0043989 A1 | 2/2011 | Tien | |
| 2011/0216007 A1* | 9/2011 | Cheng | G06F 3/02 |
| | | | 345/168 |
| 2013/0026333 A1 | 1/2013 | Wu | |
| 2013/0286561 A1 | 10/2013 | Hokugou et al. | |
| 2014/0253150 A1 | 9/2014 | Menzel | |
| 2017/0086332 A1 | 3/2017 | Jaskela | |
| 2018/0284905 A1 | 10/2018 | Hewett | |
| 2019/0393631 A1 | 12/2019 | Haswarey | |
| 2020/0192438 A1* | 6/2020 | Chang | G06F 1/1616 |
| 2020/0192439 A1* | 6/2020 | Lin | H05K 1/141 |
| 2020/0235461 A1* | 7/2020 | Hirota | H01Q 1/48 |
| 2021/0055767 A1* | 2/2021 | Chang | G06F 1/1662 |
| 2021/0089094 A1* | 3/2021 | Watamura | G06F 1/203 |
| 2021/0175606 A1* | 6/2021 | Ramasamy | H01Q 1/52 |
| 2021/0232234 A1 | 7/2021 | Morrison et al. | |
| 2021/0334417 A1 | 10/2021 | Morrison | |
| 2021/0405951 A1 | 12/2021 | Kumar | |
| 2022/0011829 A1 | 1/2022 | Liang | |
| 2022/0147122 A1* | 5/2022 | Lin | G06F 1/189 |
| 2023/0037441 A1* | 2/2023 | Chang | G06F 1/1698 |
| 2023/0083366 A1 | 3/2023 | Rogers | |
| 2023/0225070 A1 | 7/2023 | Hung | |
| 2023/0232592 A1 | 7/2023 | Killen | |
| 2024/0036615 A1 | 2/2024 | Perelli et al. | |
| 2024/0036616 A1 | 2/2024 | Perelli | |
| 2024/0036621 A1* | 2/2024 | Kim | H01Q 1/2266 |
| 2024/0201735 A1 | 6/2024 | Tsen | |
| 2024/0201738 A1 | 6/2024 | Tsen | |
| 2024/0201744 A1 | 6/2024 | Files | |
| 2024/0201749 A1 | 6/2024 | Tsen | |
| 2024/0201750 A1 | 6/2024 | Morrison | |
| 2024/0201755 A1 | 6/2024 | Chou | |
| 2024/0201756 A1 | 6/2024 | Morrison | |
| 2024/0201757 A1 | 6/2024 | Chou | |
| 2024/0201795 A1 | 6/2024 | Morrison | |
| 2024/0201796 A1 | 6/2024 | Morrison | |
| 2024/0201935 A1 | 6/2024 | Files | |
| 2024/0204387 A1* | 6/2024 | Files | H01Q 1/02 |
| 2024/0206112 A1 | 6/2024 | Tsen | |
| 2024/0206113 A1 | 6/2024 | Morrison | |
| 2024/0268053 A1 | 8/2024 | Hung | |

* cited by examiner

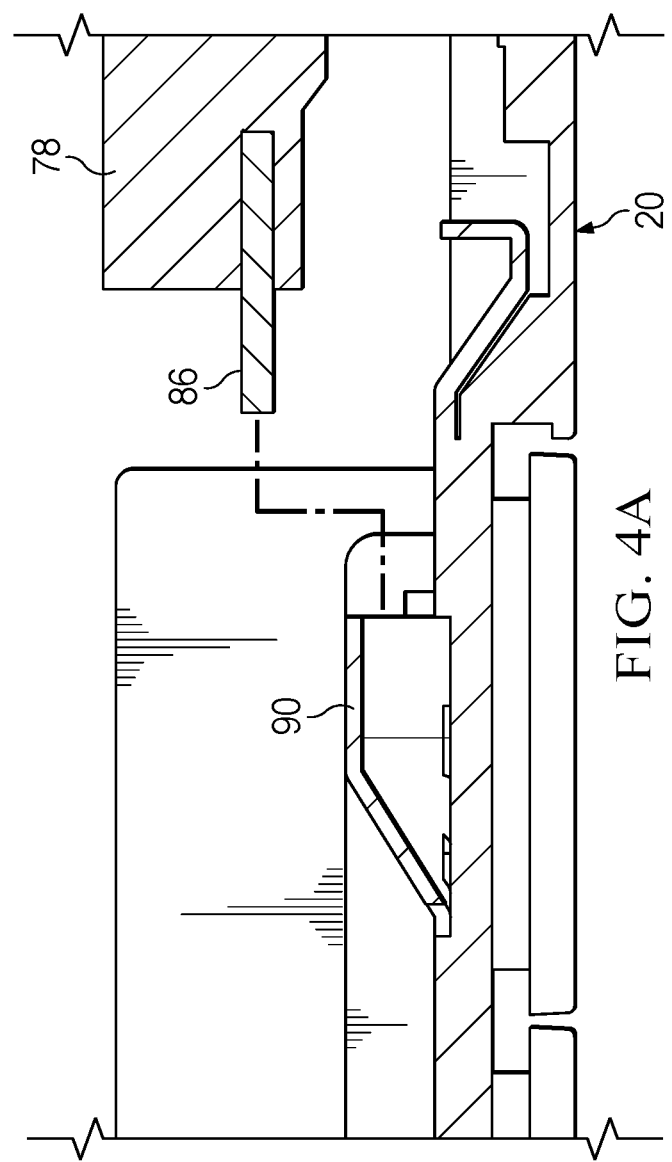

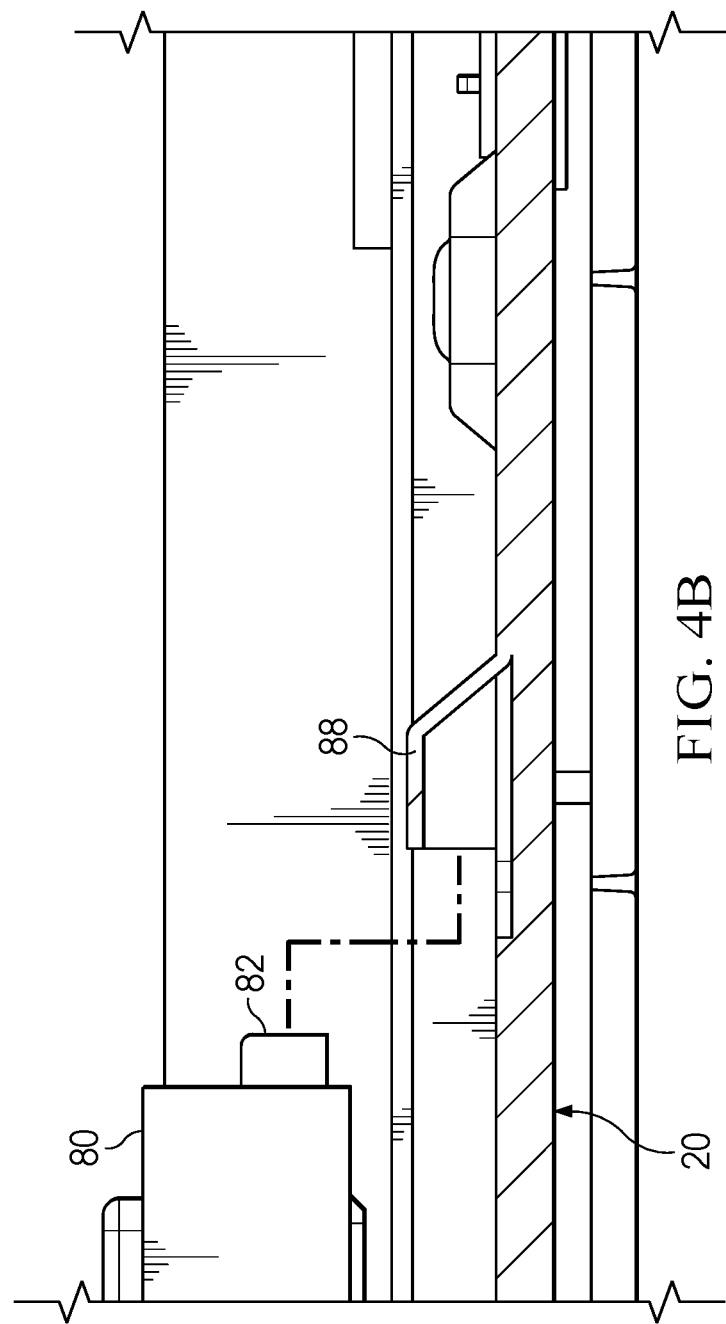

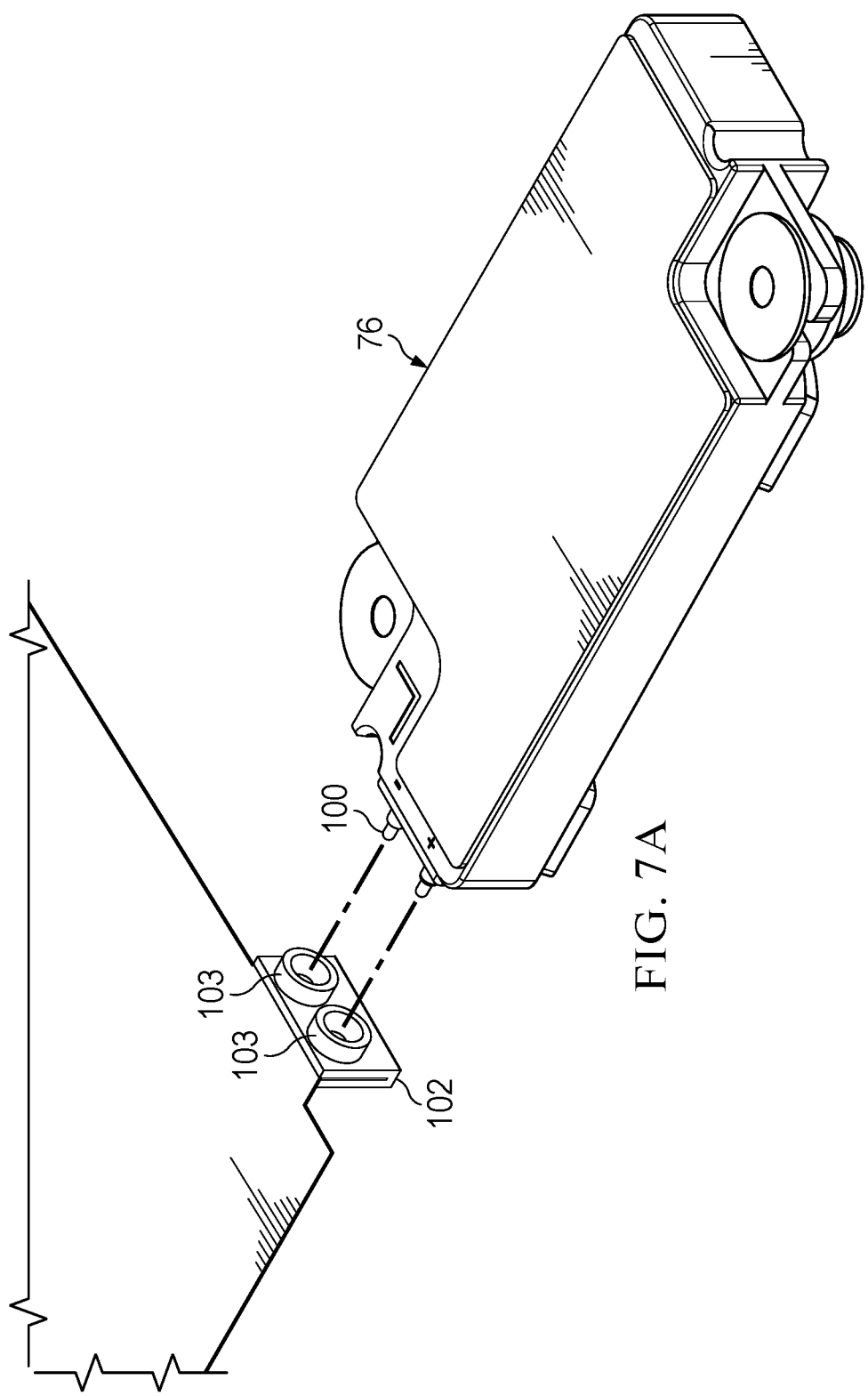

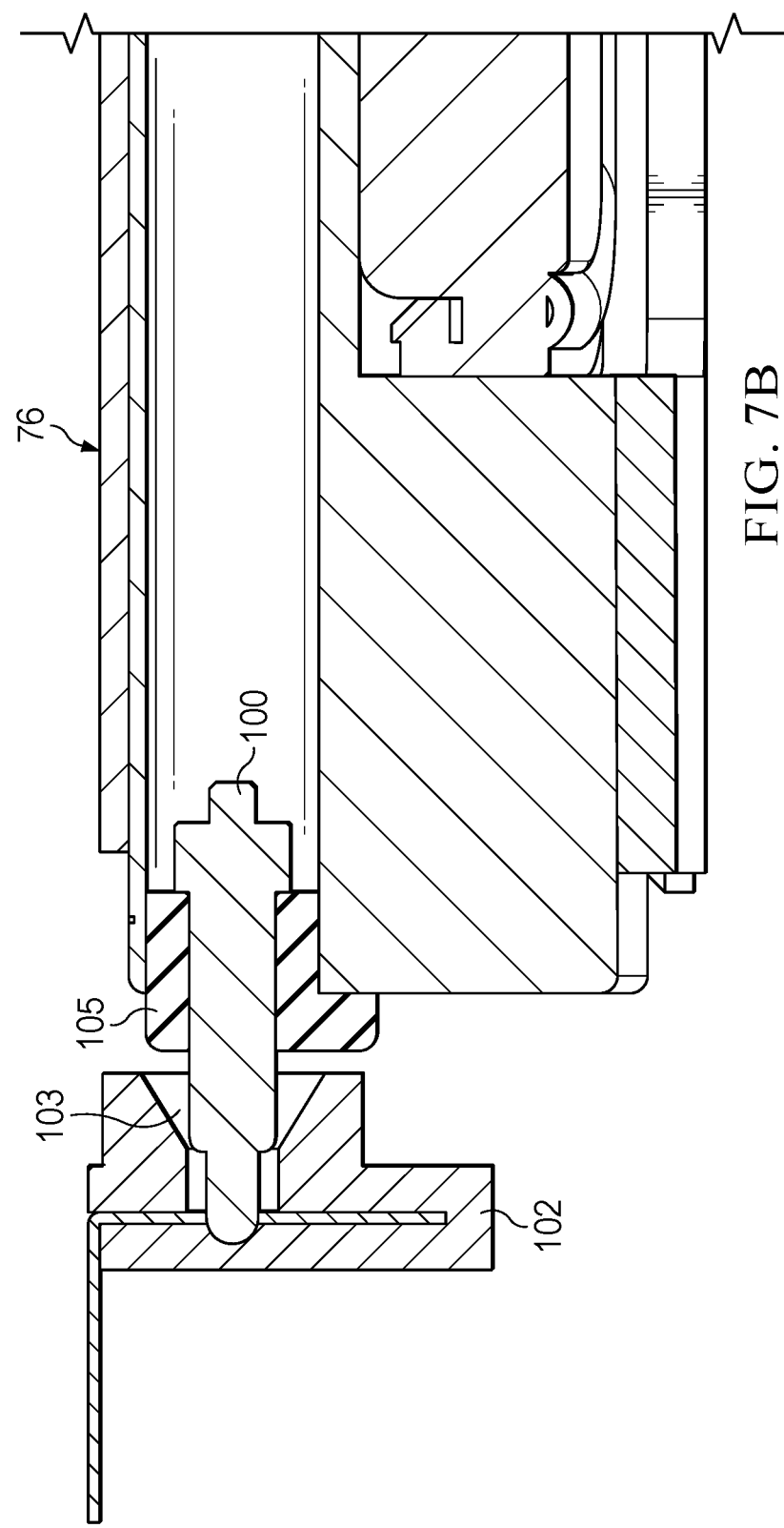

| PARTS | PIN NUMBER | DEFINITION |
|---|---|---|
| SPEAKER | 1 | L_SPK_P |
|  | 2 | L_SPK_N |
|  | 3 | R_SPK_P |
|  | 4 | R_SPK_N |
| POWER/BACKLIGHT | 5 | VDD_5V |
| POWER KEY | 6 | POWER KEY |
| TOUCH PAD | 7 | LID |
| GND | 8 | GND |
| USB HUB | 9 | USB_DM |
|  | 10 | USB_DP |
| FINGER PRINTER | 11 | FPR SCAN |
| BATTERY PRESENT | 12 | BAT_PRESENT |

FIG. 15C

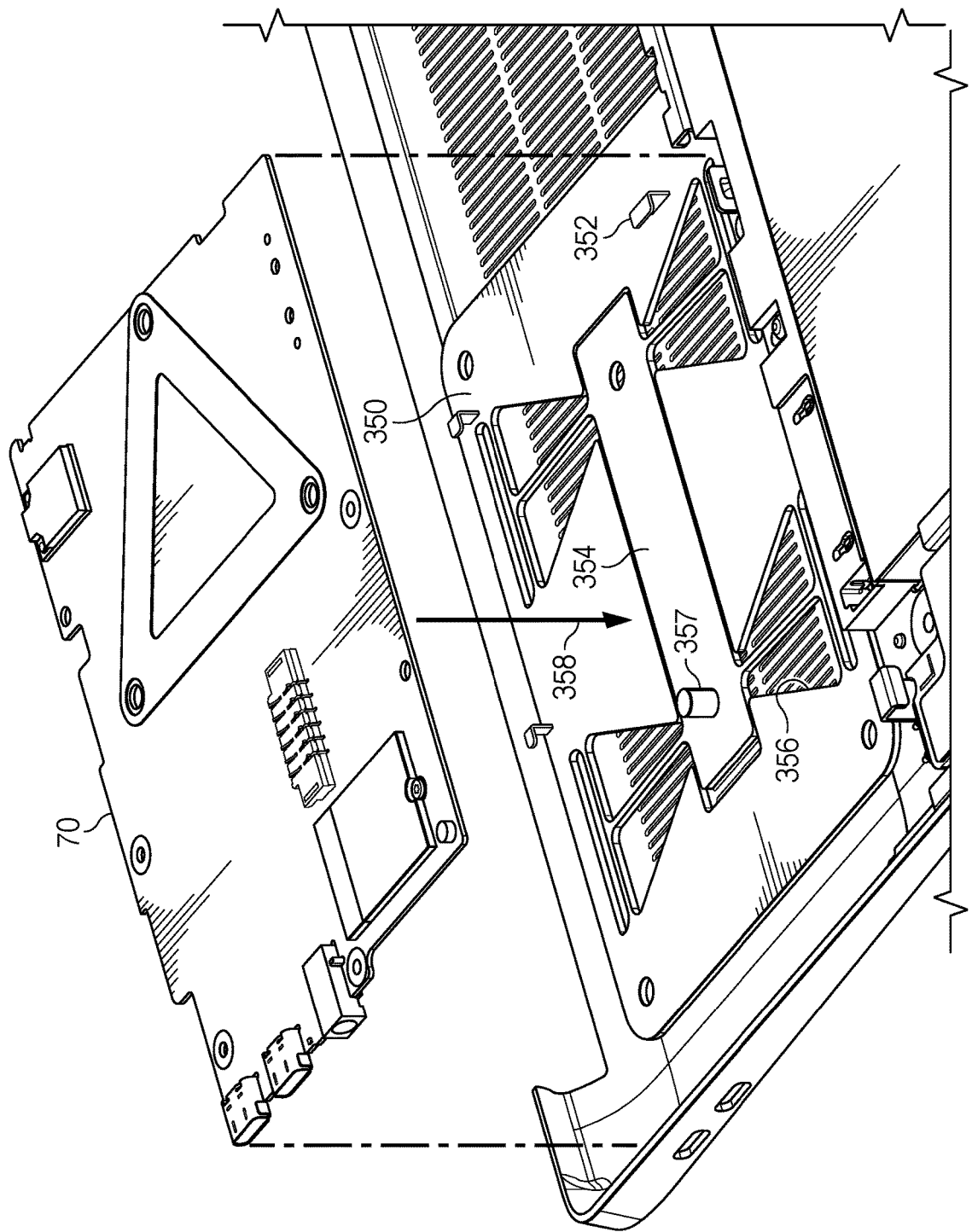

INFORMATION HANDLING SYSTEM ANTENNA MODULE INTEGRATED IN THERMAL SOLUTION

BACKGROUND OF THE INVENTION

Field of the Invention

The present invention relates in general to the field of portable information handling systems, and more particularly to an information handling system antenna module integrated in thermal solution.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Portable information handling systems integrate processing components, a display and a power source in a portable housing to support mobile operations. Portable information handling systems allow end users to carry a system between meetings, during travel, and between home and office locations so that an end user has access to processing capabilities while mobile. Tablet configurations typically expose a touchscreen display on a planar housing that both outputs information as visual images and accepts inputs as touches. Convertible configurations typically include multiple separate housing portions that couple to each other so that the system converts between closed and open positions. For example, a main housing portion integrates processing components and a keyboard and rotationally couples with hinges to a lid housing portion that integrates a display. In a clamshell configuration, the lid housing portion rotates approximately ninety degrees to a raised position above the main housing portion so that an end user can type inputs while viewing the display. After usage, convertible information handling systems rotate the lid housing portion over the main housing portion to protect the keyboard and display, thus reducing the system footprint for improved storage and mobility.

Conventional design goals for portable information handling systems have attempted to compress as much processing capability into as small of a housing footprint as possible. These conventional design goals can result in complex systems where design constraints include substantial processing capability, maximum thermal characteristics, minimal power consumption with maximum battery life, low weight and minimal housing height. Typical designs include specialize housing arrangements assembled with screws that attempt to optimize the use of the entire interior housing space taking into account airflow for cooling, battery dimensions, keyboard height processing component dimensions, display dimensions and other factors. Assembly of the housing and processing components with screws helps to ensure a robust system that can withstand impacts common to portable housing configurations. Generally, conventional designs involve a final assembly that is not intended to be broken down except for the most common repairs, such as replacement of a keyboard, addition of DRAM modules and addition or replacement storage devices. Even these types of interactions typically involve removal of dozens of screws and separation of communication cables that interface the various processing components.

Another difficulty with conventional portable information handling system design is that systems are difficult to breakdown at system end-of-life to support recycling and/or reuse of components. Screws, in particular, tend to make system breakdown difficult and inefficient so that recycling can often become cost prohibitive. For example, a portable information handling system at end of life typically has some components that may have additional reuse life remaining, some components that have recyclable materials and some components that are waste. The value of any reusable and recyclable materials is reduced by the cost of separating those materials from waste materials in a form that allows reuse and recycling. When system breakdown cost exceeds the value of reuse and recycling, a default response is too often that components and materials having value are instead sent to waste. Yet, even in those instances where part of the system components are separated to recycle or reuse, many of the system-specific components will not adapt to new use models. For instance, specialized arrangements of components typically result in cables and connectors of different lengths and types to interface the components within a housing. Often the cable format remains the same across information handling system platforms, yet the cables of different lengths make reuse difficult and the cable connectors couple to circuit boards that are difficult to breakdown and reuse.

SUMMARY OF THE INVENTION

Therefore, a need has arisen for a system and method which assembles information handling system portable platform architecture suitable for efficient system break down that encourages recycling and reuse.

In accordance with the present invention, a system and method are provided which substantially reduce the disadvantages and problems associated with previous methods and systems for assembly and disassembly of a portable information handling system. A portable housing couples components without screws in an architecture adapted for component reuse, refurbishment and recycling using automated methods, such as robotic arms.

More specifically, a portable information handling system housing couples together with a single keystone assembly that releases with a sliding motion adaptable to automated manufacturing techniques. Release of the keystone assembly allows a housing cover to slide relative to a main housing portion and lift off to expose internal components for access by robotic arms. A keyboard assembly includes a membrane having key input sensors, a capacitive touch sensor, speaker signal interface wires and battery enable wires include and managed by a printed circuit board integrated in the membrane. The printed circuit board folds to a bottom side of the housing cover to align with a keyboard connector on the system motherboard so that the keyboard interface with the motherboard is completed without an internal cable. The motherboard couples to the housing by sliding onto retention nuts and is secured from disassembly by placement of another component to prevent the sliding, such as a cooling fan that couples up against a side of the motherboard. By avoiding cables and screws, the system assembles and disassembles with mechanical manipulation of automated robotic arms so that components are automatically sorted according to available reuse, refurbishment and recycling classifications.

The present invention provides a number of important technical advantages. One example of an important technical advantage is that a portable information handling system assembles and disassembles in a manner consistent with the operation of automated or robotic techniques. Components couple into place and release from an assembly with simplified manipulation, such as sliding of a motherboard or housing cover to fix into place and release from an assembly. Components assemble and breakdown in logical elements associated with reuse, refurbishment and recycling of the components, such as types of material used, life cycle of the component, and availability for refurbishment. For instance, a keyboard breaks down for separate management of a lattice of keys, a membrane with key sensors and a housing cover. The membrane includes wirelines that replace cables used in conventional information handling systems, such as to support communication of speaker signals and battery power. A single keystone assembly completes system assembly and initiates system disassembly without the use of any screws in any of the major defined component elements. Reducing coupling structures, cables and connectors inside a portable information handling system encourages a circular economy that reduces emissions and waste associated with manufacturing, reduces the carbon footprint and enables automated recycling and reuse to achieve improved efficiency and product use for a full life cycle of the components.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIGS. 4 and 4A through 4C depict a lower rear perspective and cross-sectional view of the housing cover coupling components within the main housing portion by lock members extending down from the housing cover;

FIGS. 7, 7A and 7B depict a speaker having speaker signals to play audible sounds communicated through a keyboard membrane and isolated spring biased contact pins;

FIGS. 15 and 15A through 15C depict an example of a 12 pin keyboard membrane connector interface with integrated intrusion detection;

FIGS. 27A, 27B and 27C depict an alternative embodiment for coupling a motherboard to the information handling system main housing portion;

DETAILED DESCRIPTION

A portable information handling system design shifts towards a reduced carbon footprint with components that enhance repair, refurbishment, material recovery and harvesting for reuse to accelerate the circular economy, reduce emissions in manufacturing and promote recycling and reuse through automation. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
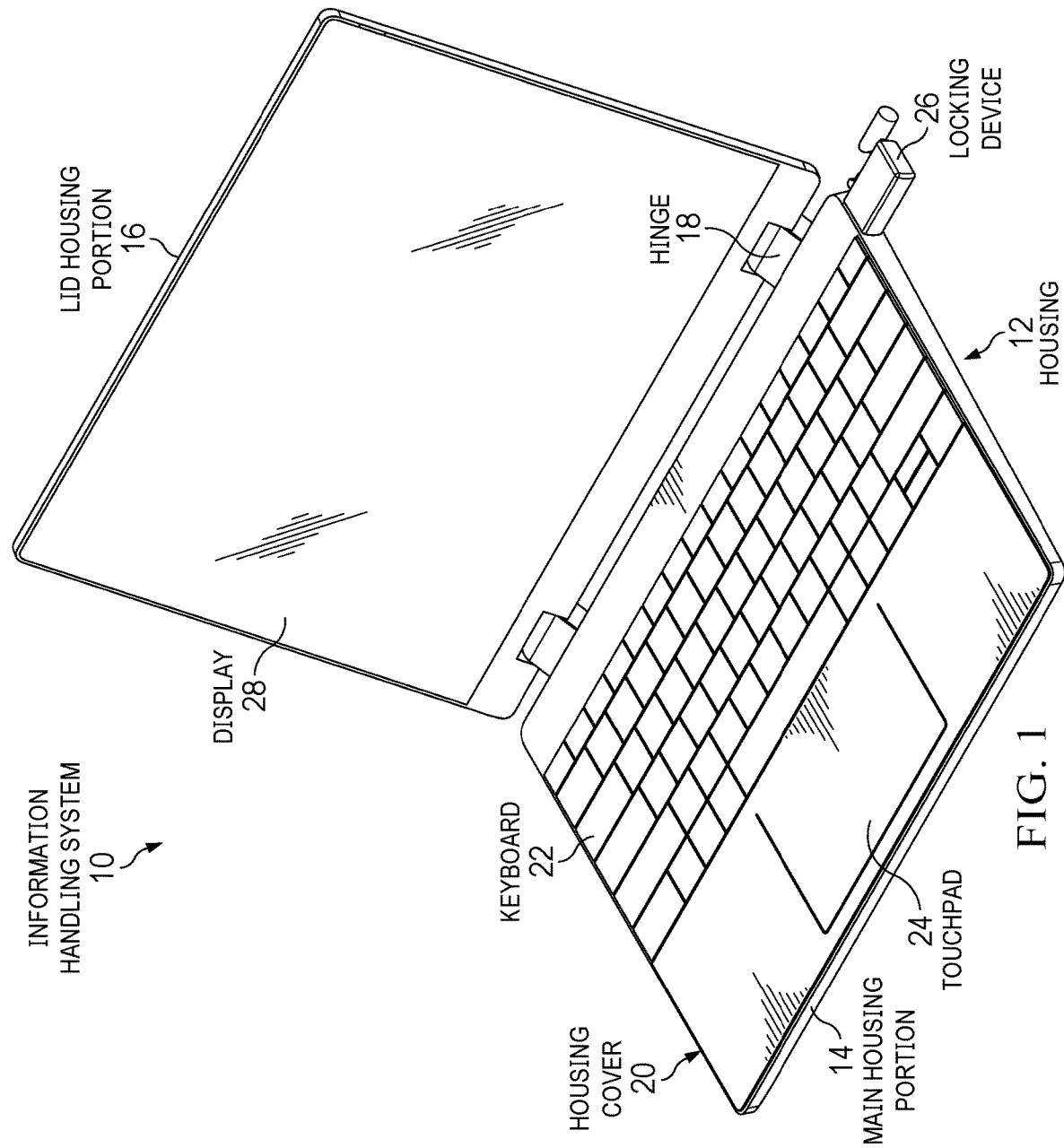
FIG. 1 depicts a front perspective view of a portable information handling system configured to promote automated assembly and disassembly to assist with reuse and recycling of information handling system components.

Referring now to FIG. 1, a front perspective view depicts a portable information handling system 10 configured to promote automated assembly and disassembly to assist with reuse and recycling of information handling system components. Portable information handling system 10 is built in a housing 12 having a clamshell configuration with a main housing portion 14 rotationally coupled to a lid housing portion 16 by hinges 18. In the open position depicted by FIG. 1, lid housing portion 16 is rotated to a viewing position above housing cover 20 that supports a keyboard 22 in a typing position to accept end user presses at keyboard keys. A touchpad 24 is defined in the housing cover 20 to accept end user touches as inputs, such as to control a cursor position or accept an "enter" input. A locking device 26 couples into a security opening of housing 12 to secure the system, such as a Kensington lock and cable arrangement. A display 28 integrates in lid housing portion 16 to present information as visual images viewable to an end user typing at keyboard 22. Portable information handling system 10 supports portable operating modes with an integrated input device, display and power source assembled in an integrated unit that is disassembleable with an automatic or robotic operation that does not involve screws or other coupling devices needing manual manipulation. The components assemble and breakdown in a manner that promotes reuse and recycling. In the depicted configuration, with security lock 26 coupled in place, the assembled system is protected against internal access. Yet, when security lock 26 is removed and an internal keystone assembly is activated, the entire information handling system breaks down into logical components with minimal time and fully accessible to robotic-type of tools.

Figure 2:
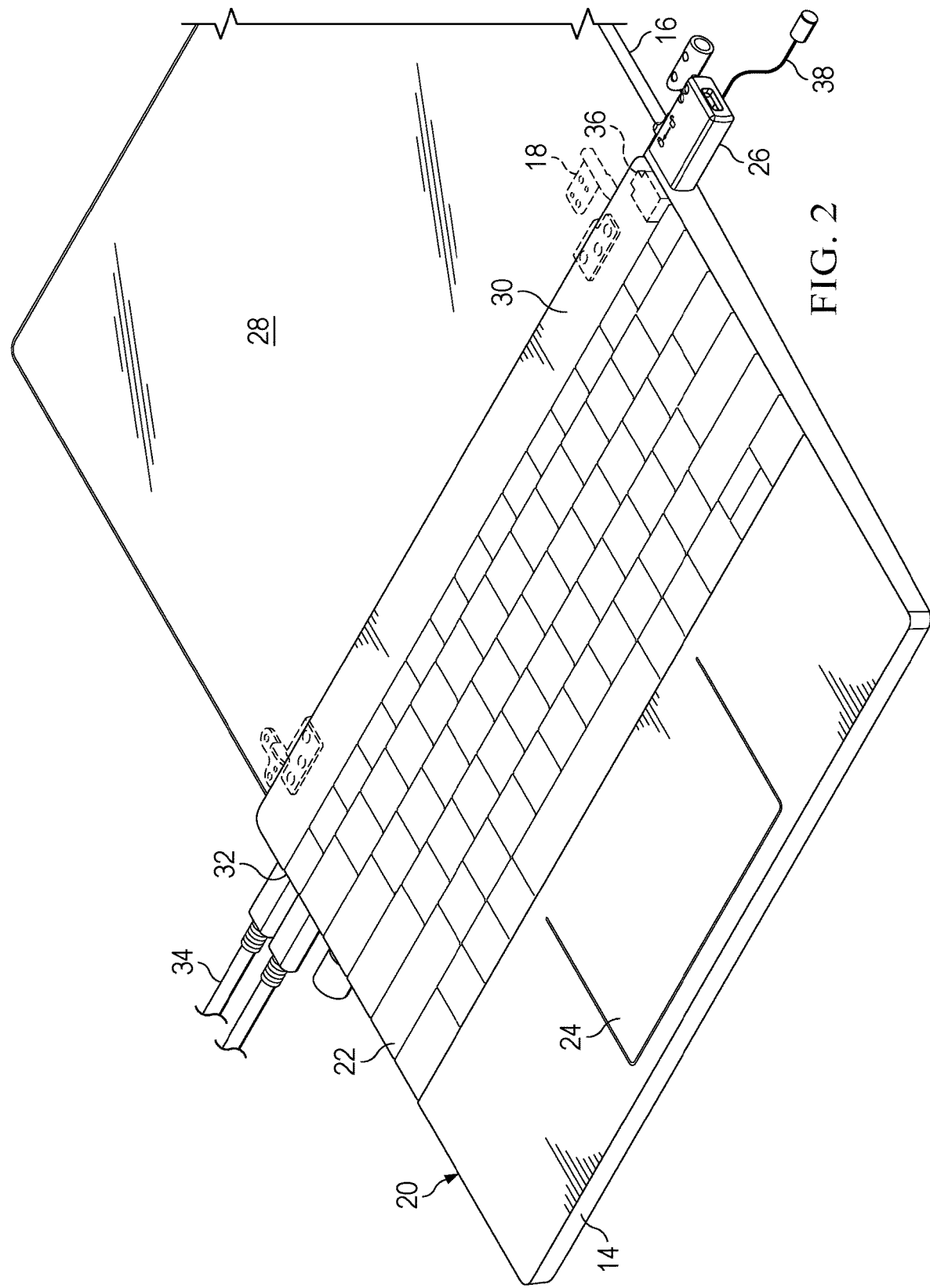
FIGS. 2 and 2A through 2D depict an example of a keystone assembly system for assembly and disassembly of a portable information handling system.

Referring now to FIGS. 2 and 2A through 2D, an example of a keystone assembly 30 system is depicted for assembly and disassembly of portable information handling system 10. FIG. 2 depicts portable information handling system 10 in tablet mode having hinges 18 rotating lid housing portion 16 180 degrees relative to main housing portion 14 so that display 28 lays flat on a support surface to accept touch inputs. Keyboard 22 and touchpad 24 are supported on the upper side of main housing portion 14 and housing cover 20. On a side opposite security lock 26 a pair of data cables 34 fit into ports 32, such as USB Type C cables and ports that support power, video and data communication. In the tablet configuration a keystone assembly 30 couples to main housing portion 14 and overlaps keyboard 22 and cover housing portion 20 to prevent disassembly of portable information handling system 10. Security lock 26 inserts through a security opening of main housing portion 14 to engage a security lock device 36 coupled at the interior of housing 12 so that a cable 38 secures portable information handling system 10. For example, security lock 26 locks and unlocks in response to a key actuation with key actuation to a locked position engaging security lock device 36 to prevent access to the security opening in housing 12. In the locked position, a latch or other coupling arrangement of security lock 26 and security lock device 36 prevents removal of security lock 26 until the lock is moved to an unlock position, such as a Kensington or Noble lock or similar arrangement. When security lock 26 is unlocked to release it from security locking device 36 and removed from the security opening of housing 12, access is provided to a release of keystone assembly 30 so that housing 12 may be disassembled.

Figure 2A:
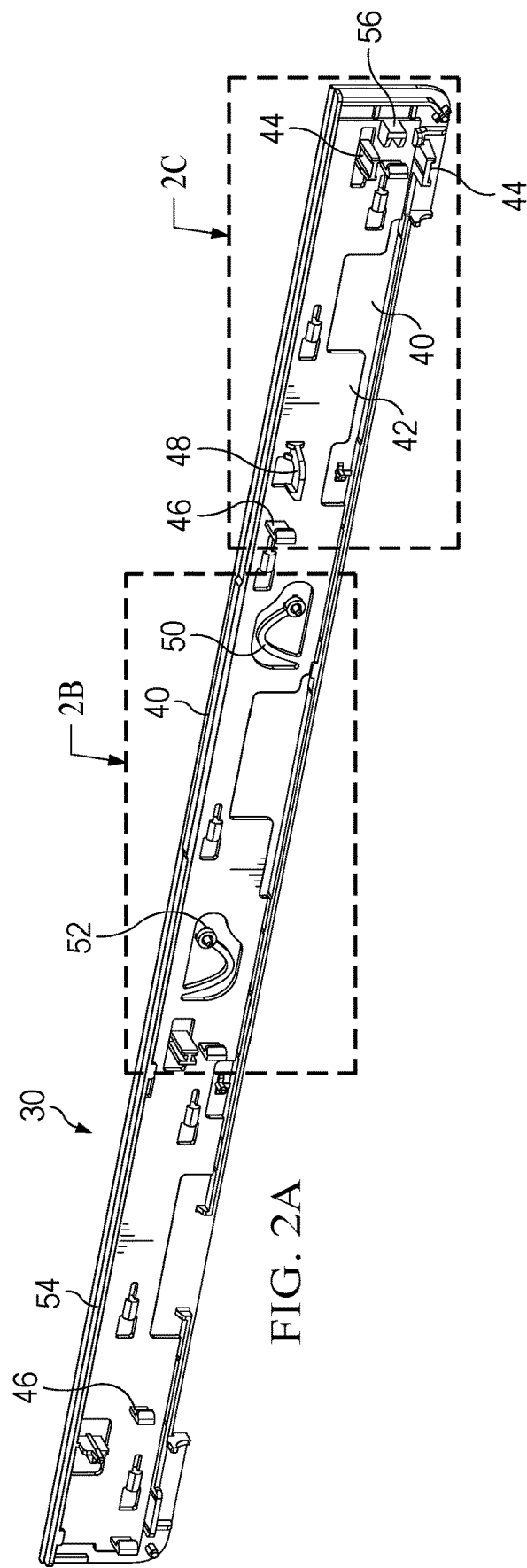

FIG. 2A depicts a perspective view of the inner side of keystone assembly 30. Keystone assembly 30 has an exterior member 40 sized to fit in a gap between housing cover 20 and the perimeter of main housing portion 14 along a side at which hinges 18 couple. A side wall 54 extends down from opposing lengths of exterior member 40 sized to fit an interior member 42 on the interior side of exterior member 40 so that interior member 42 slides between side walls 54. Guide posts 44 extend down from the interior side of exterior member 40 to fit in guides formed in the interior of main housing portion 14. The engagement of guide posts 44 in guides of main housing portion 14 holds exterior member 40 in a fixed location relative to main housing portion 14, such as to fill the gap at the rear side of main housing portion 14 perimeter. A latch 46 and a ramp member 48 extend down from interior member 42 into main housing portion 14 to engage with a catch and a ramp coupled to main housing portion 14. Latch 46 is a resilient material that snaps into place against a catch and has a lip to engage the catch and hold both interior member 42 and, through side walls 54, exterior member 40 to main housing portion 14. When interior member 42 slides relative to exterior member 40, latch 46 moves laterally to release the main housing portion catch and ramp member 48 slides laterally to work against a ramp surface within main housing portion 14 so that exterior member 40 is pushed out of and away from main housing portion 14.

Figure 2B:
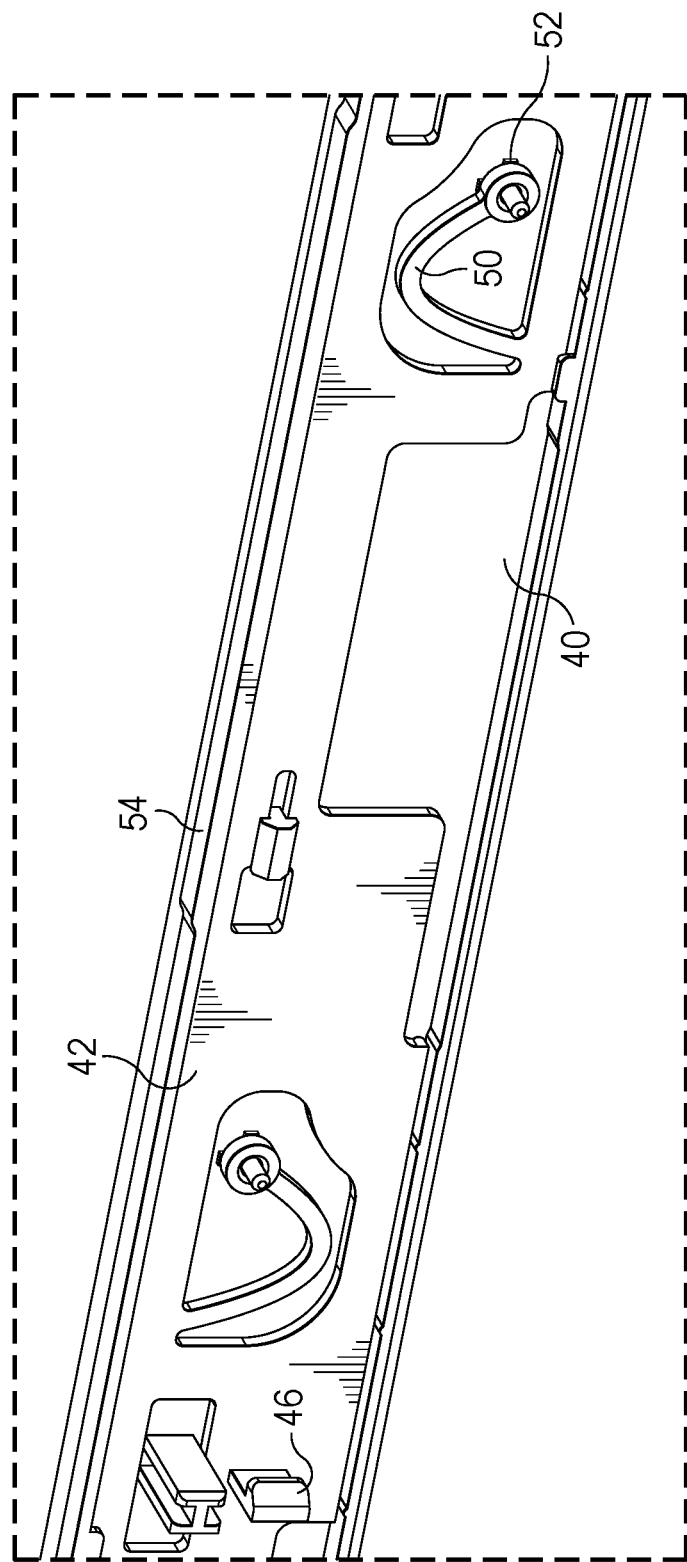
Figure 2C:
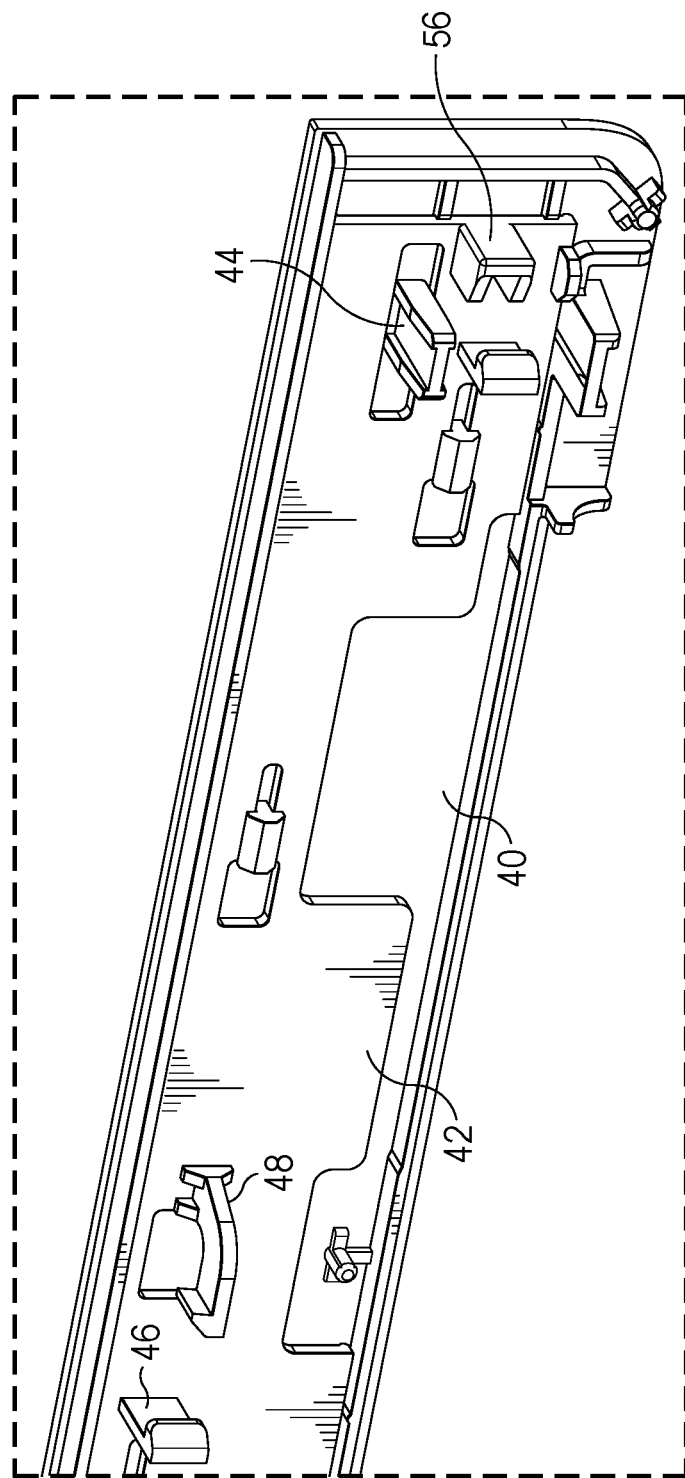
Figure 2D:
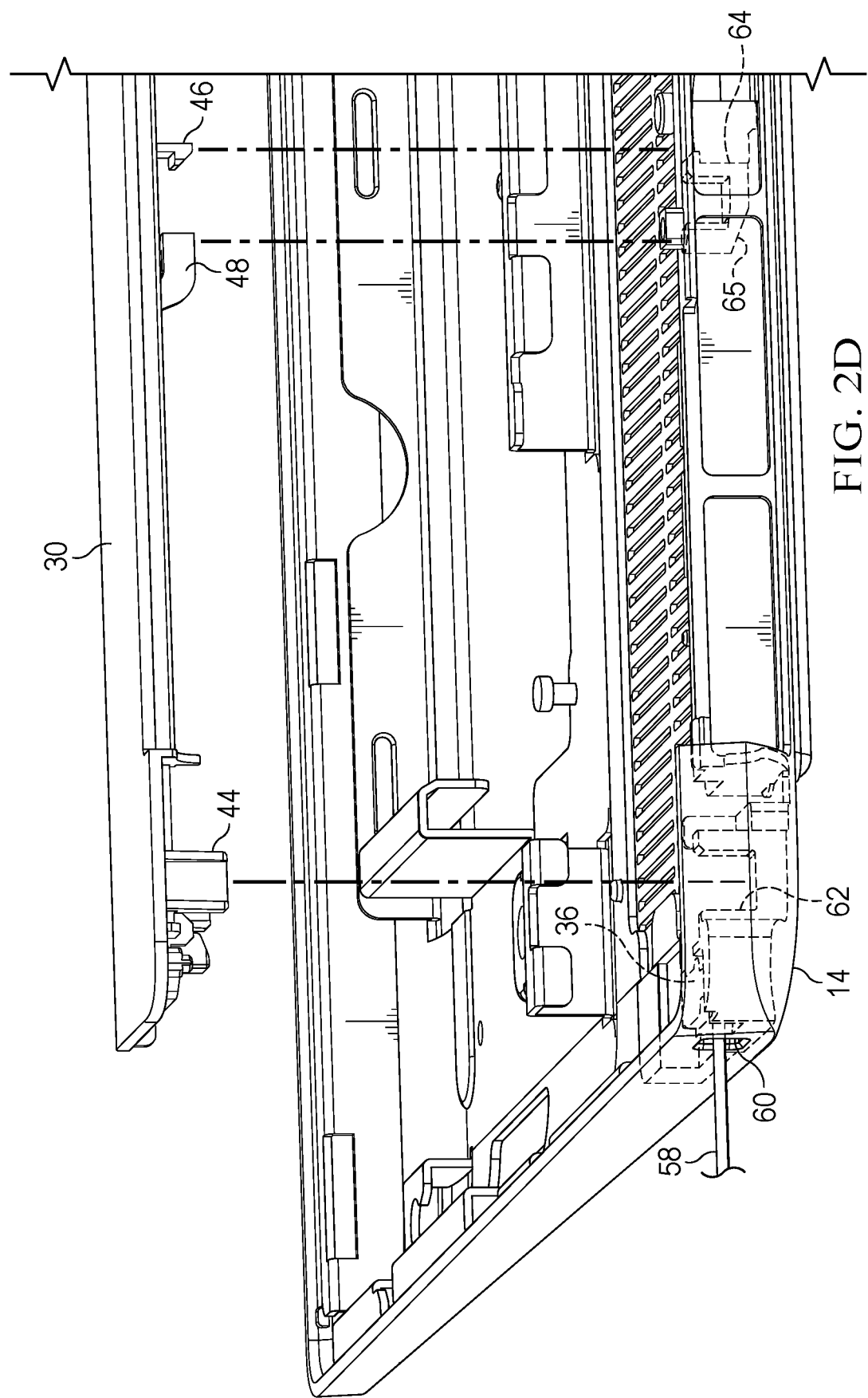

FIGS. 2B and 2C show detailed perspective views as indicated in FIG. 2A. A release member 56 extends down from interior member 42 at the security opening of main housing portion 14 to accept a press from an external release member inserted through the security opening. When release member 56 is pressed inward, interior member 42 slides relative to exterior member 40 so that latch 46 and ramp member 48 move relative to main housing portion 14. A spring element 50 formed in interior member 42 biases against at stop 52 of exterior member 40 so that interior member 42 is biased to a locked position with latch 46 position to engage a catch with main housing portion 14. FIG. 2D depicts keystone assembly 30 in a raised position above main housing portion 14 having security locking device 36 accessible through a security opening 60. Guide post 44 extends down into guide 62 to align keystone assembly 30 so that latch 46 engages with catch 64. In the example embodiment, a releasing member 58, such as a screw driver, inserts through security opening 60 to press against the interior member for lateral sliding movement relative to the exterior member, thereby releasing latch 46 from catch 64. The lateral sliding motion presses ramp member 48 against a ramp surface 65 to lift keystone assembly 30 out of main housing portion 14. Once keystone assembly 30 is removed, a disassembly of the components from within main housing portion 14 may be performed.

Figure 3:
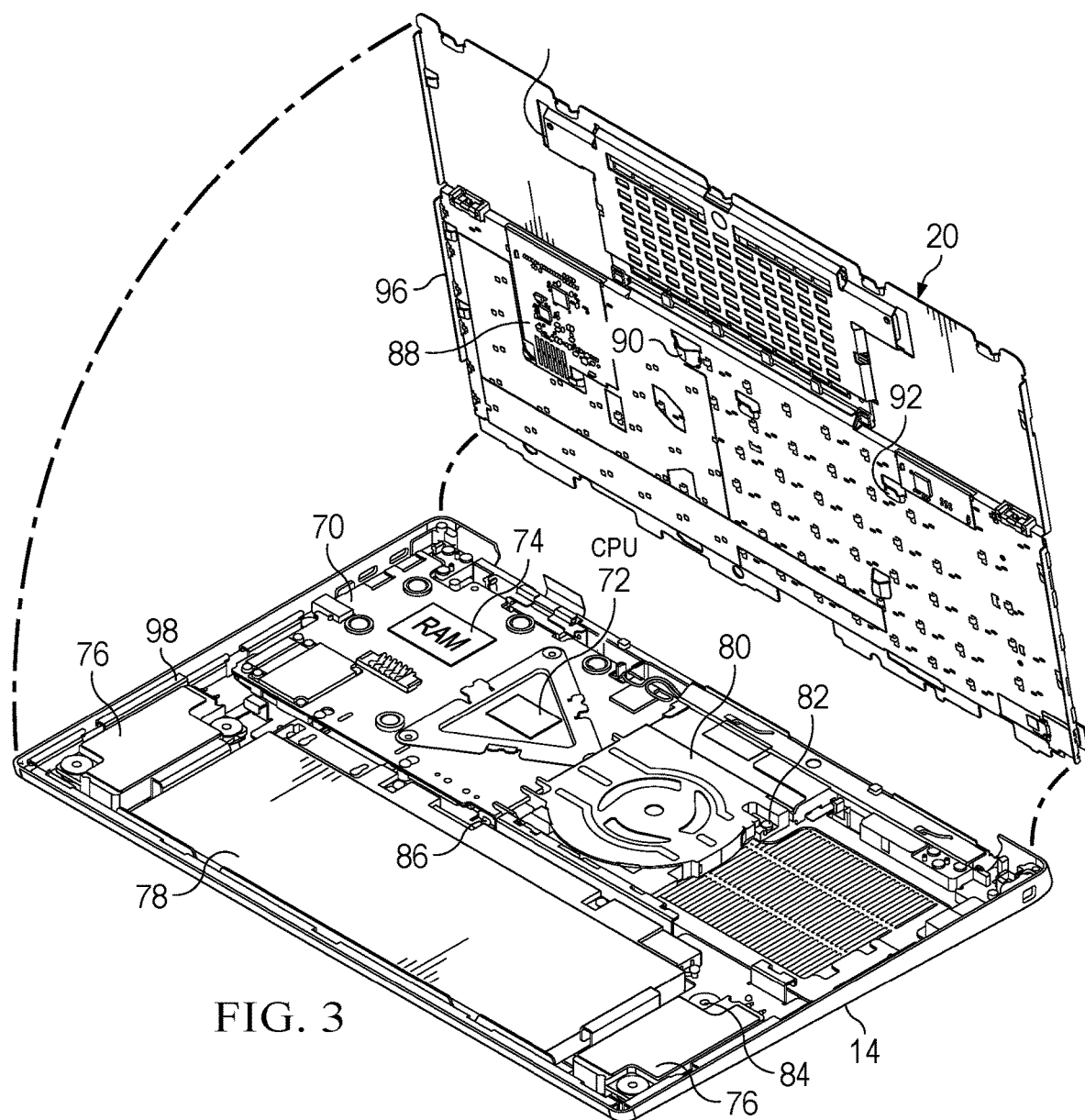
FIG. 3 depicts an upper perspective view of the main housing portion when the housing cover lifts free after removal of the keystone assembly.

Referring now to FIG. 3, an upper perspective view depicts main housing portion 14 when housing cover 20 lifts free after removal of the keystone assembly. A motherboard 70 couples to main housing portion 14 and interfaces a central processing unit (CPU) 72 that executes instructions to process information with a random access memory (RAM) 74 that stores the instructions and information. A pair of speakers 76 couple to main housing portion 14 and interface with CPU 72 to present audio information as audible sounds. A battery 78 is disposed between speakers 76 and interfaced with motherboard 70 provide power to the CPU, RAM and other processing components. A cooling fan 80 is disposed in main housing portion 14 to one side of motherboard 70 to generate a cooling airflow that removes excess thermal energy from the processing components. In the example embodiment, housing cover 20 includes members that extend from the housing cover bottom surface into the main housing portion interior to hold components in place. Thus, when the keystone assembly is removed to free housing cover 20, the components under the housing cover that are held in place by members extending down from the housing cover are also released for disassembly.

In the example embodiment, a speaker lock member 88 aligns with a speaker lock feature 84, such as a cavity, notch or opening, of each speaker 76 to hold the speaker in place. A battery lock member 90 aligns with a battery lock feature 86, such as a cavity, notch or opening, of battery 78 to hold the battery in place. In an example embodiment, battery lock member 90 may engage with a battery switch included in battery lock feature 86 that enables power transfer to and from the battery so that battery transfer is disabled when housing cover 20 is lifted off. A fan lock member 92 aligns with a fan lock feature 82, such as a cavity, notch or opening, of cooling fan 80 to hold the cooling fan in place. In one embodiment, the cavity, notch or opening that accepts the lock member may also offer a location for physical manipulation of the component, such as by a robotics arm. In addition to hold components in place, the locking members also prevent assembly of the housing cover 20 and components in an improper or misaligned manner since the locking members will interfere with assembly when misaligned. As described below in greater detail, a sliding engagement of housing cover 20 guides rails 96 to main housing portion 14 guides 98 aids in the assembly alignment process. In embodiments that have plural cooling fans, plural speakers and plural battery modules, a lock member may extend down aligned to hold each cooling fan, speaker and battery module in place. For instance, as is described in greater detail below, plural fans and plural battery modules may couple in series with each fan and each battery module held in place by a lock member.

Figure 4:
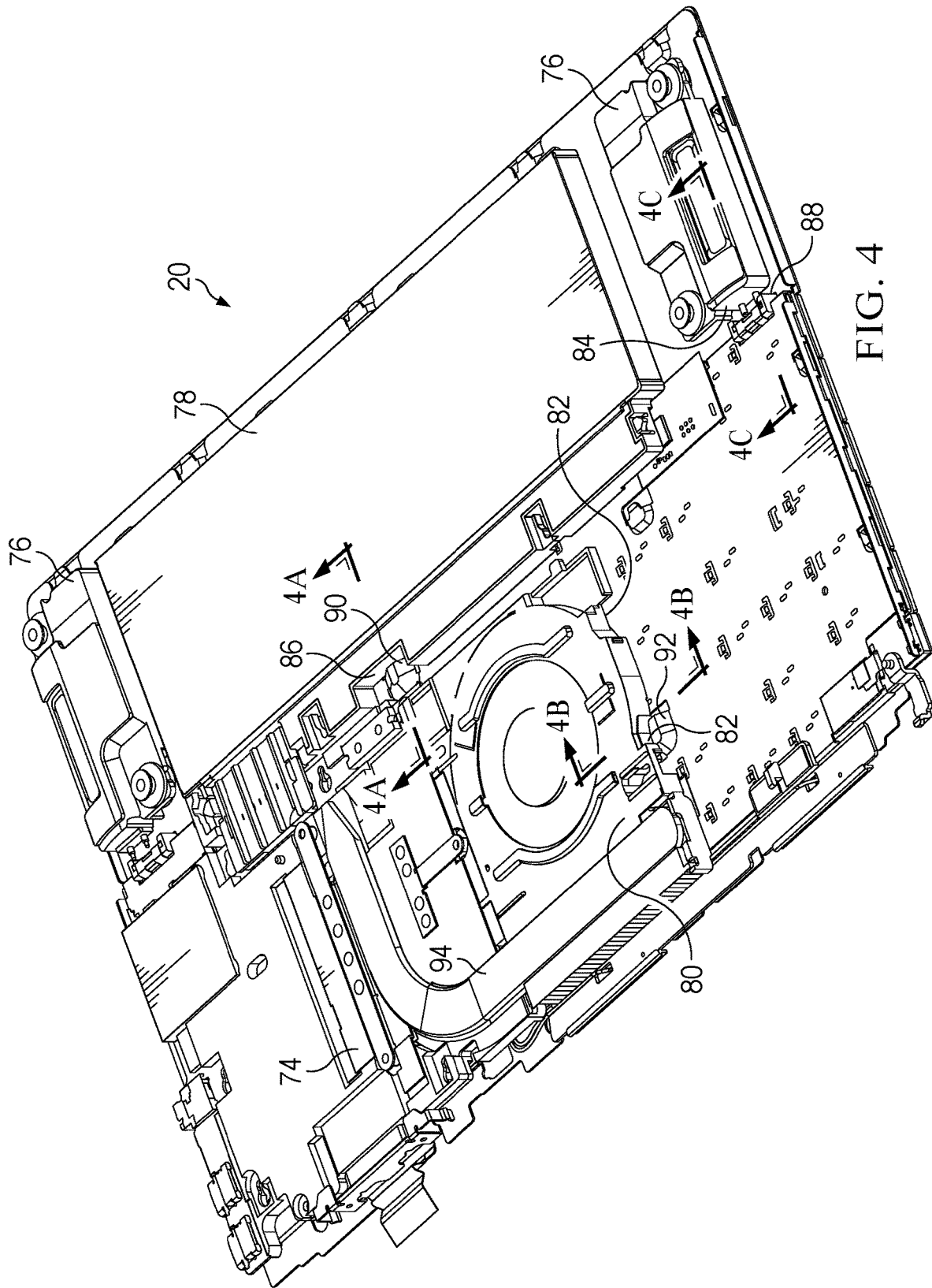
Figure 4C:
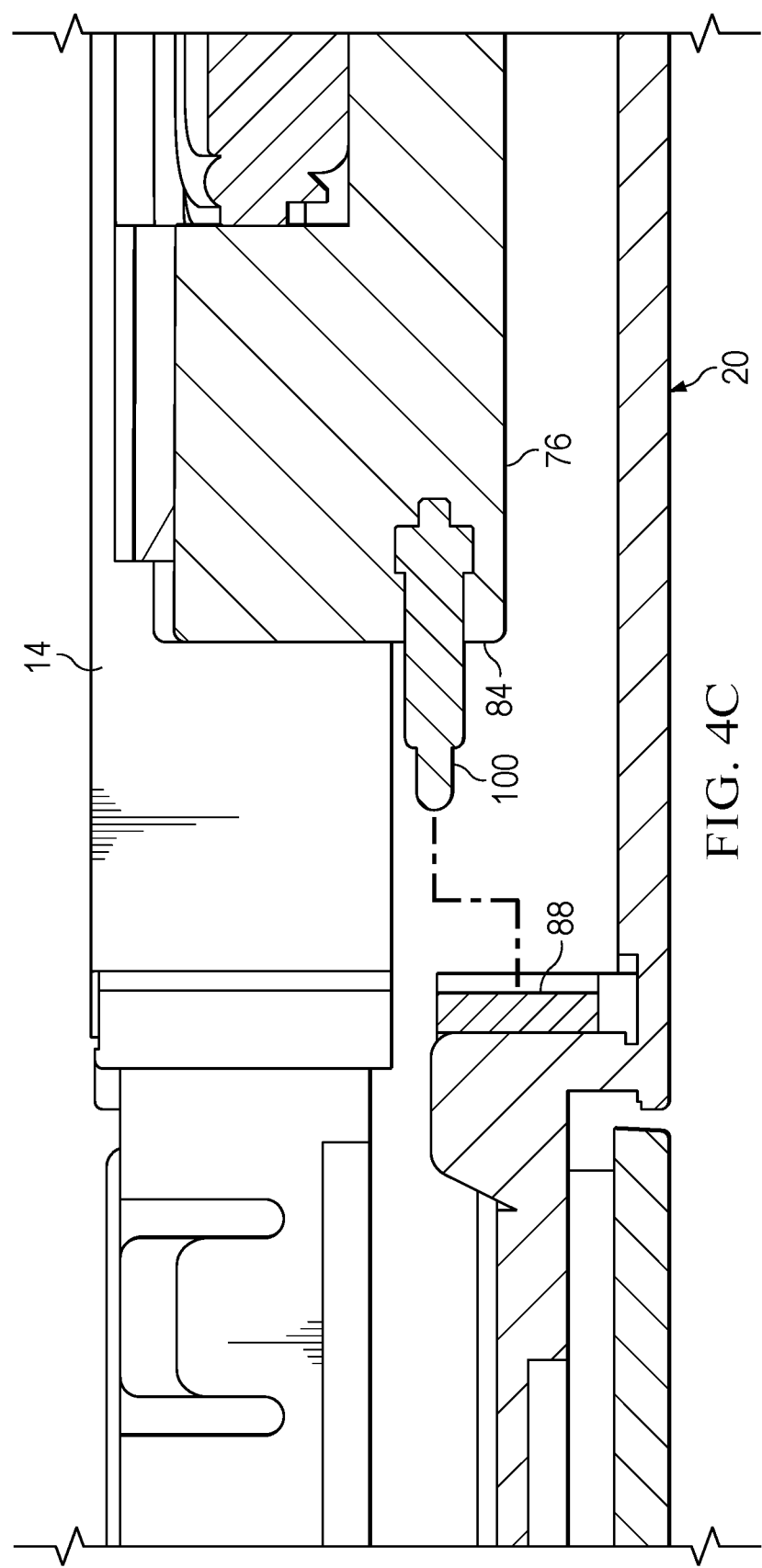

Referring now to FIGS. 4 and 4A through 4C, lower rear perspective and cross-sectional views of housing cover 20 depict coupling components within the main housing portion by members extending down from the housing cover 20. FIG. 4 depicts a lower perspective view of housing cover 20 with a heat pipe assembly 94 coupled at the location of a CPU and proximate RAM 74. Speaker lock member 88 inserts into speaker lock feature 84 to hold speaker 76 in place; fan lock member 92 inserts in fan lock feature 82 to hold cooling fan 80 in place; and battery lock member 90 inserts in battery lock feature 86 to hold battery 78 in position. FIG. 4A depicts a cross-sectional view of housing cover 20 having battery lock member 90 configured to slide onto battery lock feature 86 when housing cover 20 slides into a coupled position onto main housing portion 14, as described below in greater detail. FIG. 4B depicts a cross-sectional view of housing cover 20 having cooling fan 80 lock feature 82 aligned to slide into speaker lock member 88 when housing cover 20 slides to couple to the main housing portion. FIG. 4C depicts a cross-sectional view of housing cover 20 having speaker 76 speaker lock feature 84 couple against speaker lock member when housing cover 20 slides into place on the main housing portion 14. In the example embodiment of FIG. 4C, spring-biased contacts 100 of speaker 76 also interface with power contact pads formed in speaker lock member 88 to provide speaker signals that output audible sound from speaker 76.

Figure 5:
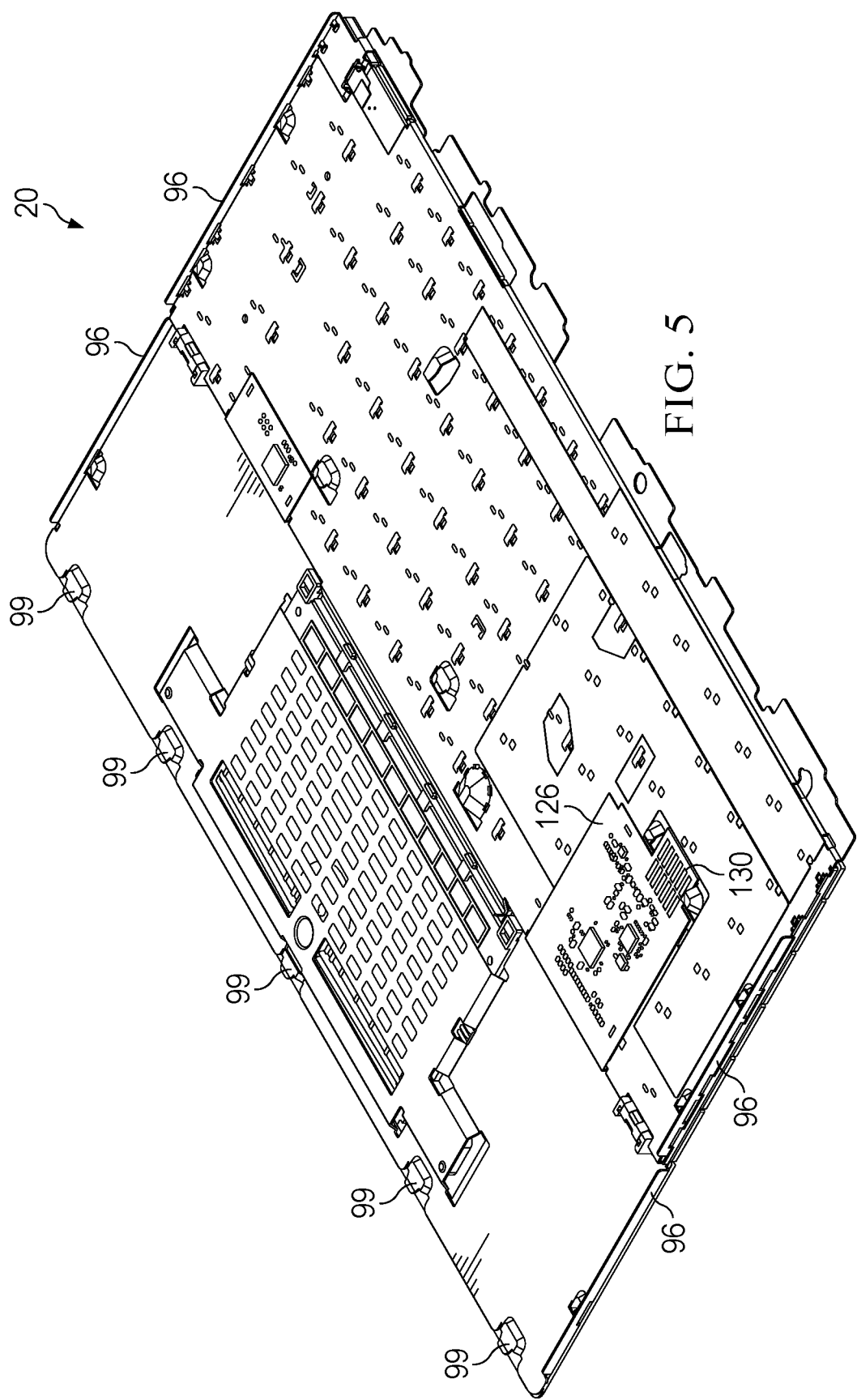
FIG. 5 depicts a bottom perspective view of the housing cover configured to couple in a sliding relationship with a main housing portion.
Figure 6A:
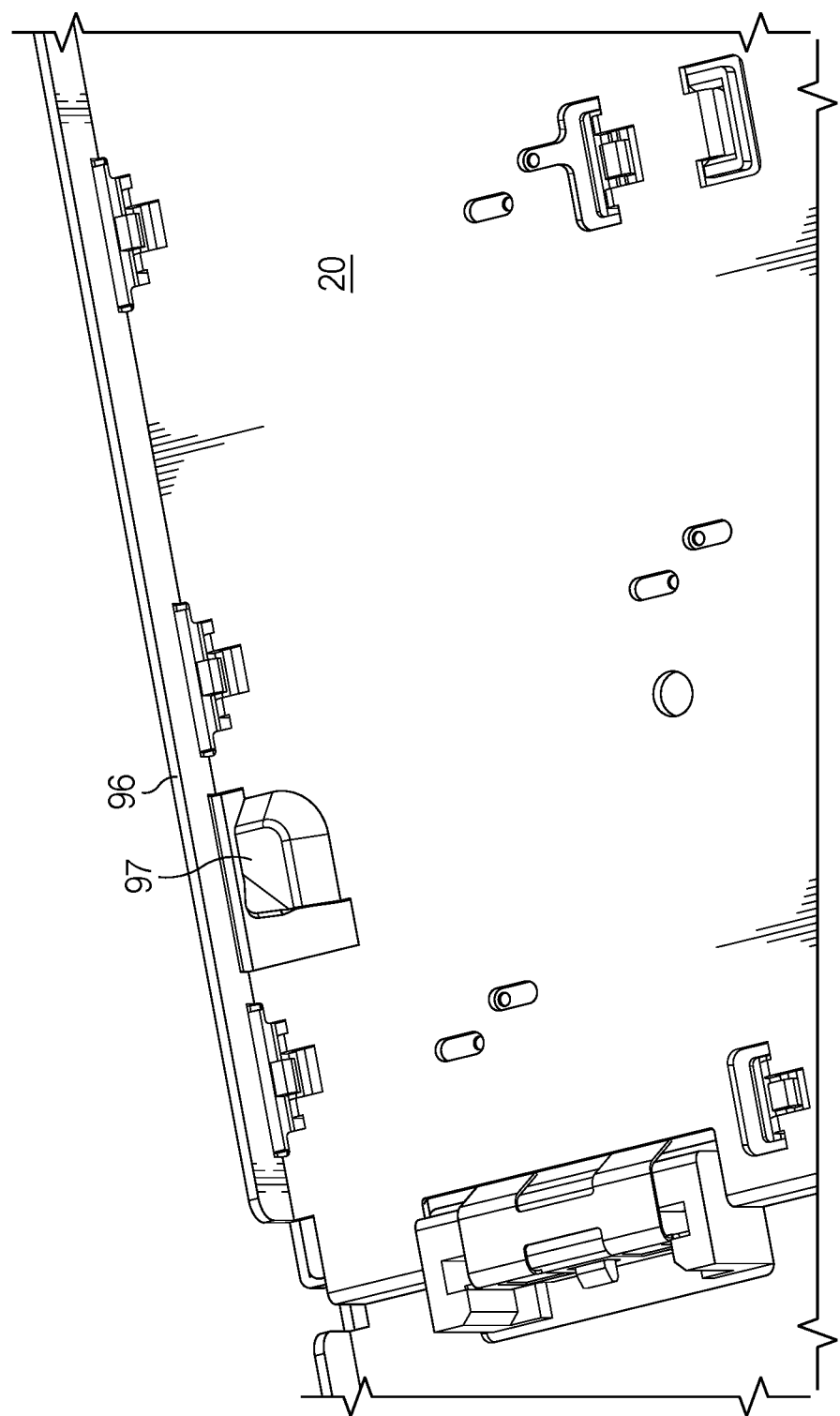
FIGS. 6A and 6B depict a detail view of the housing cover having stops that complete coupling of the housing cover to main housing portion guides.
Figure 6B:
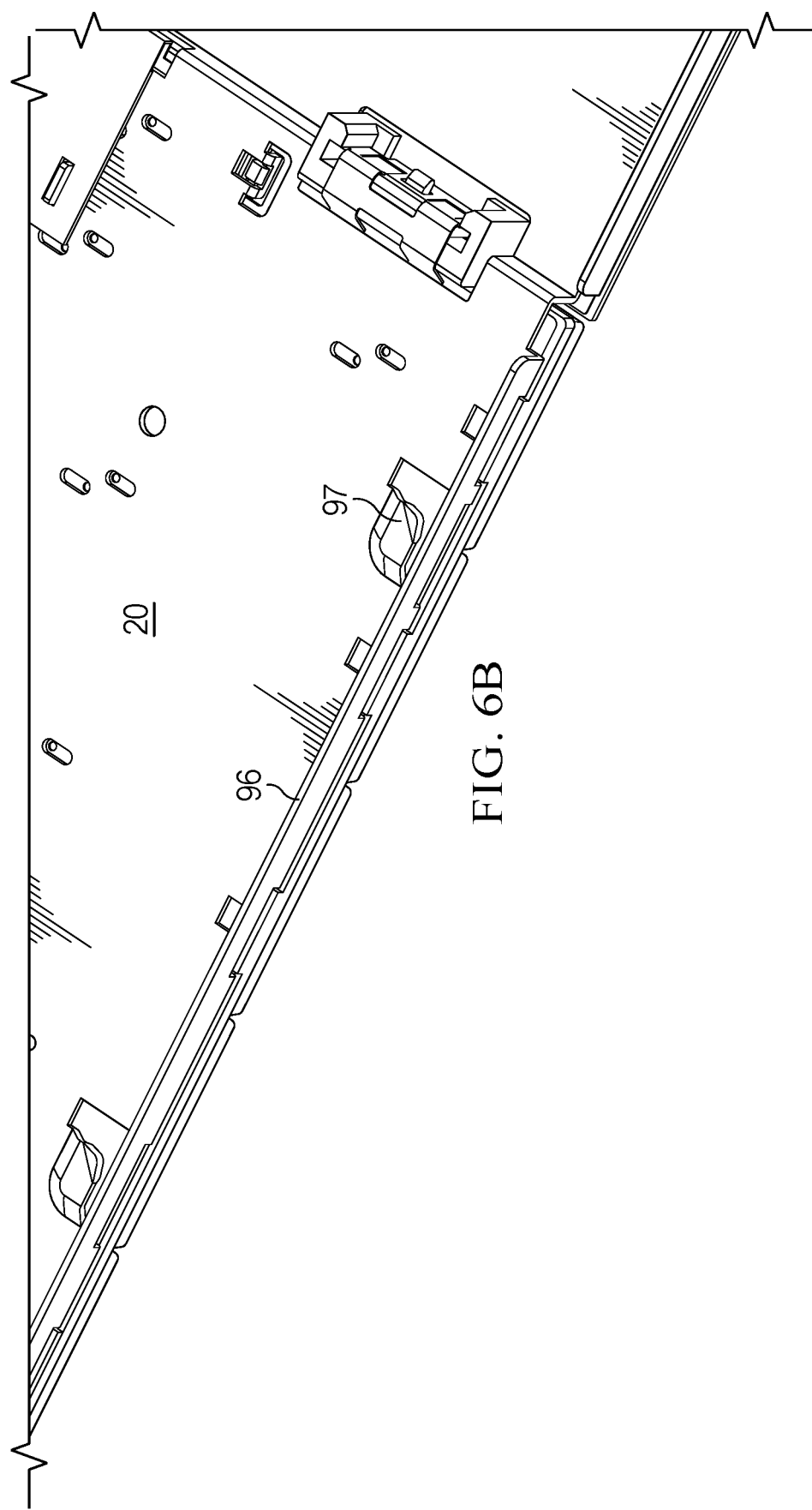

Referring now to FIG. 5, a bottom perspective view depicts housing cover 20 configured to couple in a sliding relationship with a main housing portion. Guide rails 96 on each of opposing sides of housing cover 20 insert into guides of the main housing portion and slide from a rearward to a forward position so that lock members extending from the bottom surface of housing cover 20 in the main housing portion interior engage with their associated components, such as the battery, cooling fan and speakers. When housing cover 20 slides fully forward, coupling stops 99 at the front of housing cover 20 engage with the main housing portion to hold housing cover 20 in place. Attachment of the keystone assembly at the rear side of housing cover 20 then locks the housing cover in place by preventing a rearward sliding motion that release coupling stops 99. In the example embodiment, a keyboard membrane printed circuit board 126 extends as part of the keyboard membrane to the lower surface of housing cover 20 with a connector interface 130 aligned to couple to a motherboard connector to communicate between the keyboard membrane and the motherboard. FIGS. 6A and 6B depict a detail view of housing cover 20 having stops 97 that complete coupling of the housing cover 20 to main housing portion guides. Each stop 97 is positioned to engage a guide of the main housing portion as the housing cover slides forward and into position. Once engaged, stops 97 prevent lifting of the housing cover 20 so that insertion of the keystone assembly to prevent rearward sliding of housing cover 20 locks the housing as a complete assembly. Although the example embodiment depicts rails in the housing cover that engage with rail guides of the main housing portion, in an alternative embodiment, the rails may be arranged in the main housing portion to engage rail guides of the housing cover.

Figure 7:
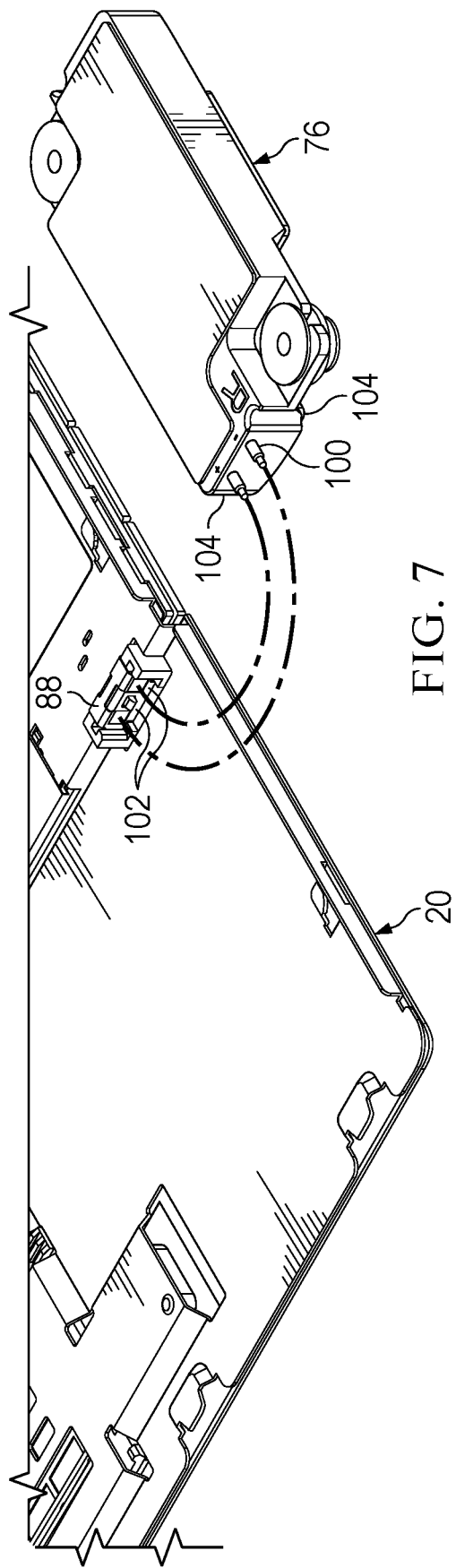

Referring now to FIGS. 7, 7A and 7B, a speaker 76 is depicted having speaker signals to play audible sounds communicated through a keyboard membrane and isolated spring biased contact pins 100. FIG. 7 depicts speaker 76 having spring-biased contact pins 100, such as pogo pins, configured to align with contact pads 102 that extend down from housing cover 20 as part of the speaker lock member 88. As shown in greater detail below, speaker contact pads 102 interface with the system motherboard through the keyboard membrane. A portion of the keyboard membrane that integrates speaker contact pads 102 insert into speaker lock member 88 to align with speaker spring-biased contact pins 100. As is described above, speaker lock member 88 extends down from housing cover 20, which slides from rearward to forward to couple to the main housing portion. The sliding motion also presses speaker lock member 88 against speaker 76 to engage grooves 104 formed in the speaker 76 with sidewall extensions of speaker lock member 88. Spring-biased contact members 100 press against speaker contacts 102 to maintain an electrical interface to transfer speaker signals even with vibration associated with playing of audible sounds by speaker 76. As is described in greater detail below, the speaker signals may be generated by an audio processor coupled to the motherboard that sends the speaker signals through the membrane. Alternatively, the audio processor may couple to a printed circuit board formed in the keyboard membrane that converts audio information provided from the motherboard into audio signals that play at speakers 76.

FIGS. 7A and 7B provide a more detailed view of the speaker signal interface between contact pads 102 of the keyboard membrane and spring-biased contact pins of speaker 76. In the example embodiment, tapered cones 103 of dampening material, such as rubberized plastic, provide dampening of vibrations between speaker 76 and the keyboard membrane. Tapered cones 103 of dampening material isolate vibrations between the speaker and contact pads to help enhance the life of the speaker lock member, membrane contact pads and spring-biased contact pins. FIG. 7B depicts a cross-sectional view of speaker 76 depicting spring-biased contact pins 100 inserted through a speaker dampener 105 disposed around the base of spring-biased contact pins 100. Speaker dampener 105 is formed from dampener material, such as a rubberized plastic or silicon, that absorbs vibrations to prevent wear from the vibrations on the spring-biased contact pins. In the example embodiment, some spacing is provided between speaker dampener 105 and tapered cones 103 so that each separately dampens vibrations on both sides of the electrical interface. In alternative embodiments, dampener 105 may have a cone outer shape that inserts into the cone inner shape of tapered cone 103. The mechanical vibration dampening of the dampening material reduces wear over time related to vibrations from sound output by speaker 76.

Figure 8:
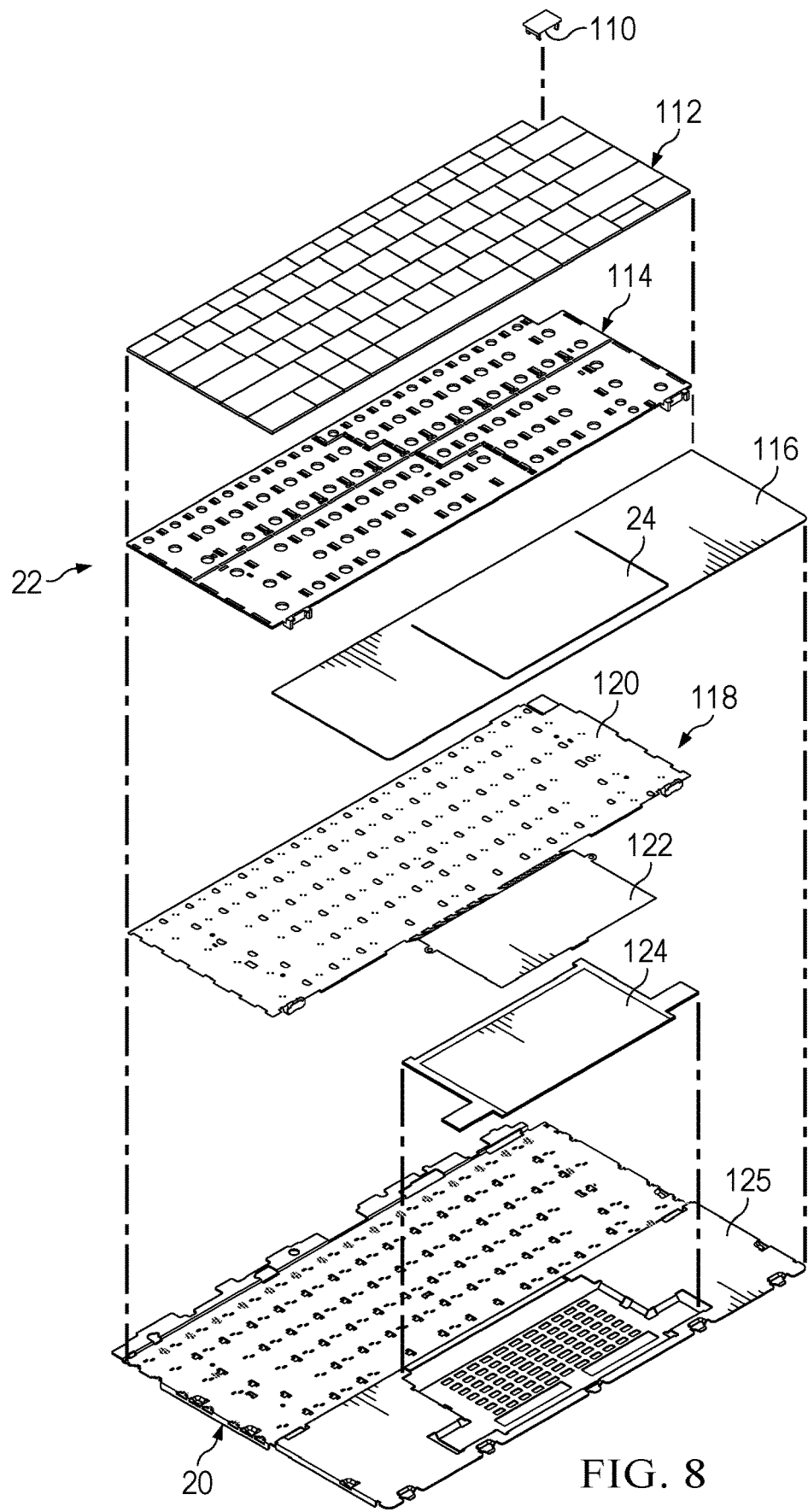
FIG. 8 depicts an exploded view of a keyboard having a keyboard membrane that includes key touch sensors, a touchpad sensor and a printed circuit board to manage logical tasks associated with keyboard.

Referring now to FIG. 8, an exploded view of a keyboard 22 depicts a keyboard membrane that includes key touch sensors, a touchpad sensor and a printed circuit board to manage logical tasks associated with keyboard 22. In the example embodiment keyboard 22 has key assembly 112 with plural keys that couple over a planar sheet 114 having an opening for each key so that key presses are applied to a keyboard membrane 118 for detection by key input sensors at each key position, such as a switch that closes when pressed by a key. The example embodiment includes a fingerprint reader module 110 is included in one corner of the key assembly. Keyboard membrane 118 rests over housing cover 20, which provides support so that key presses into membrane 118 will be detected by key press sensors included in the membrane. Keyboard membrane 118 has two contiguous portions formed in a common membrane film. A first portion 120 includes key touch detection sensors, such as conventional keyboard membrane switches that output a matrix location of the key press through wirelines formed in the membrane material. A second portion 122 includes a capacitive touch sensor that extends towards the front side of housing cover 20 to provide a touchpad input surface. A touchpad stiffener plate 124, such as a hard plastic, is disposed under touchpad second portion 122 to provide a solid surface against which touchpad inputs are made. A palm rest 116 couples over second portion 122 of membrane 118 to provide a touchpad 24 that the end user can reference to make touchpad inputs over the touchpad sensor area. The key assembly 112, planar sheet 114, membrane 118, palm rest 116, stiffener plate 124 and housing cover 20 are coupled into a single keyboard assembly 125 that slides onto and off of the main housing portion with assembly and disassembly completed by coupling or decoupling the keystone assembly to overlap keyboard assembly 125, as described above.

Figure 9:
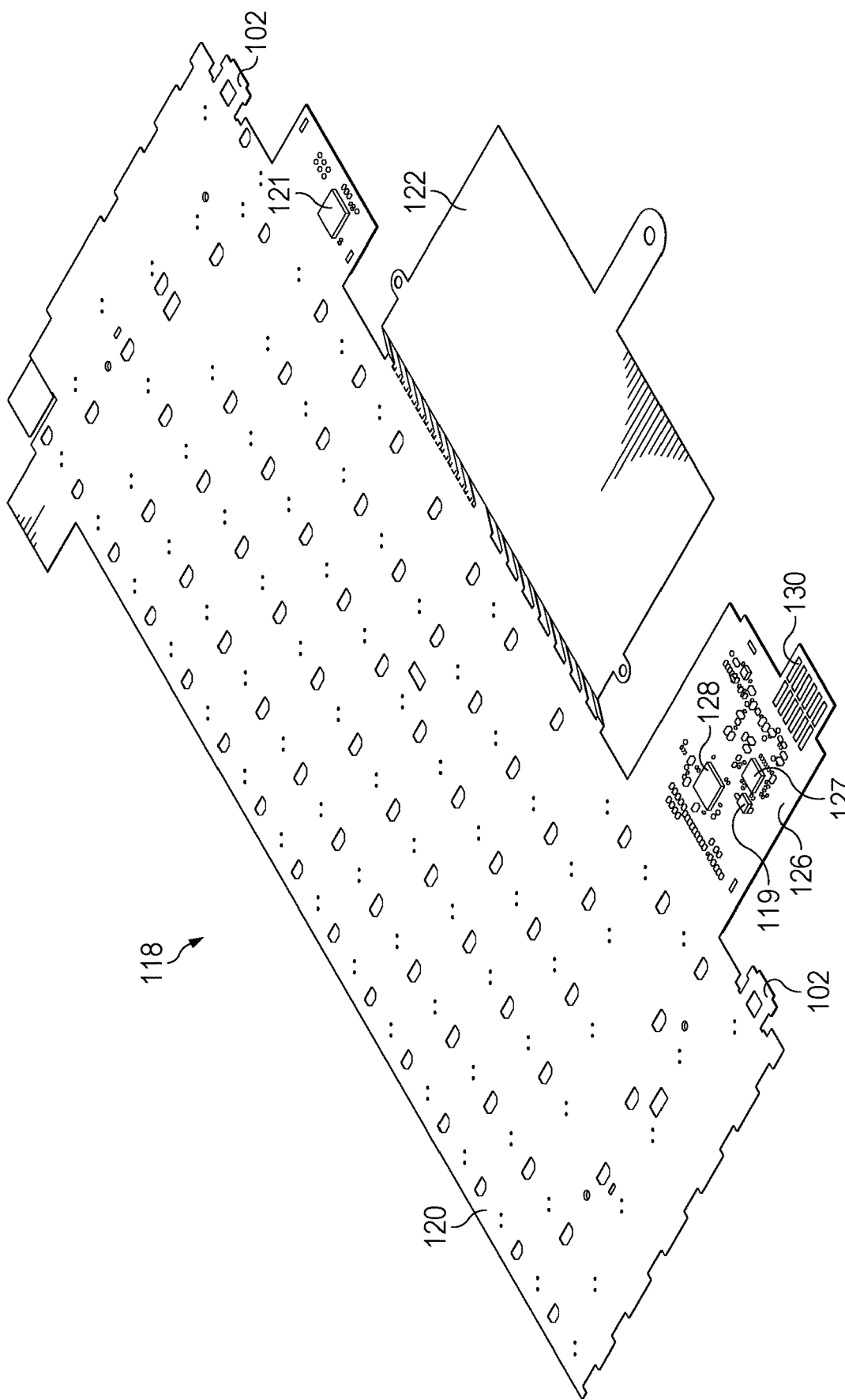
FIG. 9 depicts an upper perspective view of a keyboard membrane having an integrated printed circuit board with a keyboard matrix controller and capacitive touch controller to manage keyboard and touchpad operations.

Referring now to FIG. 9, an upper perspective view depicts keyboard membrane 118 having an integrated printed circuit board with a keyboard matrix controller and capacitive touch controller to manage keyboard and touchpad operations. In the example embodiment, printed circuit board 126 is a flexible printed circuit board having wirelines and contact pads formed in the membrane material. A keyboard matrix controller 127 couples to flexible printed circuit board 126 and interfaces with the matrix of keyboard touch sensors in the keyboard first portion 120 of membrane 118. For example, keyboard matrix controller 127 decodes signals received from membrane wirelines to determine which key is pressed and codes the key value to communicate to a CPU as an input. A capacitive touch controller 121 interfaces with the capacitive touch sensor of second membrane portion 122 to report touchpad inputs to the CPU. Although the example embodiment depicts the capacitive touch controller 121 distal printed circuit board 126, in an alternative embodiment it may couple to printed circuit board 126 or be managed with the same processing resource that detects key inputs, A communications hub 128, such as a USB hub, interfaces with both the keyboard matrix controller and the capacitive touch controller so that the keyboard and touch inputs are communicated to the CPU with a reduced number of pins in a connector interface 130, as is described in greater detail below. The USB protocol communicates through a differential serial pair to provide a more rapid communication transfer in the place of multiple less capable communication pathways that separately support each device or type of information. Flexible printed circuit board 126 folds under first portion 120 of membrane 118 so that connector interface 130 aligns to fit in a motherboard connector when the housing cover slides into position on the main housing portion. In various embodiments, the single piece membrane having key input sensors, capacitive touch sensors and an integrated circuit board may also include a backlight with microLEDs integrated in the membrane and controlled with a controller coupled to the circuit board, such a processing resource that coordinates keyboard operations. In the example embodiment, speaker contact pads 102 integrate with membrane 118 and fold over to fit in the speaker lock member as discussed above. An audio processor 119 couples to a printed circuit board of membrane 118 to process audio information communicated from the CPU. The result of the keyboard assembly is a set of easily assembled components that are readily reused or recycled based upon the condition of the components when the information handling system is returned.

Figure 10:
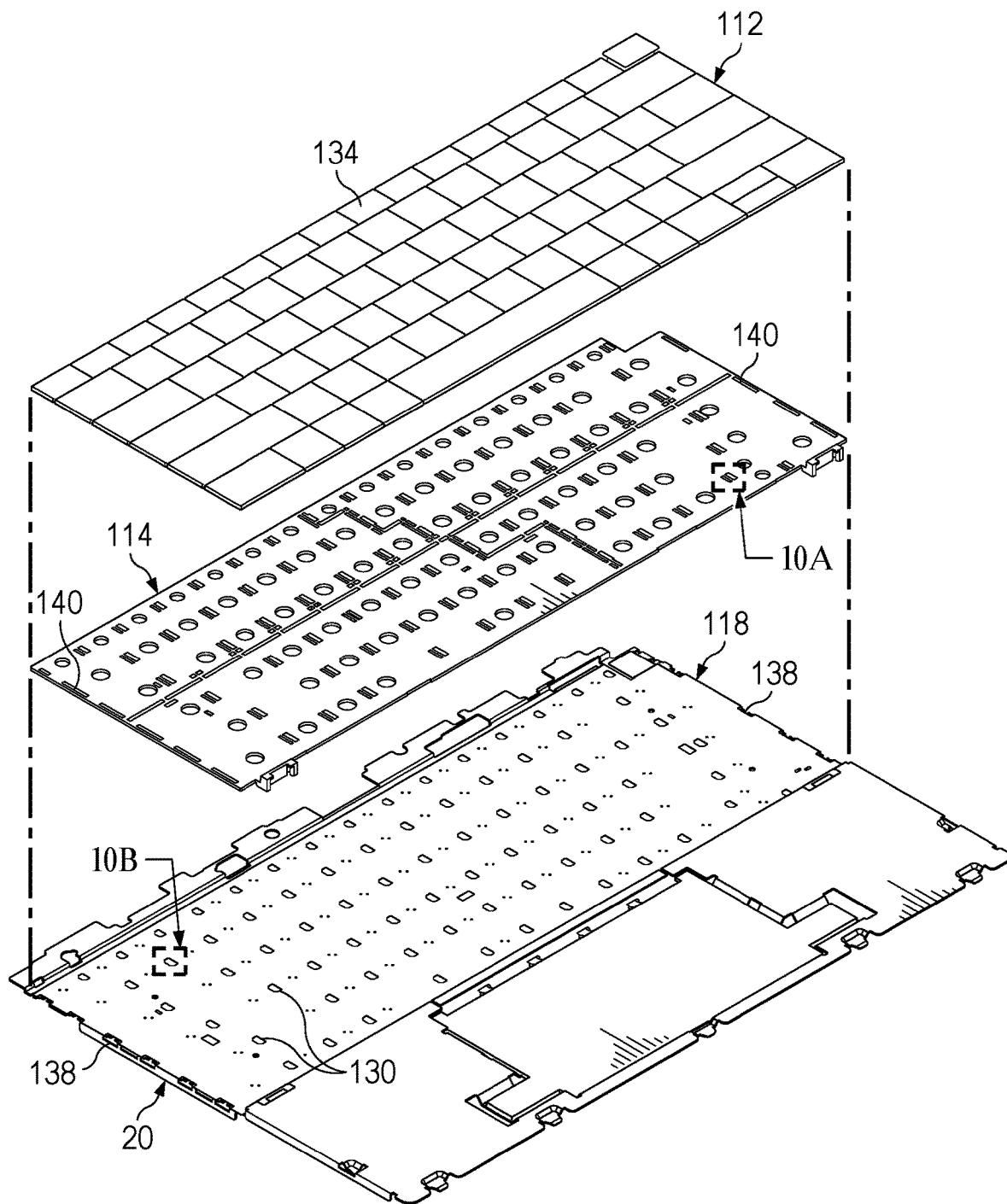
FIGS. 10 and 10A through 10C depict example embodiments of keys assembled as a lattice with a planar sheet between the keys and the membrane to enhance key and keyboard reuse.

Referring now to FIGS. 10 and 10A through 10C, example embodiments depict keys 134 assembled as a key assembly 112 lattice with a planar sheet 114 between the keys and the keyboard membrane 118 to enhance key and keyboard reuse. FIG. 10 depicts and exploded view of planar sheet 114 above housing cover 20 having the keyboard membrane 118 coupled to an upper surface. Planar sheet 114 is a thin and flexible plastic material, such as mylar, that couples with slots 140 to connector clips 138 at opposing sides of housing cover 20 and between key assembly 112 and keyboard membrane 118. Snap connector extensions 131 extend from housing cover 20 through slots of planar sheet 114 to engage snap connectors in the bottom surface of key assembly 112. In the example embodiment, one snap connector extension 131 is located at each opening of planar sheet 114, which coincides with the location of key input sensor locations. When key assembly 112 is coupled as a lattice to housing cover 20, the keys are disassembled as a lattice by pulling up at one end of planar sheet 114 to release slot 140 from connector clips 138 so that the separation of planar sheet 114 from keyboard membrane 118 releases the lattice from snap connector extensions 131. The proposed solution allows the keyboard assembly lattice to be readily removed and replaced at the housing cover and without impacting underlying electronics. In particular, at system refurbishment keys are typically a primary cosmetic concern. The independent lattice structure from a single material allows the lattice to remain a single component during refurbishment.

Figure 10A:
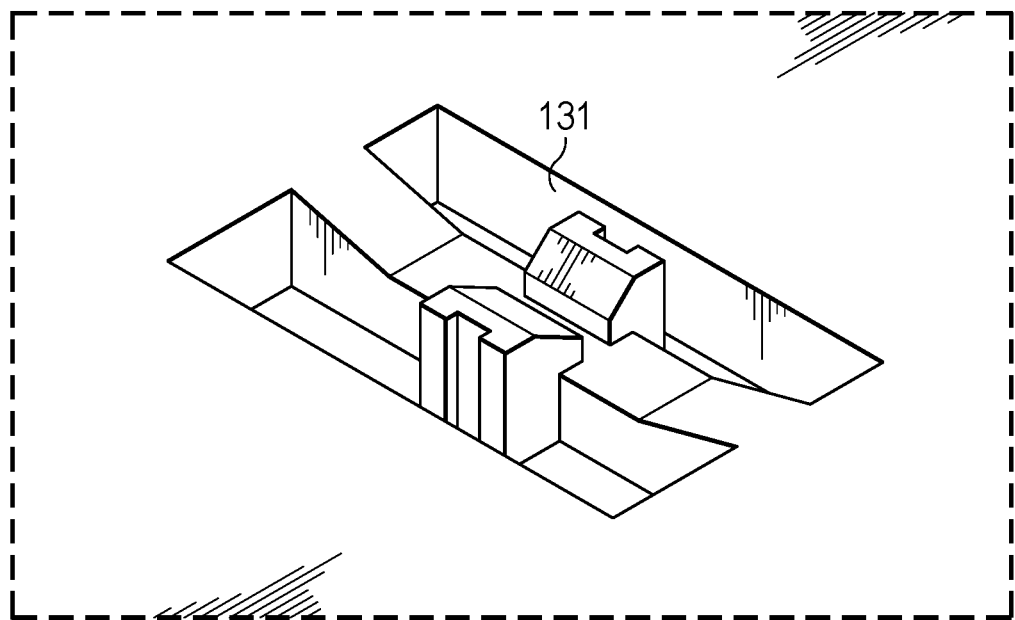
Figure 10B:
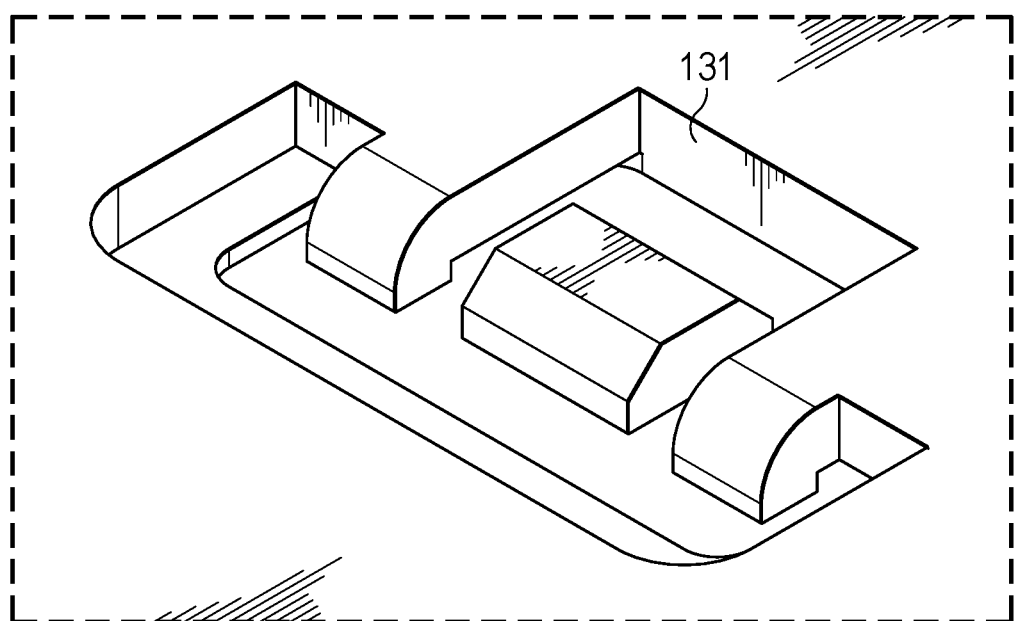
Figure 10C:
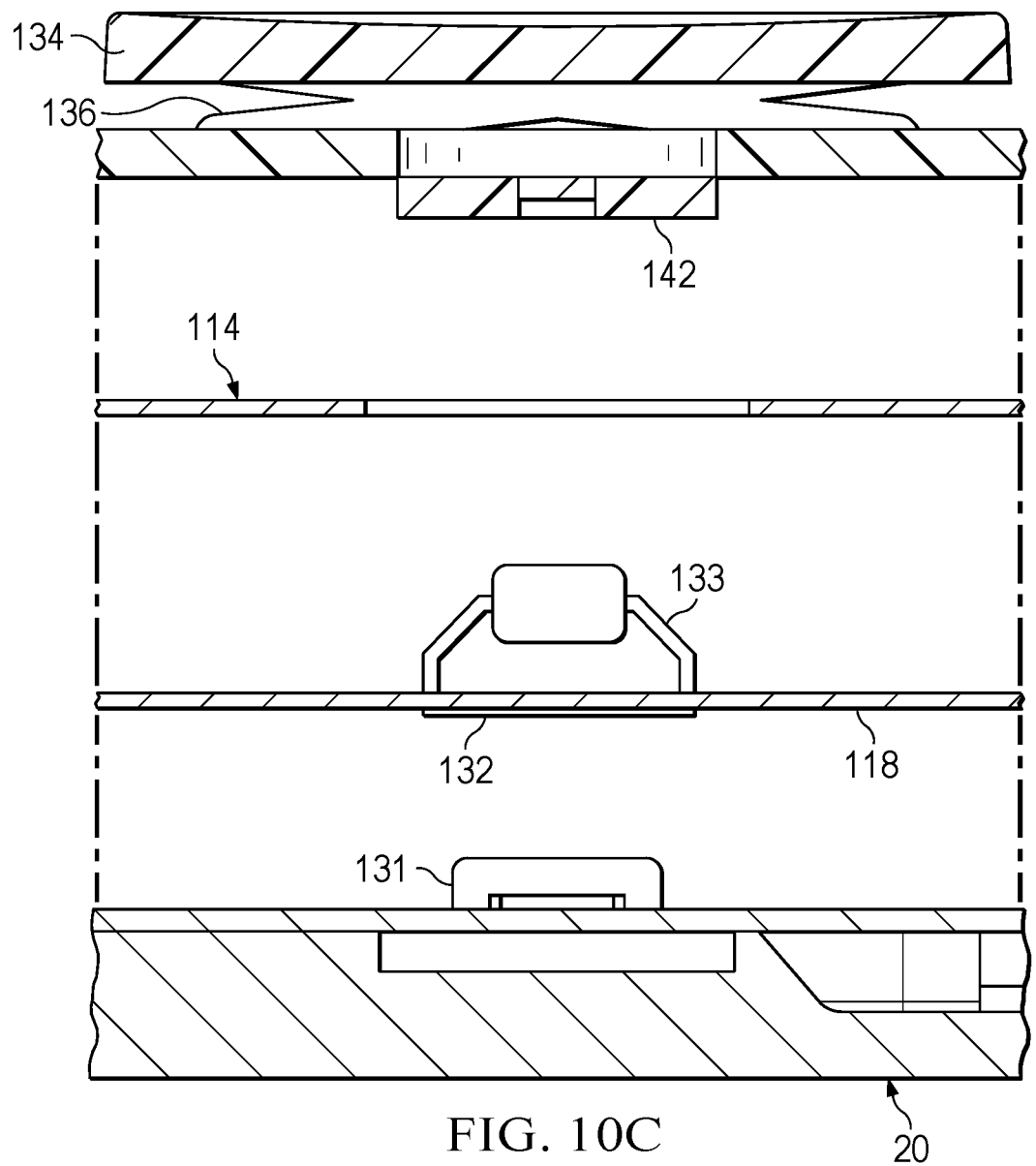

FIGS. 10A, 10B and 10C depict example arrangements for coupling the keyboard assembly to the housing cover with serial locking snaps that protrude through the membrane and have substructure reinforcement metal for a robust assembly. FIGS. 10A and 10B depict an upper perspective view of different embodiments of snap connector extensions 131 formed in housing cover 20 that each couple to a key support or, alternatively, a lattice support. FIG. 10A depicts a double clip arrangement that grasps a key support; FIG. 10B depicts a single clip arrangement that couples the key support below the clips. FIG. 10C depicts a key 134 coupled to a scissors 136 that manages vertical motion of key 134 relative to a holder plate 142 having a snap clip that couples to snap connector extension 131 extending up from housing cover 20. Planar sheet 114 rests between membrane 118 and key 134 so that an upward lift of planar sheet 114 will release key 134 from housing cover 20. An opening in planar sheet 114 provides to fit a rubber dome 133 through that biases up key 134 away from key input sensor 132 formed in keyboard membrane 118. The example embodiment is described as having keys 134 coupled as a key assembly in a lattice so that lifting up on planar sheet 114 will release the keys; however, in an alternative embodiment each key 134 may couple to housing cover 20 as an individual element rather than assembled in a lattice. Generally, assembly in a lattice offers a more simple assembly and disassembly of keys 134, however, individual elements may be supported by robotic assembly and offer advantages with respect to refurbishment of individual keys rather than recycling an entire lattice assembly when one key is bad. When recycling is necessary, the separable lattice offers efficiencies by manufacture of the entire key lattice from a single recyclable material.

Figure 11:
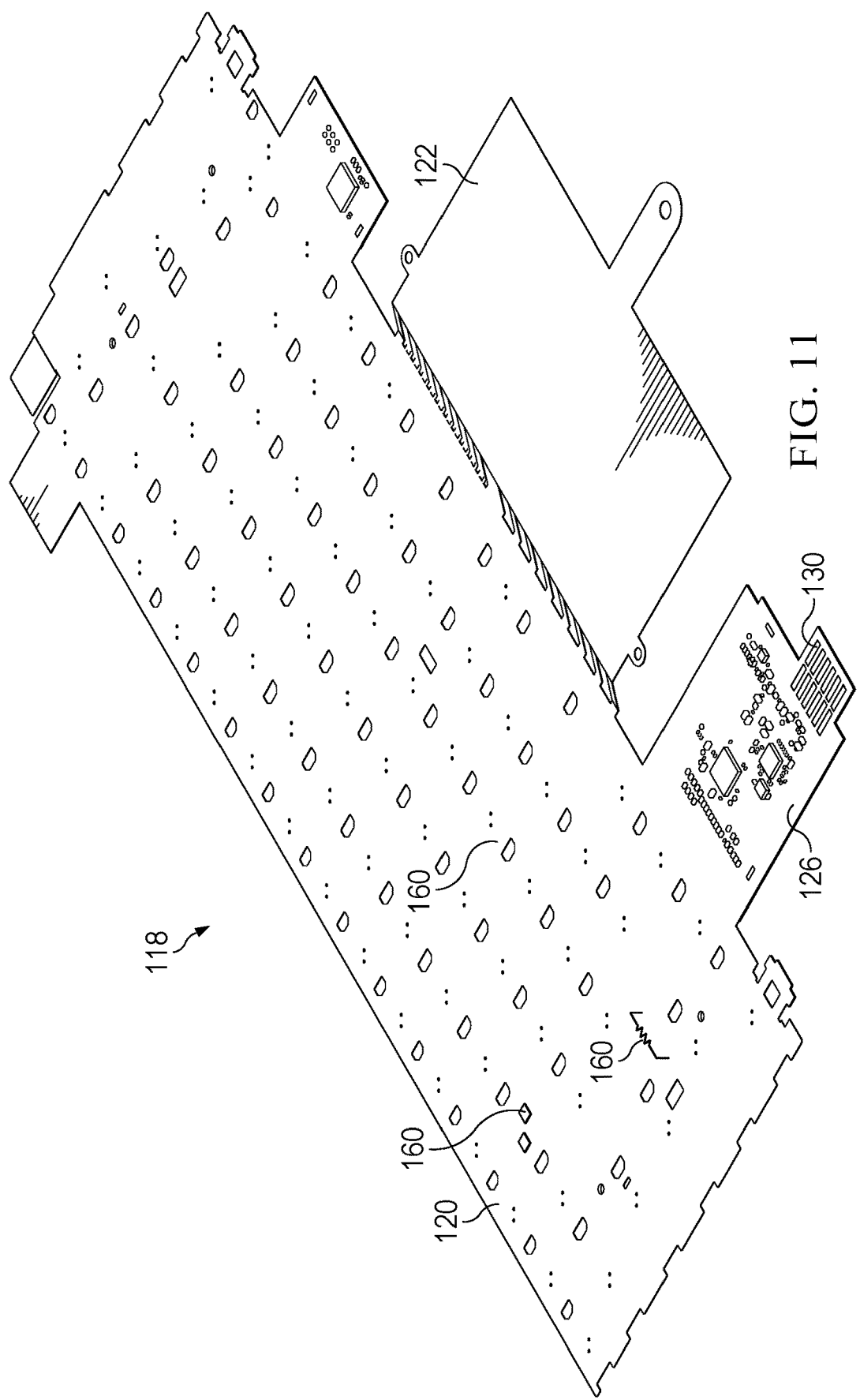
FIG. 11 depicts an upper perspective view of a keyboard membrane and example embodiment having liquid detection sensors.

Referring now to FIG. 11, an upper perspective view of a keyboard membrane 118 depicts an example embodiment having liquid detection sensors 160. Liquid detection sensors 160 are exposed at the upper surface of keyboard membrane in the first portion 120 and interfaced with a processing resource of integrated printed circuit board 126, such as the keyboard matrix controller. In an alternative embodiment, liquid detections sensors 160 may also be included in second portion 122 and interfaced with the capacitive touch sensor or other type of processing resource. One example liquid detection sensor 160 is a set of plural pads that detect liquid when a short is created between the pads. Another type of liquid detection sensor is a resistive sensor that has a change in resistance when a liquid comes into contact with the sensor. The contiguous nature of keyboard membrane 118 across both the key input and capacitive touch portions provides an area for liquid detection that encompasses most of the key upper surface. When liquid is detected, the liquid detection event is stored in non-transitory memory, such as flash on printed circuit board 126 or the system motherboard by communication through connector interface 130.

Figure 12:
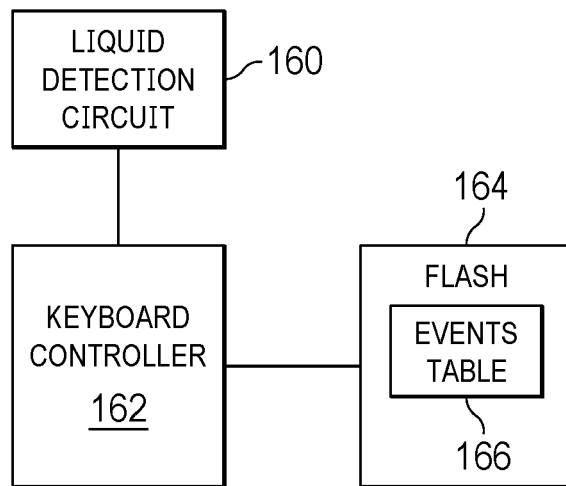
FIG. 12 depicts a block diagram of liquid detection logic to detect and store a liquid spill event at a portable information handling system.

Referring now to FIG. 12, a block diagram depicts liquid detection logic to detect and store a liquid spill event at a portable information handling system. In the example embodiment, liquid detection circuit 160 at detection of a liquid sends a high signal to a GPIO of keyboard controller 162, such as a key matrix controller, which wakes in response to the GPIO input. Keyboard controller 162 writes a liquid spill event to a flash memory 164 events table 166 so that the liquid spill event remains stored in the keyboard membrane as a reference for reuse of the membrane. In addition, the event may be communicated to a non-transitory memory of the motherboard so that the liquid spill event remains with the system in case the keyboard membrane is separated and reused in a different system. As one example, events table 166 may be stored with a housing intrusion system that monitors ingress to the housing interior, as described below.

Figure 13:
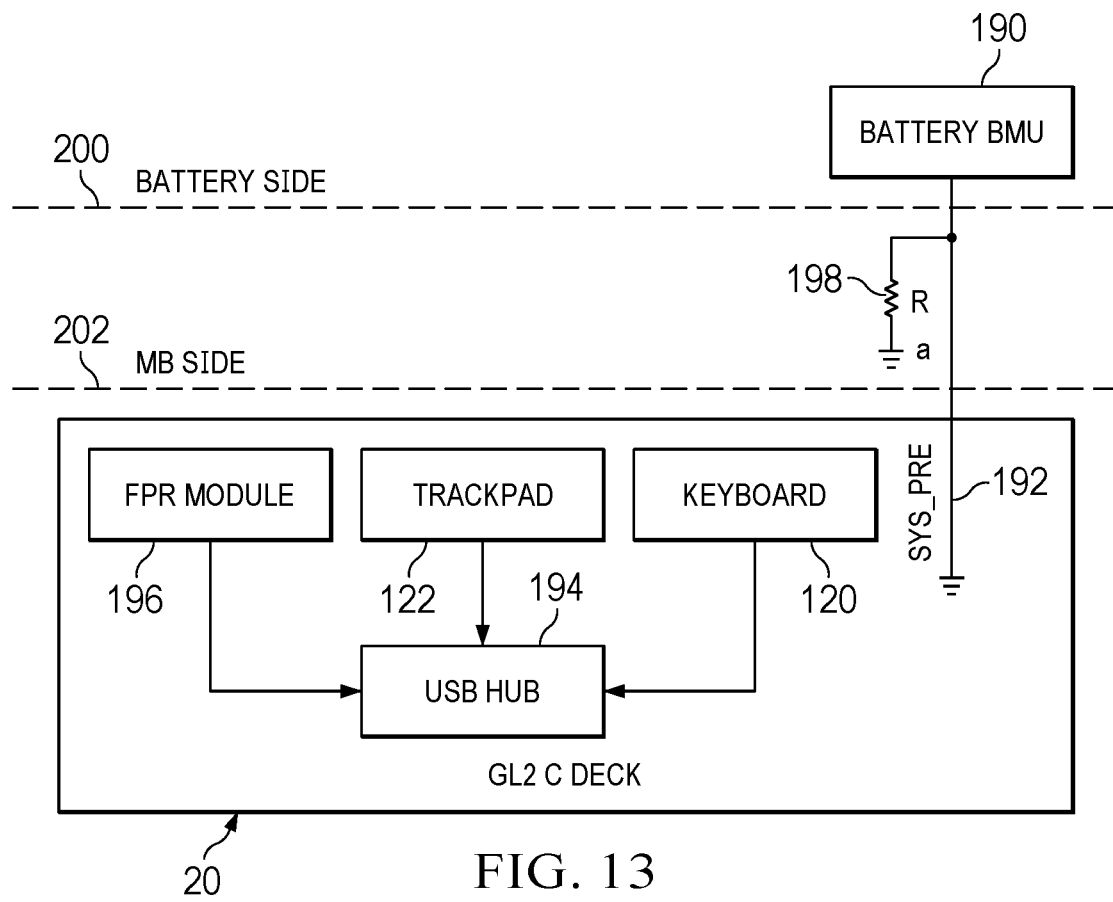
FIG. 13 depicts a block diagram of an intrusion detection circuit to detect and store intrusion events within the system housing.

Referring now to FIG. 13, a block diagram depicts an intrusion detection system to detect and store intrusion events within the system housing. A battery management unit (BMU) 190 interfaces across a battery side interface 200 with a motherboard side interface 202 and a keyboard membrane on housing cover 20. A battery ground through resistor 198 is located at motherboard side 202 and a sys_pre ground 192 is located at the keyboard membrane. A communications hub 194, such as a USB hub, provides an interface between motherboard side 202 and processing resources located on the membrane printed circuit board, such as a fingerprint recognition module 196, a second membrane portion 122 having a capacitive touch sensor to support a trackpad and a keyboard assembly 120. Communications hub 194 provides a central communication resource with the motherboard so that a pin count between the keyboard membrane and motherboard is reduced. Resistor 198 on the motherboard provides a PCBA level test and is do not populate (DNP) after the PCBA power test. Sys_pre ground 192 has a similar design logic on the keyboard membrane PCBA. An internal pull up pulse that is provided for power savings on sys_pre ground 192 pin in battery BMU 190 is leverage to detect a system access. Once sys_pre ground 192 pin is deasserted by the host side, such as either the motherboard or membrane, more than a threshold duration, the battery turns the power one.

In the example embodiment, system intrusion is detected without a dedicated system intrusion switch or sensor. System power is cutoff when the housing cover 20 is removed so that a system intrusion event may be recorded in the BMU or with CMOS battery power at a flash of the motherboard and/or keyboard membrane circuit board. The system prevents power disruption and potential damage during assembly and disassembly and provides BMU intelligence to manage intrusion detection. Before removing power to the system, BMU 190 logs the intrusion event and can send a notification of the intrusion and system location to a remote tracking website for warranty and service tracking. In addition, communications hub 194 condenses the number of pins used to communicate between the keyboard membrane and motherboard so that a contact interface will support the communication. For instance, 60 pins associated with conventional communication of key input, touchpad, power ground and other information is reduced to 12 pins by leveraging the communication hub protocol, such as USB.

Figure 14:
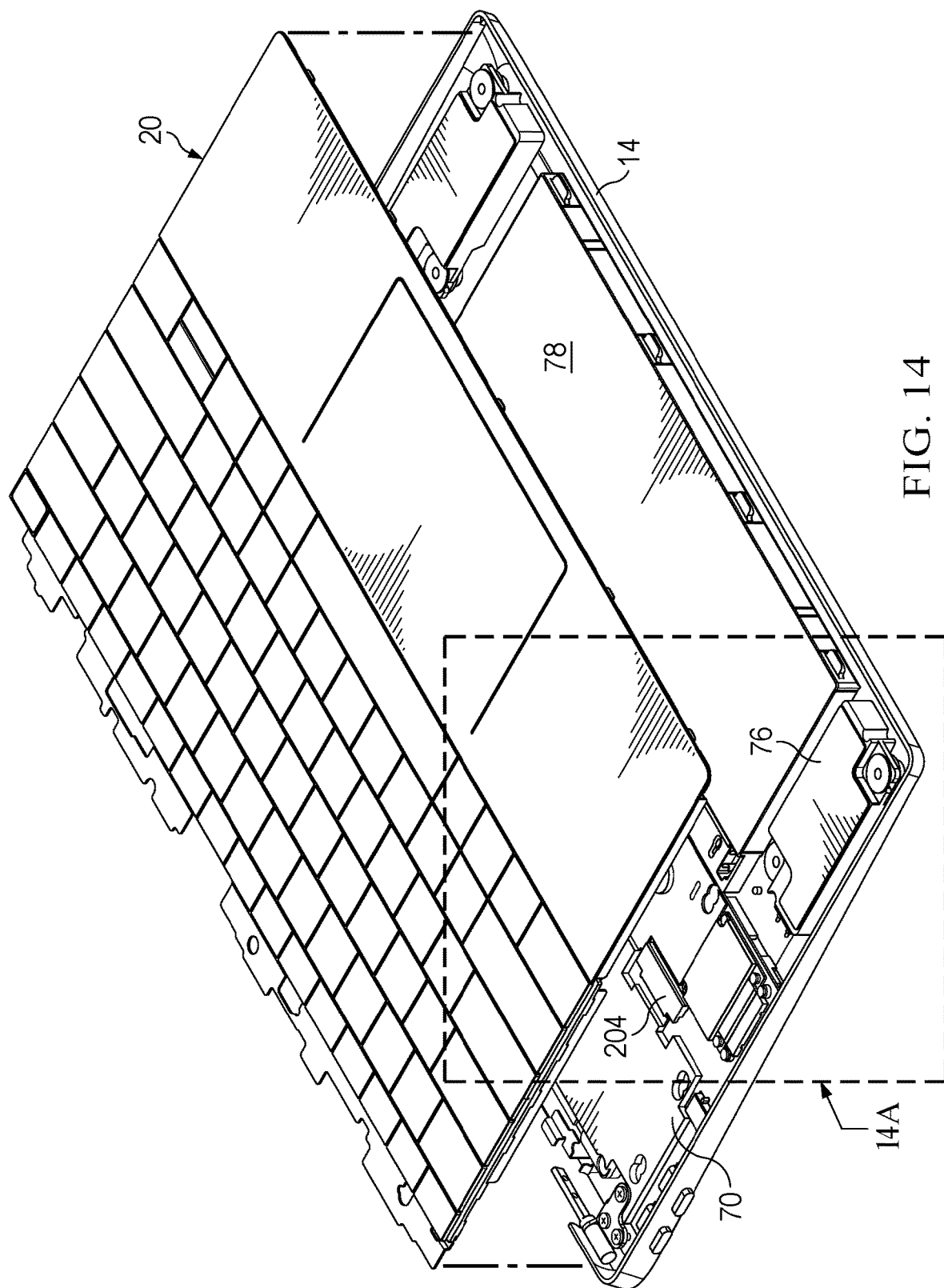
FIGS. 14 and 14A depict an example of disposition of keyboard assembly to motherboard connectors with intrusion detection.
Figure 14A:
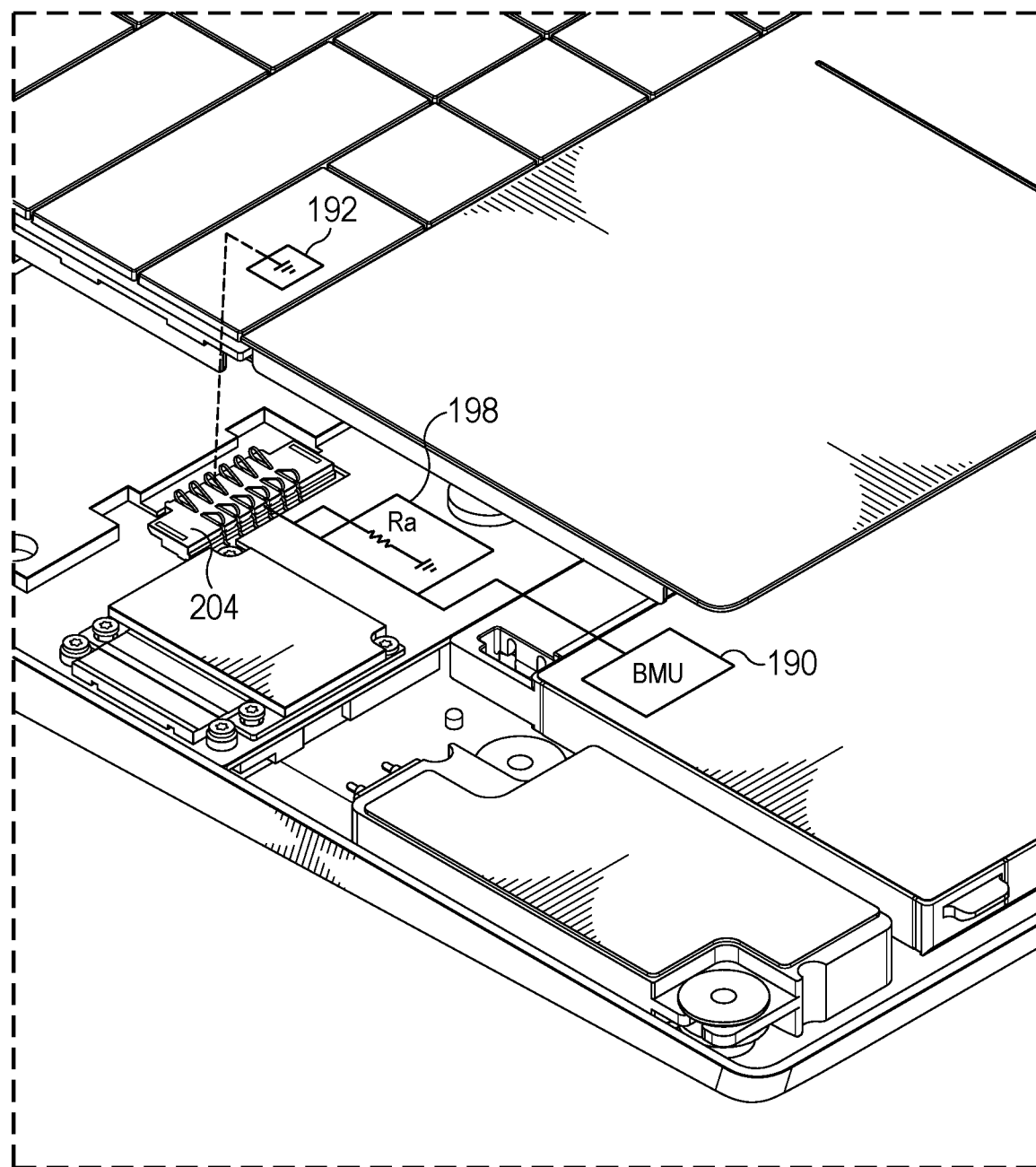

Referring now to FIGS. 14 and 14A, an example of disposition of keyboard assembly to motherboard connectors with intrusion detection are depicted. In the example embodiment of FIG. 14, the keyboard assembly is depicted exploded up from the main housing portion 16 to show the position of the connector 204 coupled to the motherboard 70 and aligned to meet the keyboard membrane connector interface. Battery 78 couples in main housing portion 14 between speakers 76 to provide power to motherboard 70 through a battery connector as described in greater detail below. FIG. 14A depicts a detailed view of connector 204 aligned to communicate with the keyboard assembly when coupled over the main housing portion. Communication between the keyboard membrane and motherboard is established when the cover housing slides into position over the main housing portion. BMU 190 interfaces with connector 204 through the motherboard to compare the Ra ground interface 198 and the keyboard assembly sys-pre ground 192 as described above so that an open main housing portion is detected by the BMU when the keyboard assembly lifts away from the main housing portion.

Figure 15:
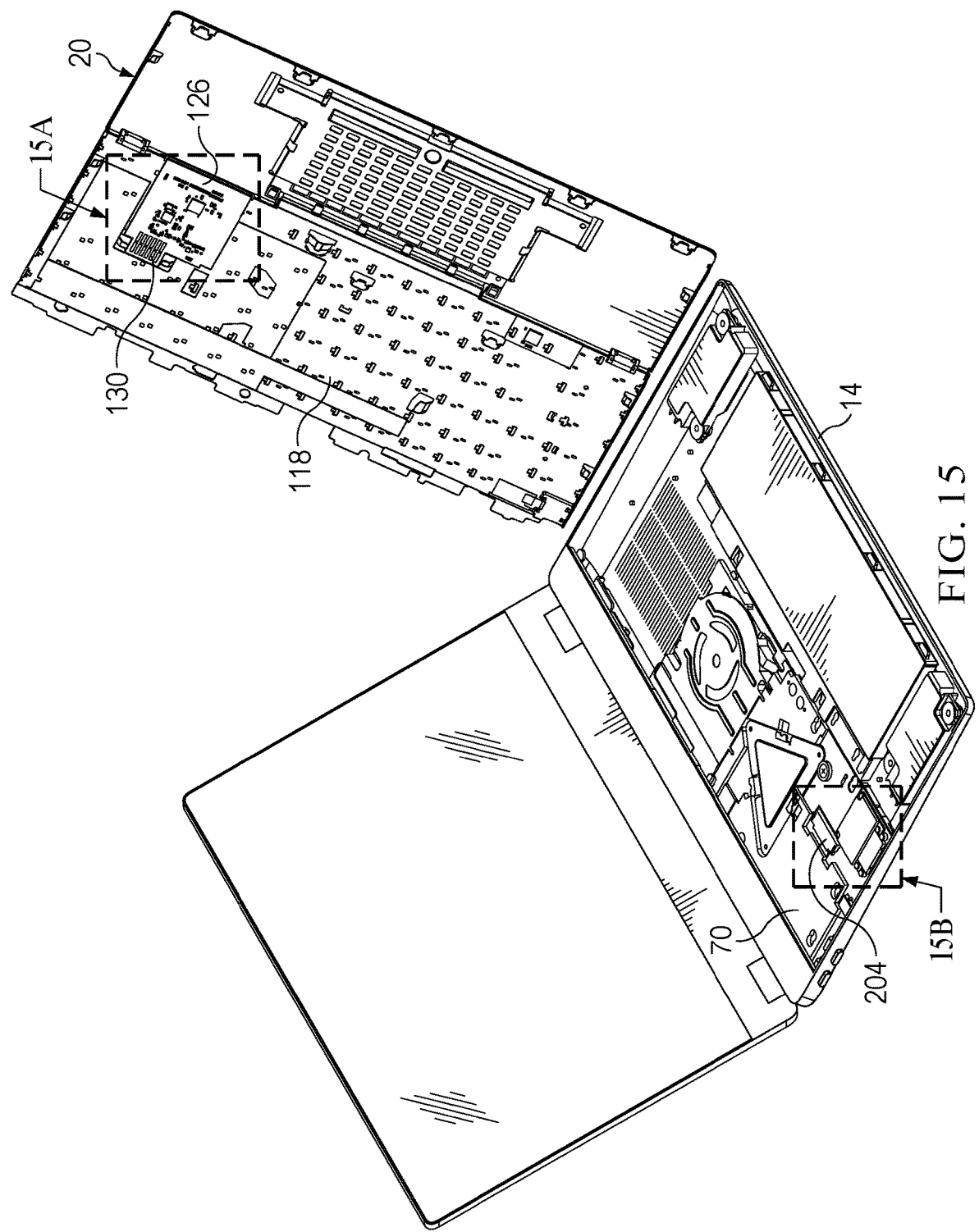
Figure 15A:
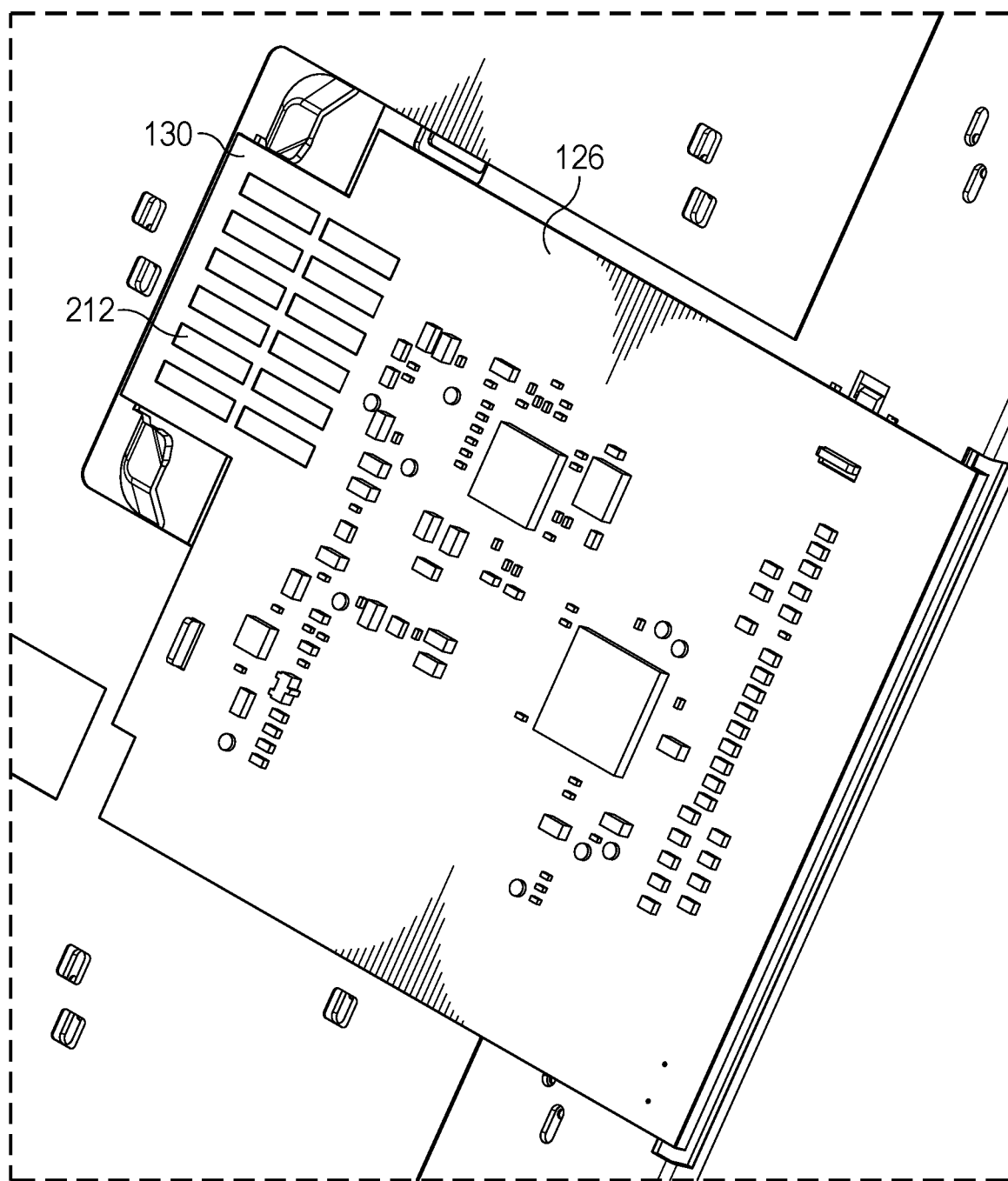
Figure 15B:
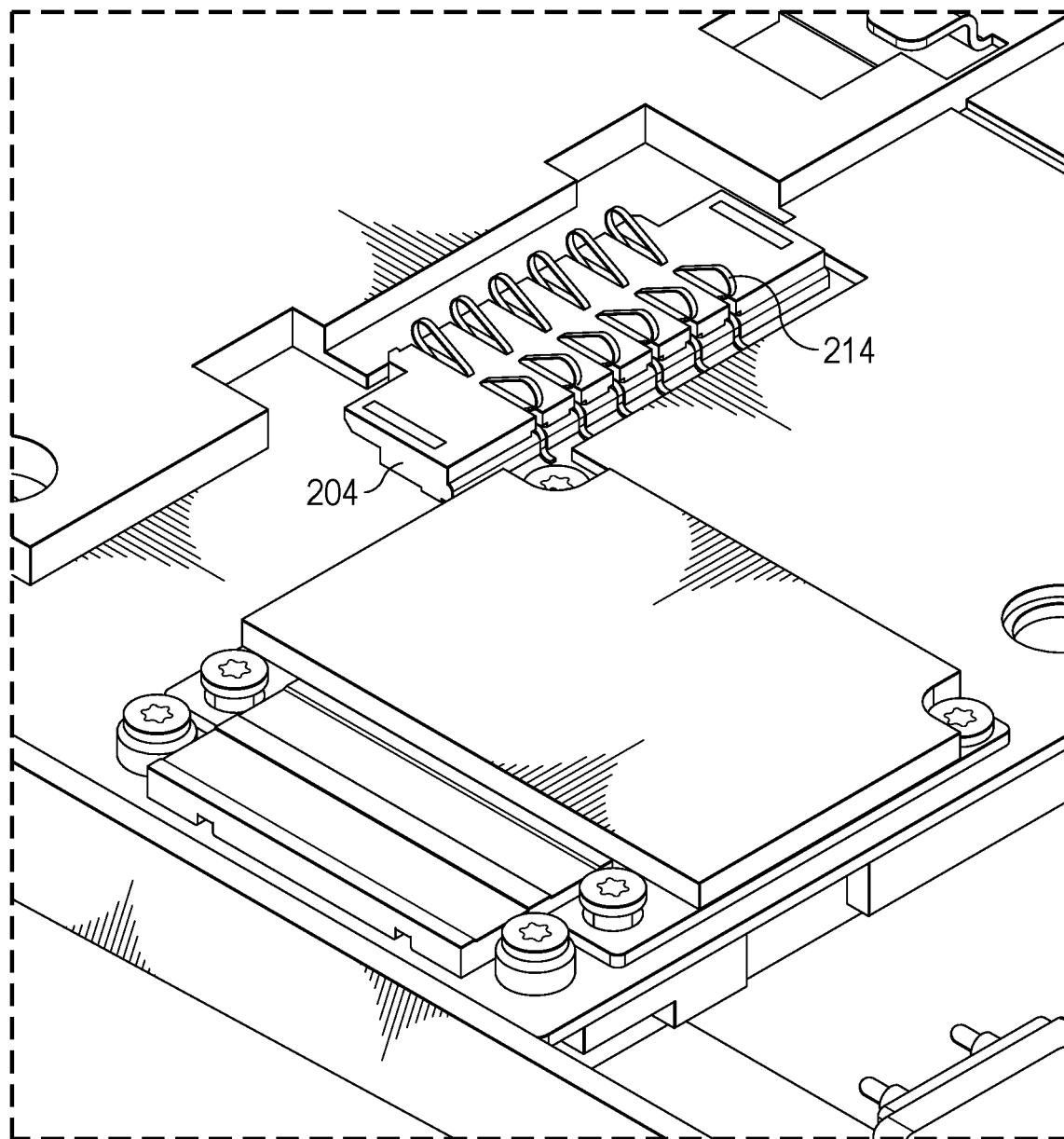

Referring now to FIGS. 15 and 15A through 15C, an example of a 12 pin keyboard membrane connector interface with integrated intrusion detection is depicted. FIG. 15 depicts cover housing 20 lifted from main housing portion 14 to show a bottom surface having the keyboard membrane printed circuit board 126 coupled at the bottom surface with connector interface 130 exposed in a position to align with connector 204 on motherboard 70. As described above, printed circuit board 126 is formed in the membrane material and then folded under housing cover 20 to couple to a structure on the bottom side of housing cover 20. FIG. 15A depicts a detailed view of printed circuit board 126 folded so that connector interface 130 couples into a defined position with twelve contact pads 212 aligned to engage against spring fingers of connector 204. FIG. 15B depicts connector 204 coupled to the motherboard and having twelve spring fingers 214 extending up and aligned to press against the connector interface contact pads 212. FIG. 15C depicts the pin positions for the spring fingers and contact pads to communicate information, power and ground between the keyboard membrane and motherboard relying in part on the USB protocol of the communications hub to communicate the information. The first four pins communicate speaker signals with positive and negative power feeds that drive the analog speaker at the speaker communication pads described above. Pin 5 provides power to the keyboard backlight, such as under the control of the information handling system embedded controller that varies the power to adjust brightness. Pin 6 is a power key switch to power the system on and off, such as power button in the keyboard assembly. Pen 7 communicates touchpad information. Pin 8 provides a ground. Pins 9 and 10 support USB communication and can include key inputs, touchpad inputs and any other information that fits within the available bandwidth. Pin 11 supports the fingerprint reader and pin 12 supports the battery present signal described above that is also used to detect intrusion into the housing.

Figure 16:
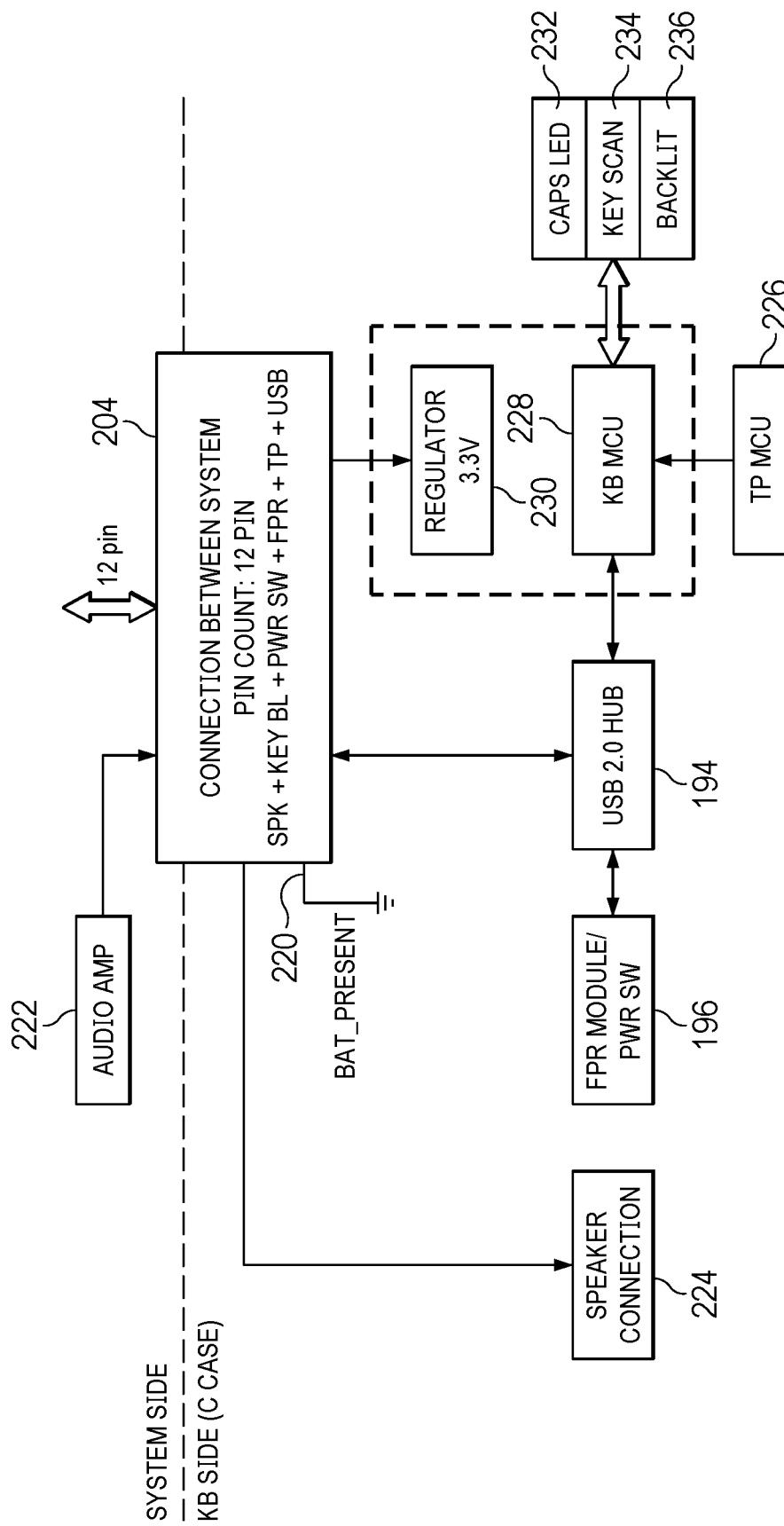
FIG. 16 depicts a circuit block diagram of interfaces between an information handling system motherboard and keyboard printed circuit board.

Referring now to FIG. 16, a circuit block diagram depicts interfaces between an information handling system motherboard and keyboard printed circuit board. An audio amplifier 222 provides speaker signals with power to play the speakers through connector 204 to the speaker connection 224, such as the contact pads formed in the keyboard membrane and extending down the speaker lock member. In alternative embodiments, an audio processor and amplifier may couple to the keyboard printed circuit board so that audio information communicated by USB is converted to speaker signals at the keyboard membrane. A battery present ground 220 interface couples to one pin of connector 204 to detect intrusion into the housing as describe above. Communications hub 194 supports USB 2.0 to coordinate communication between the motherboard and a finger print recognition module 196 and a keyboard processing resource 228, such as an MCU. A power regulator 230 accepts power from connector 204 to power keyboard processing resource 228. A touchpad processing resource 226, such as an MCU, interfaces with keyboard processing resource 228 to communicate touchpad inputs to connector 204 as USB information. Keyboard processing resource 228 interfaces with keycap LEDs 232 to backlight the keyboard, a key scan matrix 234 to detect key input values and a backlight controller 236 to manage backlight brightness. In the example embodiment, the keyboard membrane material is used to define the flexible printed circuit board that includes the processing resources on the keyboard side. In an alternative embodiment, other types of materials may be used to create the printed circuit board, which is then interfaced with the keyboard membrane.

Figure 17:
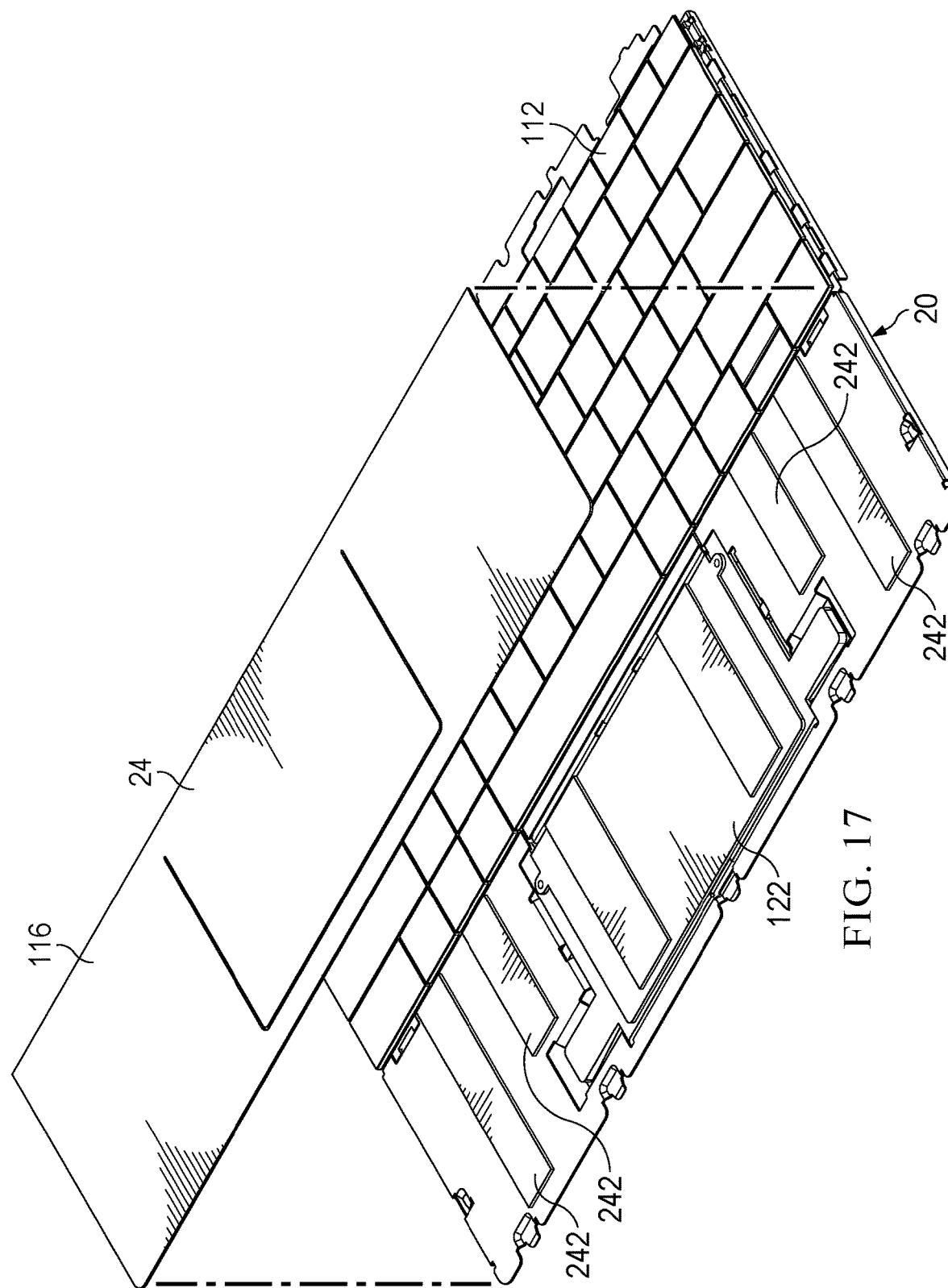
FIG. 17 depicts an upper perspective exploded view of the keyboard assembly and disassembly of a palm rest with electrically reactive adhesive.

Referring now to FIG. 17, an upper perspective exploded view of the keyboard assembly depicts disassembly of a palm rest with electrically reactive adhesive. In the example embodiment, palm rest 116 is coupled to housing cover 20 with electrically reactive adhesive 242 adjacent to key assembly 112. Strips of tape of electrically reactive adhesive 242 are strategically placed to support movement of the touchpad 24, such as for trackpad input clicks detect as keyboard membrane second portion 122. Electrical contacts are interfaced with the electrically reactive adhesive so that, when disassembly is desired, a current applied to the electrical contacts will release palm rest 116. For example, electrical contacts on the bottom side of housing cover 20 allows a current application after removal of housing cover 20 to disassemble palm rest 116. In one embodiment, key assembly 112 may be held in place in part by an overlap of palm rest 116 to help prevent unauthorized disassembly. Alternatively, palm rest 116 and key assembly 112 may assemble and disassemble separately. In another example embodiment, system power may be made available to the contacts so that a processing component command can apply power to remove the palm rest. For example, the operating system, BIOS and/or firmware may command power to the contacts through the CPU, embedded controller and/or keyboard printed circuit board processing resource. Thus, disassembly of palm rest 116 from housing cover 20 may be limited to after removal of housing cover 20 from the information handling system or may be available while housing cover 20 remains coupled to the main housing portion. Although the example embodiment depicts strips of tape of electrically reactive adhesive 242 coupled to housing cover 20, in various embodiments, one or both sides of the tape may have controllable adhesive. That is, a permanent adhesive may couple the strips of tape to palm rest 116 so that application of electrical current releases the palm rest from the housing cover while keeping the tape coupled to the palm rest. Alternatively, the tape may remain coupled to the housing cover while releasing the palm rest. In some cases dual sided tape may release completely from both the palm rest and housing cover when current is applied. Contacts to accept application of current to the electrically reactive adhesive may be placed in the interior of the housing so that the tape can be charged and released once the housing cover is removed.

Figure 18:
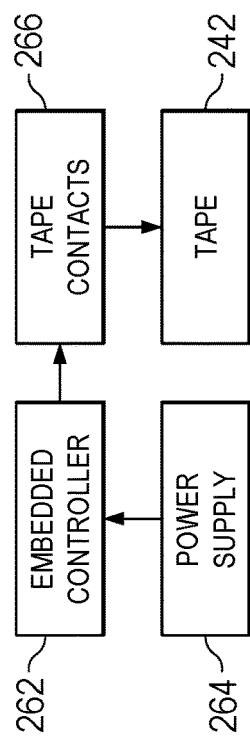
FIGS. 18 and 18A depict a circuit block diagram of keyboard assembly and disassembly of a palm rest with electrically reactive adhesive.
Figure 18A:
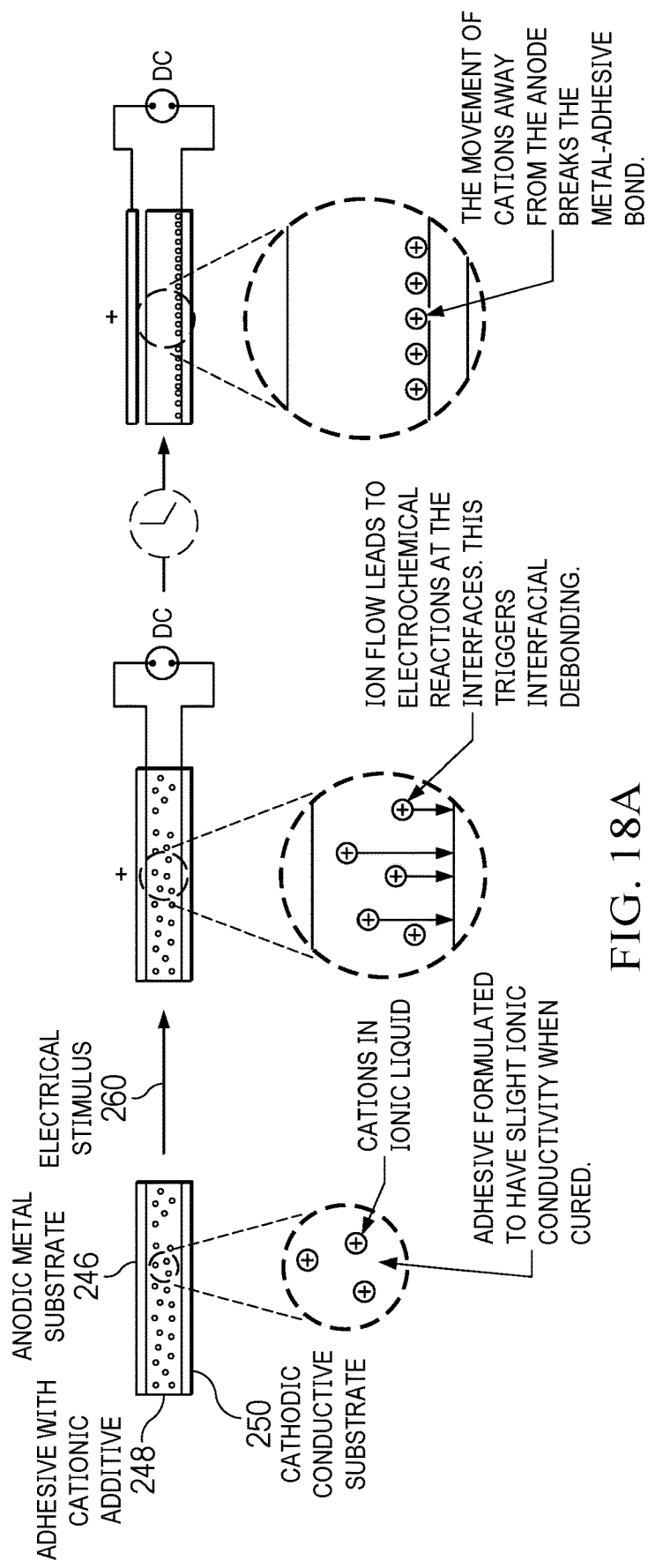

Referring now to FIGS. 18 and 18A, a circuit block diagram depicts keyboard assembly and disassembly of a palm rest with electrically reactive adhesive. In the example embodiment, an embedded controller 262 on a system motherboard and executing firmware in cooperation with the system BIOS applies current from the system power supply 264 to tape contacts 266 to release the electrically reactive adhesive 242 tape. In an alternative embodiment, embedded controller 262 coordinates release of the tape by applying current to tape contacts 266 that are formed as part of the keyboard membrane, such as with a command communicated to the keyboard controller of the keyboard printed circuit board. FIG. 18A depicts an example of electrically reactive adhesive tape that is released by application of current. An anodic metal substrate 246 is separated from a cathodic conductive substrate 250 by an adhesive with cationic additive 248 having cations in ionic liquid as depicted. Application of an electrical stimulus 260 results in electrochemical reactions at the interfaces that trigger interfacial debonding with movement of cations away from the anode breaks the metal-adhesive bond. As is described above, the adhesive may have one or two sides. In one embodiment, a two-sided adhesive may separate electrical interfaces so that each side is released with a separate application of current. Thus, for example, one side of tape is released to release the palm rest from the housing cover, then the second side of tape is released to release the tape completely from the surface. An end user can select whether to release the palm rest from the tape first or the housing cover.

Figure 19A:
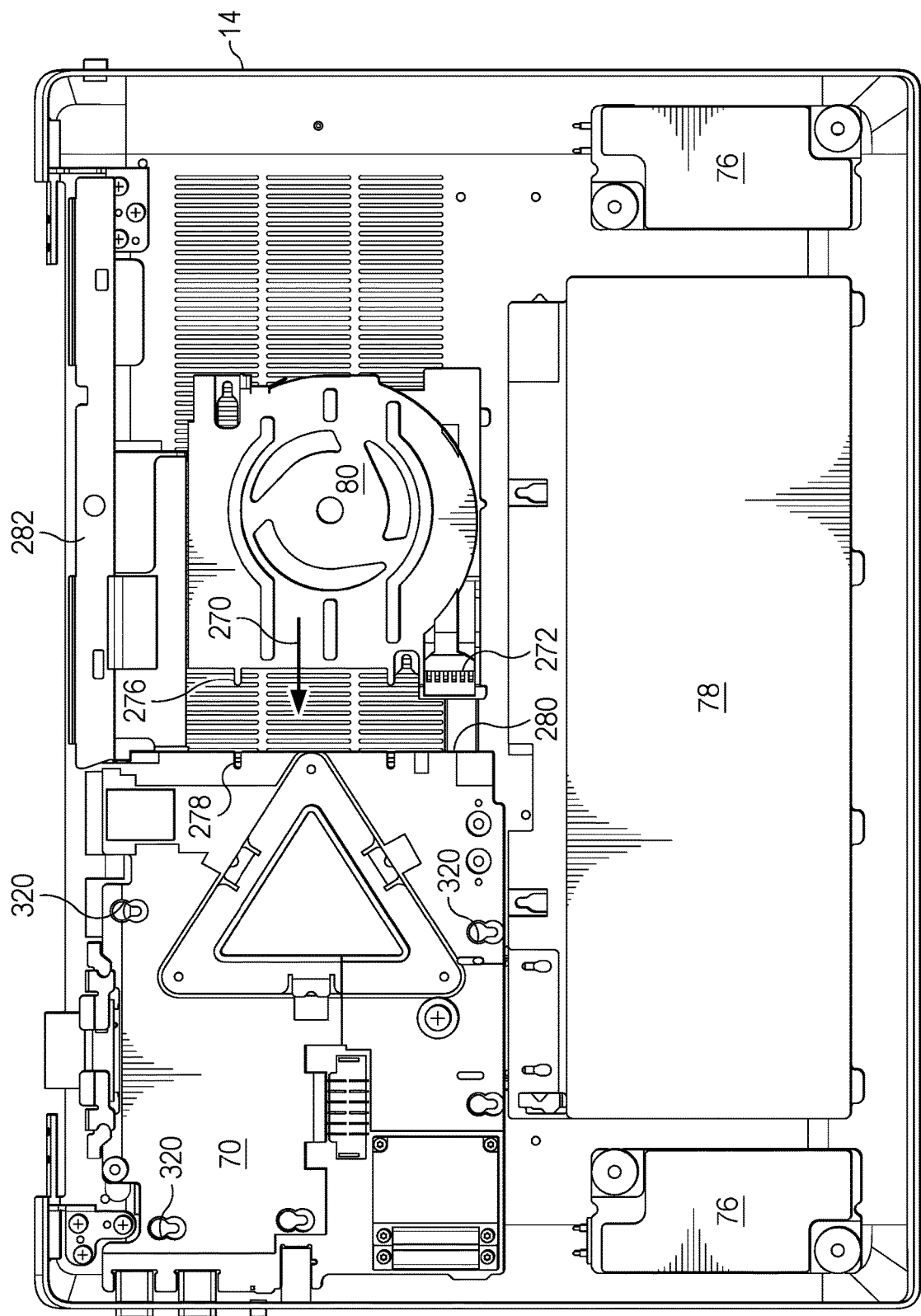
FIGS. 19A through 19C depict a cooling fan coupling with a motherboard in a main housing portion to secure the motherboard in place.
Figure 19B:
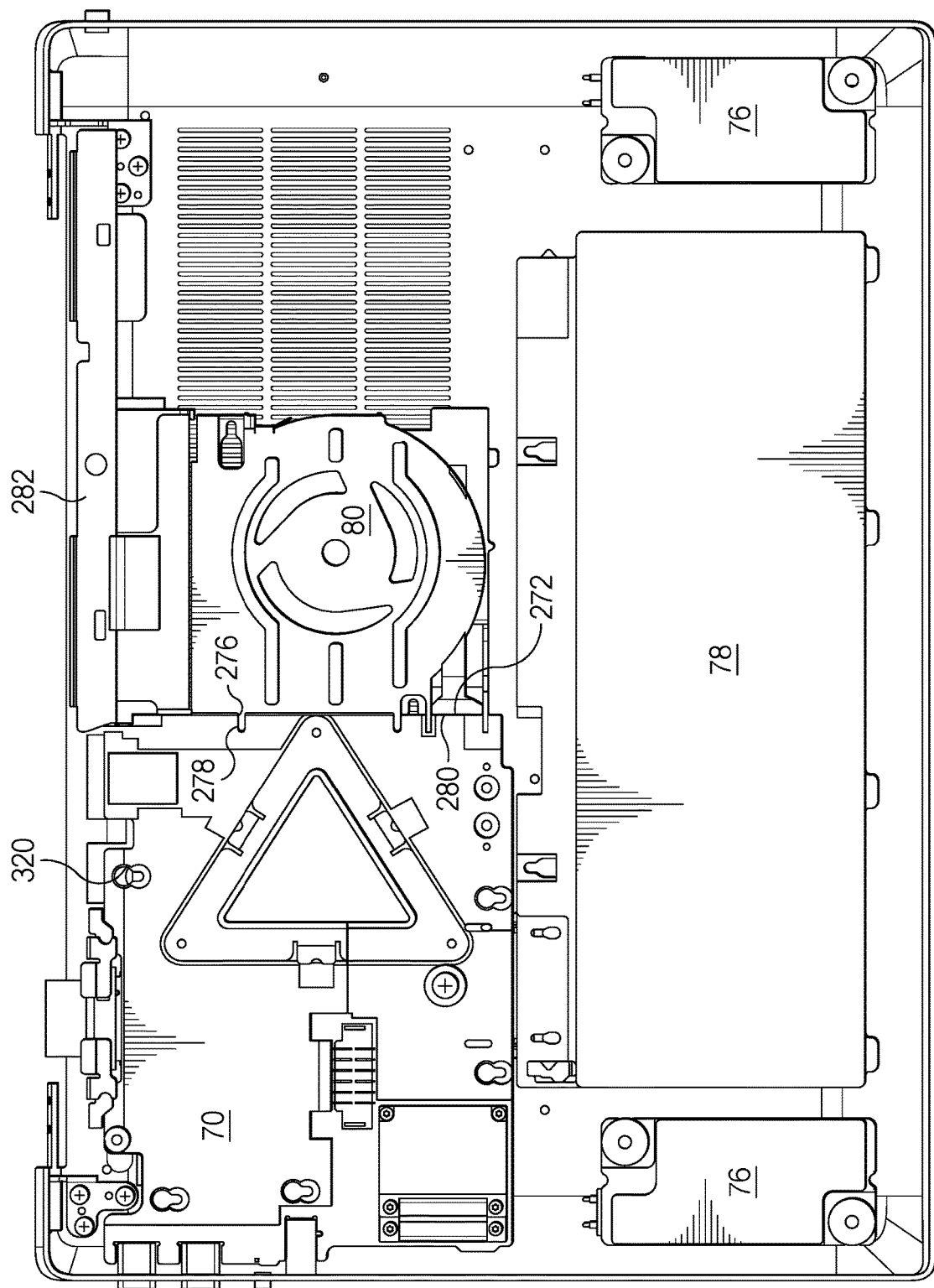
Figure 19C:
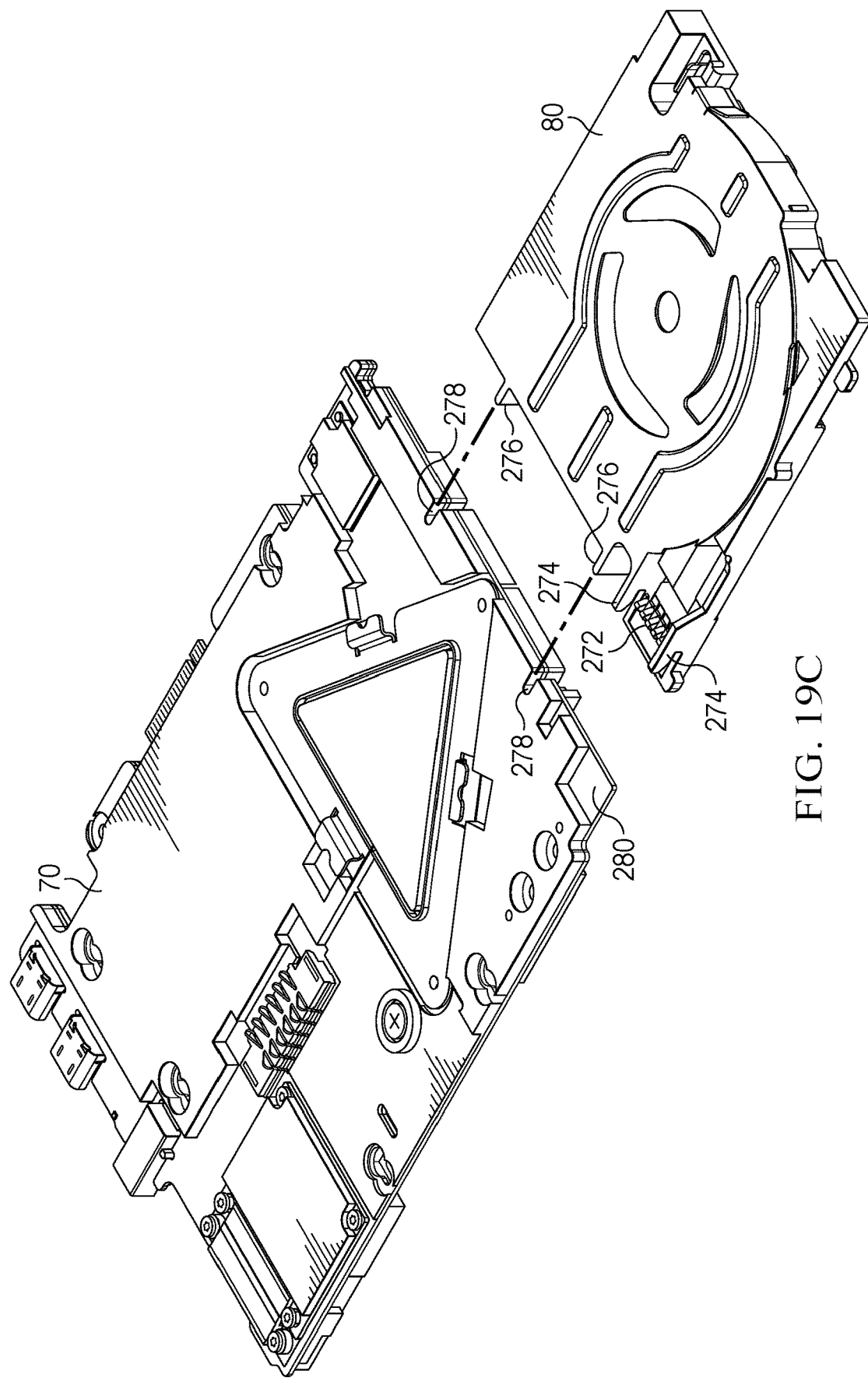

Referring now to FIGS. 19A through 19C, a cooling fan 80 coupling with a motherboard 70 in a main housing portion 14 secures the motherboard in place. Motherboard 70 couples to main housing portion 14 with retention nuts 320 that extend up from main housing portion 14 to fit through openings in motherboard 70. The openings have a pear shape so that when the motherboard slides towards the rear of the housing a lip of the retention nut retains the motherboard in position, as described in greater detail below. Battery 78 fits onto a battery connector to provide power to the motherboard, as detailed below, and speakers 76 rest in a speaker cavity aligned to interface with the speaker contact pads that extend down when the housing cover couples over main housing portion 14. Before cooling fan 80 slides into position as indicated by arrow 270, each of motherboard 70, speakers 76 and battery 78 are free to be lifted from main housing portion 14, such as with a robotic arm. Cooling fan 80 slides as indicated by arrow 270 so that a cooling fan connector 272 fits under motherboard 70 to couple to a motherboard cooling fan connector 280, which provides power and fan speed control to cooling fan 80. Cooling fan 80 engages in structures of main housing portion 14, such as against vents 282, so that engagement of cooling fan 80 with motherboard 70 prevents forward sliding of motherboard 70, thereby securing the motherboard to main housing portion 14 with engagement of the lip of retention nuts 320.

FIG. 19B depicts cooling fan 80 fully slid to the side of motherboard 70 so that connectors 272 and 280 fully engage to establish operational power and control communication between motherboard 70 and cooling fan 80. A rib structure 276 of cooling fan 80 inserts into a slot 278 of motherboard 70 to ensure proper alignment and reinforce against sliding motion of motherboard 70. Once cooling fan 80 fully slides into position, airflow is drawn by the cooling fan and directed out exhaust vent 282 to provide thermal rejection for motherboard processing components, such as the CPU. FIG. 19C depicts the alignment of rib structures 276 and slots 278 to provide a robust structure against sliding movement of motherboard 70. A clip 274 formed in cooling fan 80 proximate the connector 272 engages with motherboard 70 to lock the cooling fan in a relative vertical position. At disassembly, pressing on clip 274 and pulling cooling fan 80 to slide away from motherboard 70 releases the motherboard for removal from the main housing portion 14, such as with manipulation with a robotic arm to slide and release from retention nuts 320.

Figure 20:
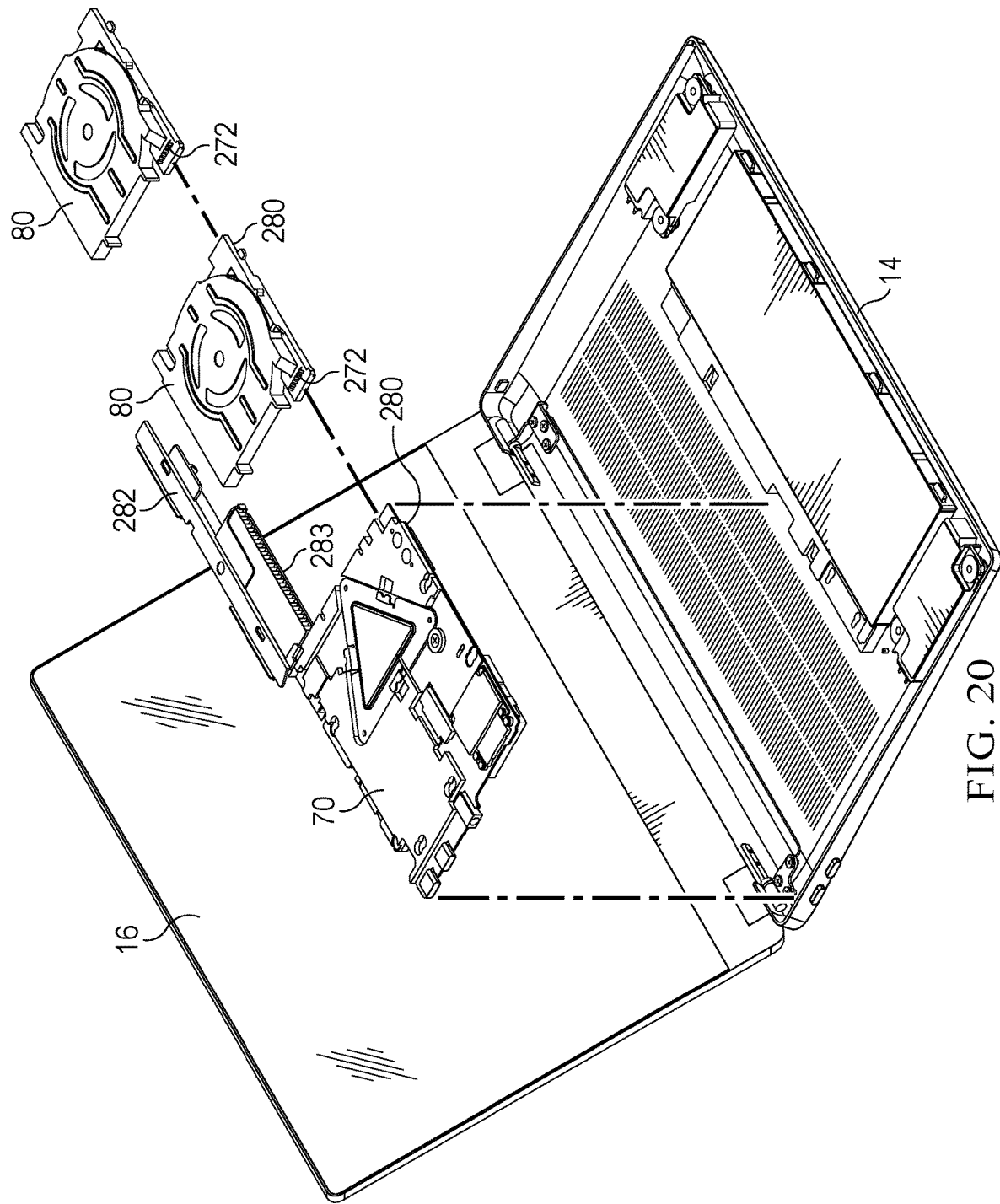
FIGS. 20 and 20A through 20E depict an information handling system having a series cooling fan interconnect with adjustable cooling capacity.
Figure 20A:
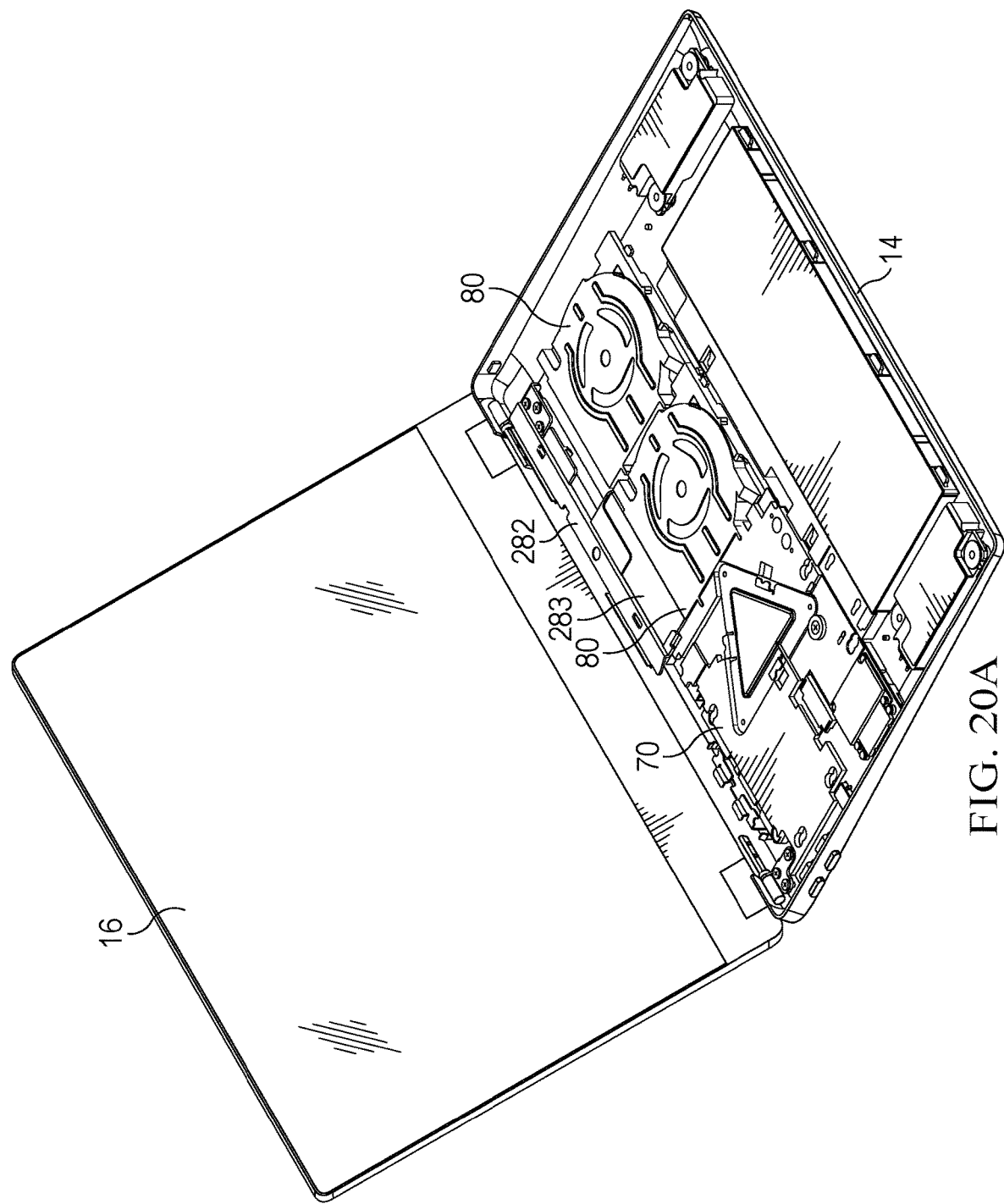

Referring now to FIGS. 20 and 20A through 20E, an information handling system having a series cooling fan interconnect with adjustable cooling capacity is depicted. FIG. 20 depicts an exploded view of first and second cooling fans 80 aligned to couple to main housing portion 14 to support cooling airflow for processing components coupled to a motherboard 70, such as a CPU. A first cooling fan 80 interfaces a connector 272 of the cooling fan to a connector 280 at the bottom surface of motherboard 70 as described above. An exhaust 282 includes a cooling channel 283 that directs cooling airflow pulled across motherboard 70 through cooling channel 283 to exchange thermal energy with a heat sink and out exhaust 282. A second cooling fan 80 has a connector 272 that couples with a rear connector 280 on the bottom side of the first cooling fan and having the same footprint as the motherboard connector. The second cooling fan in the example embodiment exhausts airflow out exhaust 282 without a cooling channel 283. Cooling fans 80 under the management of an embedded controller on motherboard 70 manage fan speeds relative to each other to optimize how cooling air flows through the housing and out of exhaust 282. For example, the embedded controller of motherboard 70 detects the presence of multiple cooling fans and sends control commands through a series connection to each cooling fan. FIG. 20A depicts the first and second cooling fans assembled in series with the first cooing fan blowing cooling airflow across cooling channel 283 and the second cooling fan blowing cooling airflow across a gap and out of exhaust 282. The cooling fan speeds may vary based upon sensed exhaust temperatures and other internal temperatures. For instance, a moderate CPU temperature could tolerate lower airflow through cooling channel 283 to achieve higher overall airflow with the lower resistance to air exhaust of the second cooling fan. Although the example embodiment depicts two cooling fans, in alternative embodiments any number of cooling fans may be interfaced in series provided room exists in the housing.

Figure 20B:
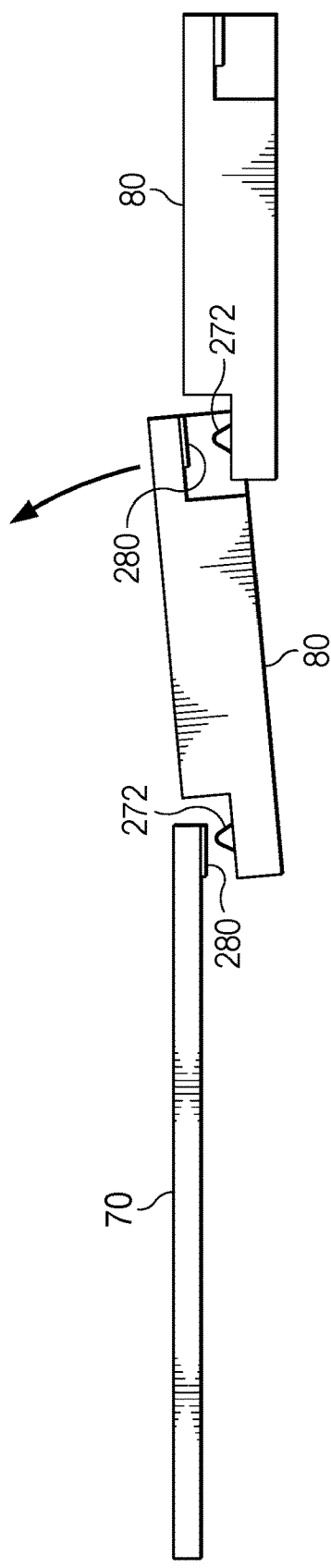
Figure 20C:
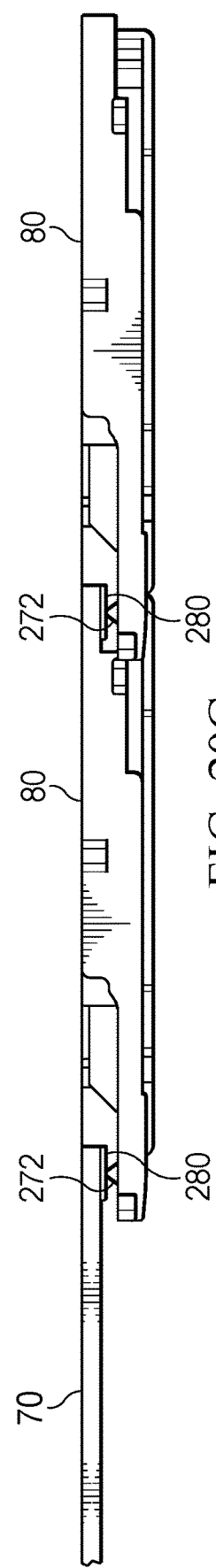
Figure 20D:
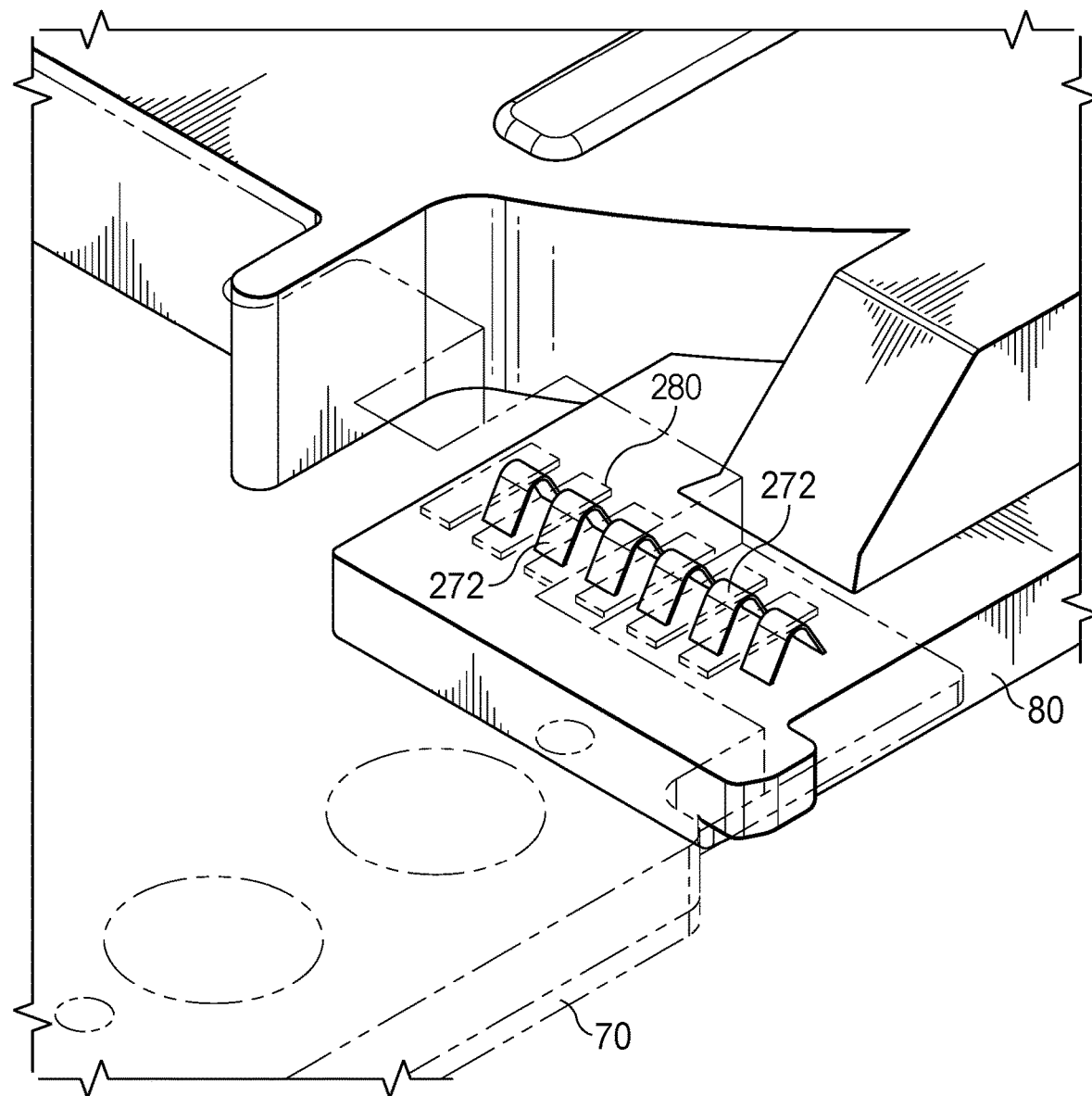
Figure 20E:
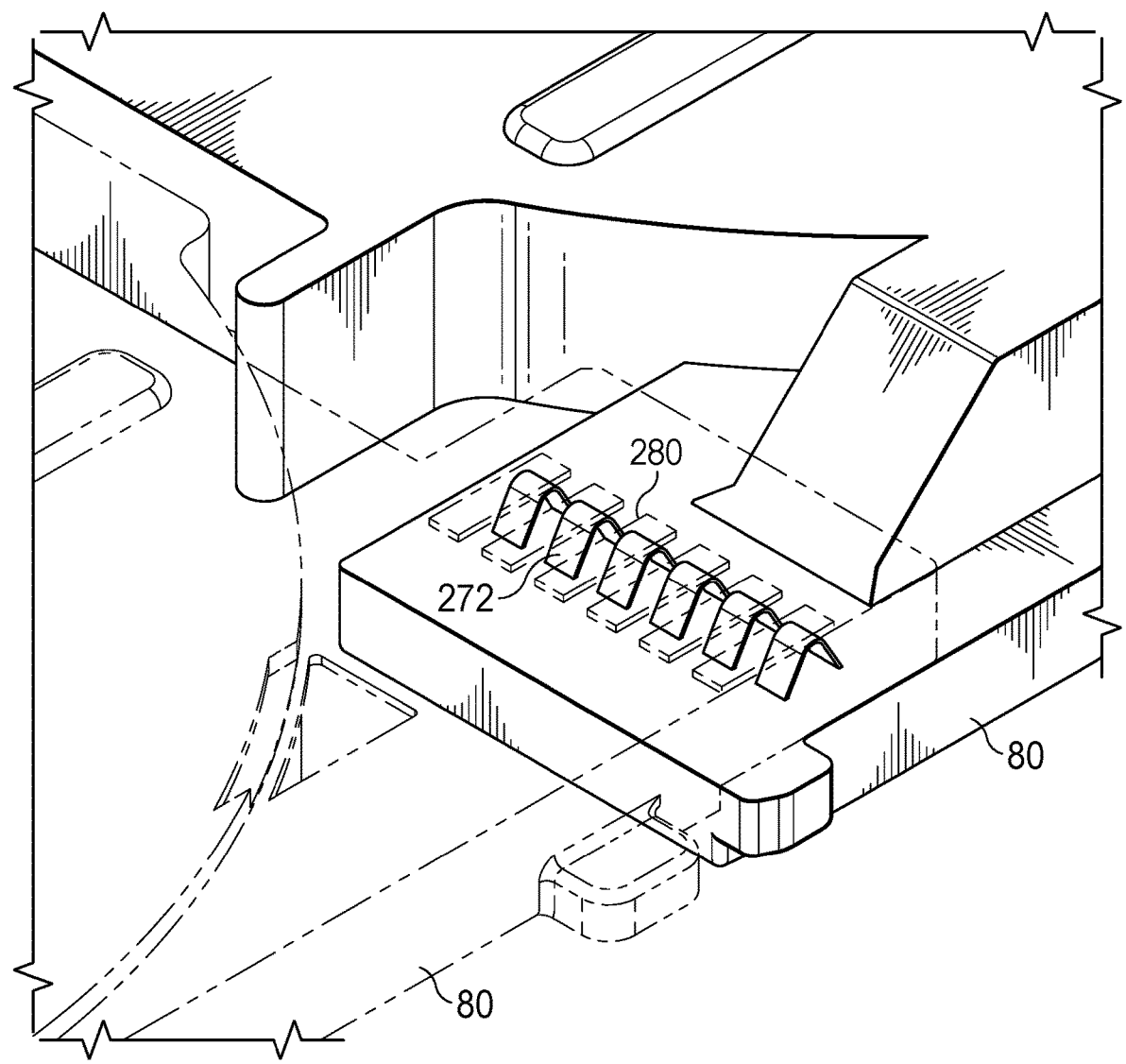

FIG. 20B depicts a side view of motherboard 70 having a connector 280 on the bottom side and aligned to couple with the connector 272 of cooling fan 80. A second fan 80 interfaces serially with motherboard 70 through the first fan by coupling a connector 272 at a front upper surface with a connector 280 on the first fan bottom rear surface that has the form factor of the motherboard connector 280. FIG. 20C depicts a side view of the two cooling fans 80 serially coupled to each other so that a processing component of the motherboard, such as an embedded controller, manages both cooling fans by communicating with the farthest fan through the intermediary fan. The outer most cooling fan draws cooling airflow through the intermediary cooling fan to increase the cooling airflow across motherboard 70 or, alternatively, draws air from the housing interior to help decrease interior air temperatures. FIG. 20D depicts a perspective transparent view of the first cooling fan 80 connector 272 having spring fingers that bias upward against contact pads of the motherboard 70 connector 280. FIG. 20E depicts a perspective transparent view of the second cooling fan 80 having a connector 272 with spring fingers biased up against connector 280 contact pads formed in the bottom surface of the middle fan 80. In alternative embodiments different numbers of cooling fans with varying capabilities and air flow configurations may be used in series to achieve a desired thermal and acoustic profile for the information handling system.

Figure 21:
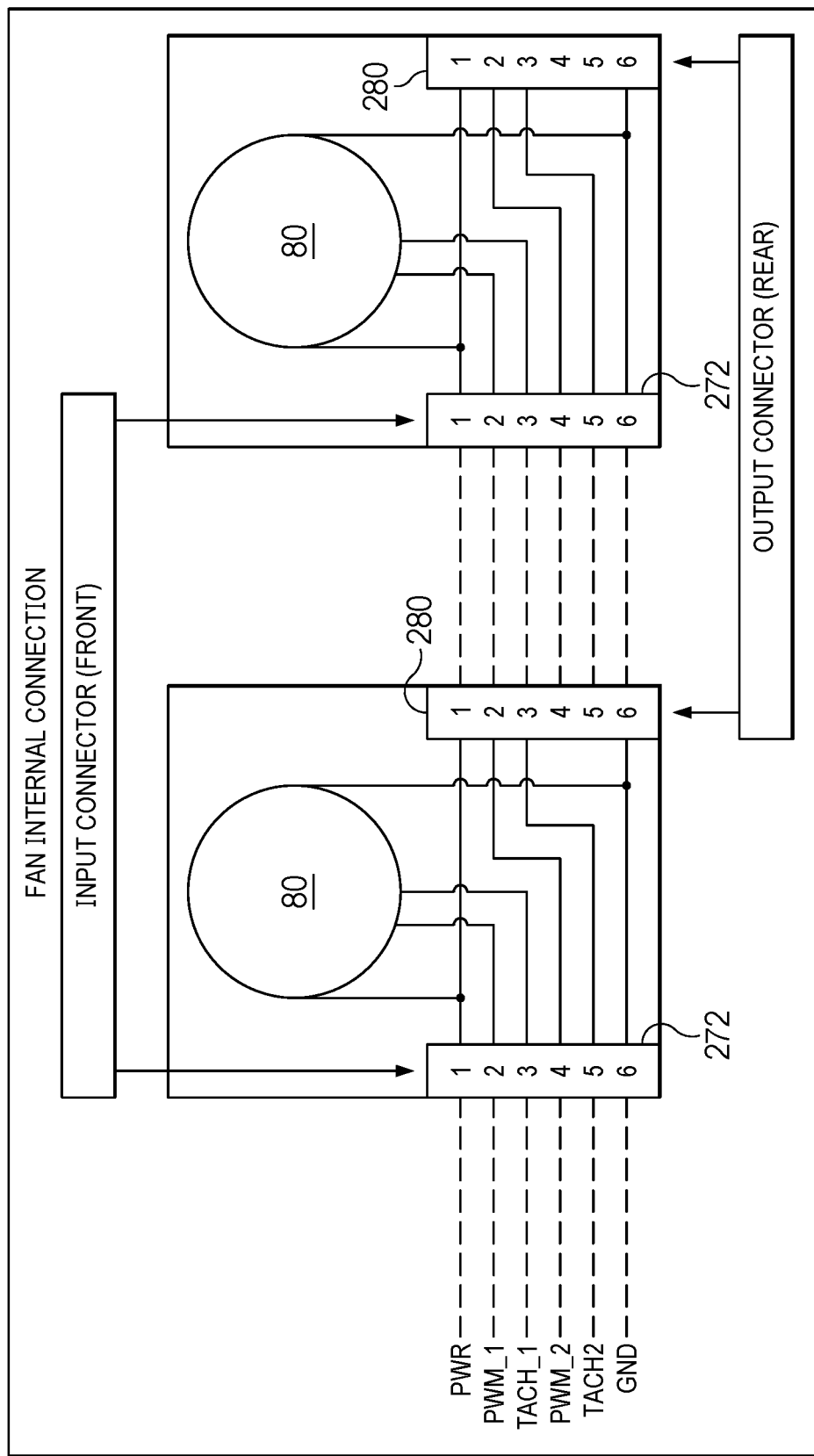
FIG. 21 depicts a circuit block diagram of an example of communication paths between serially interfaced cooling fans.

Referring now to FIG. 21, a circuit block diagram depicts an example of communication paths between serially interfaced cooling fans. In the example embodiment, a common power and ground pin at each cooling fan 80 shares power and ground provided from the motherboard. Pins 2 and 3 provide pulse width modulation (PWM) control and tachometer feedback for the first cooling fan. Pins 4 and 5 provide PWM control and tachometer feedback for the second cooling fan. Each of the pins interface with an embedded controller of the motherboard that executes thermal management firmware to command a fan speed for each cooling fan. In one embodiment, additional cooling fans are supported by adding a PWM and tachometer pin for each additional cooling fan. In an alternative embodiment, a SPI, UART or I2C interface may be used in the place of the PWM interface to control multiple cooling fans.

Figure 22:
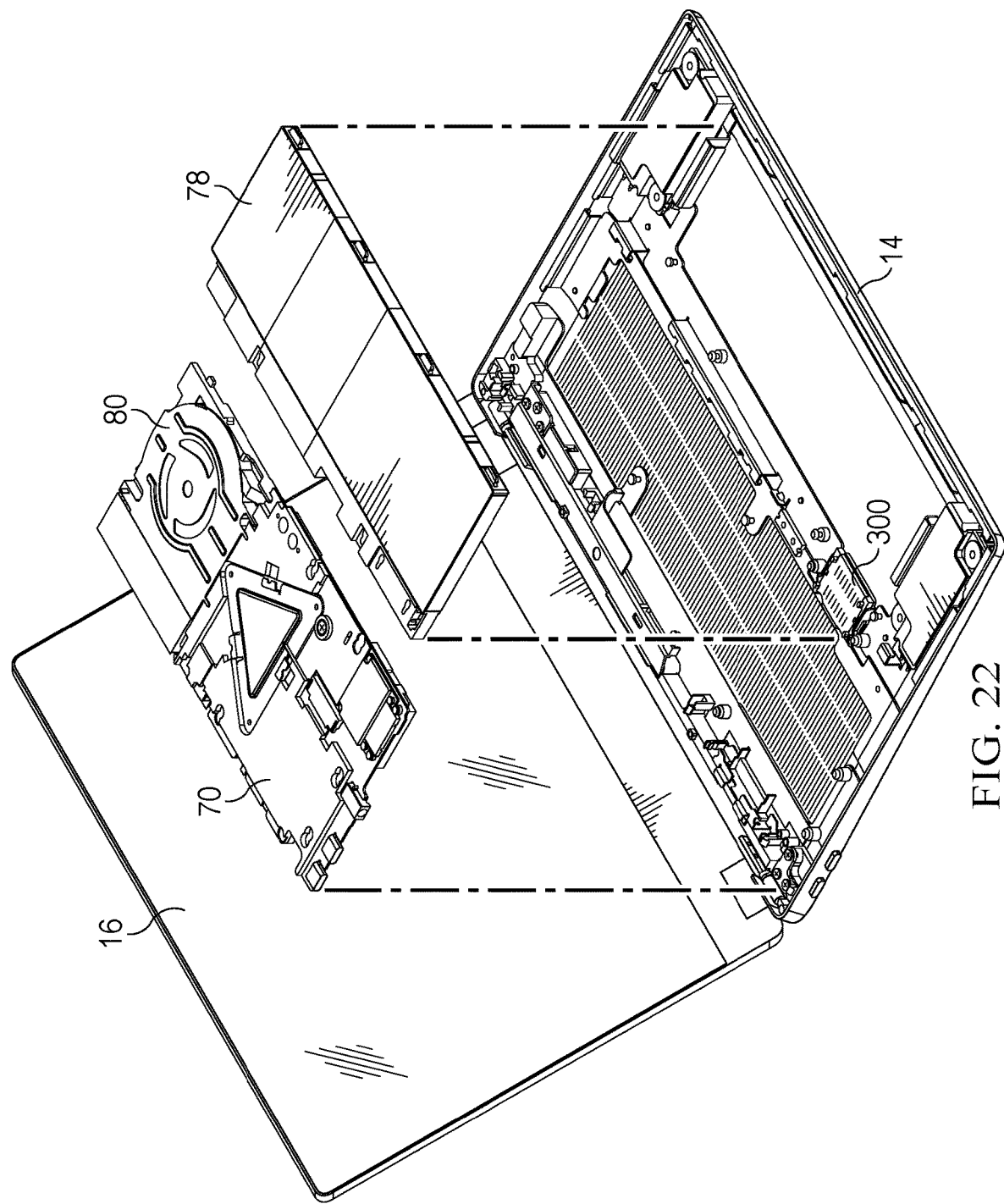
FIGS. 22, 22A and 22B depict an example embodiment of a cable-free battery connector to communicate power between an information handling system motherboard and battery.
Figure 22A:
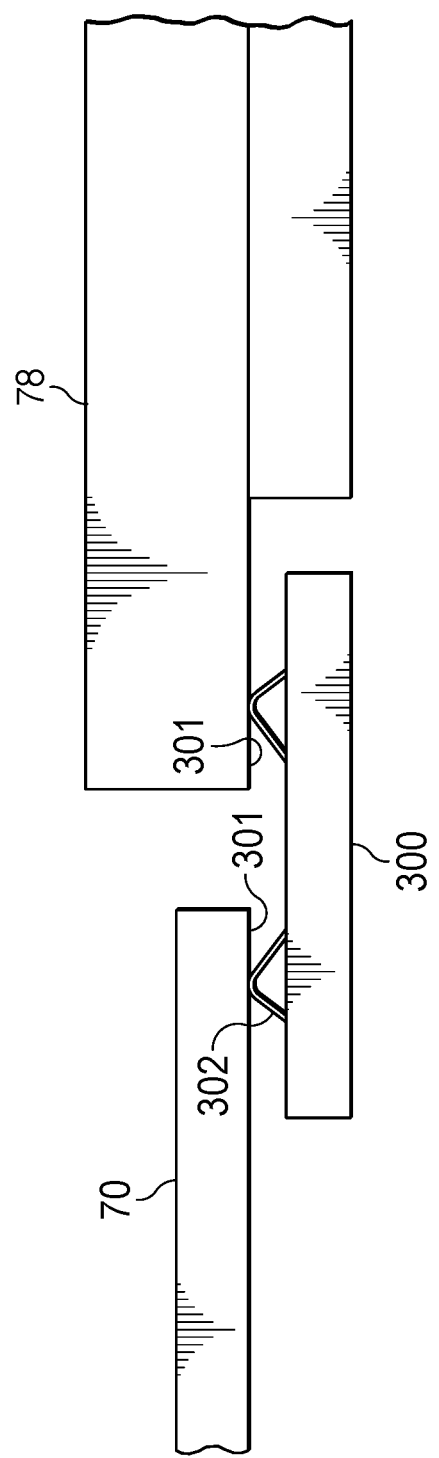
Figure 22B:
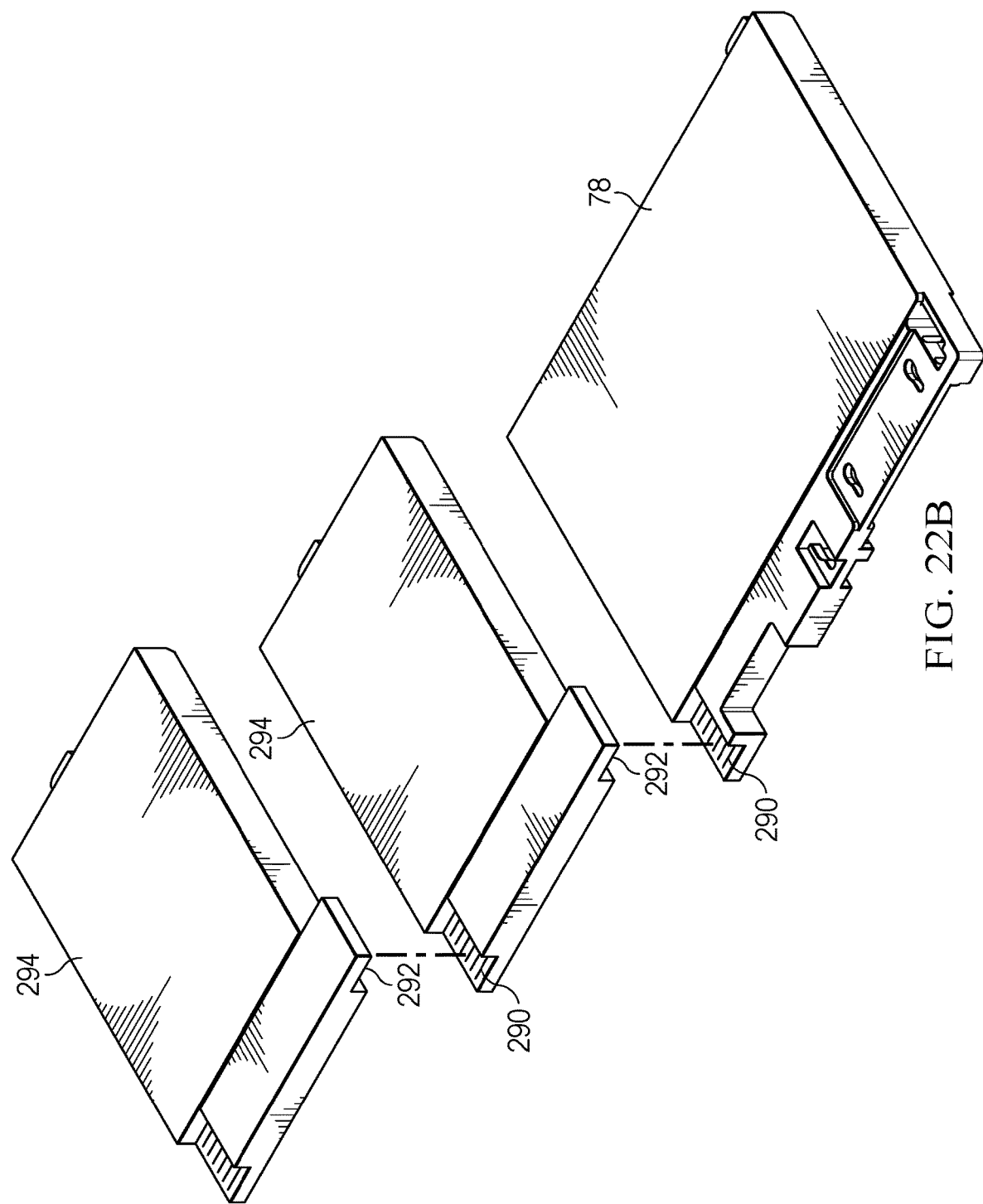

Referring now to FIGS. 22, 22A and 22B, an example embodiment depicts a cable-free battery connector to communicate power between an information handling system motherboard and battery. FIG. 22 depicts the information handling system with motherboard 70, cooling fan 80 and battery 78 explodes out of main housing portion 14. A battery connector 300 is coupled to main housing portion 14 between the coupling locations of battery 78 and motherboard 70. Battery 78 is placed in main housing portion 14 aligned to have contact pads on the battery bottom surface interface with spring members 302 on one side of battery connector 300. Once battery 78 rests in place on main housing portion 14, a lock member extending down from the battery cover couples the battery in place. Motherboard 70 has openings as described above that couple to attachment members extending up from main housing portion 14 by sliding motherboard 70 forward to engage on lips of the attachment members. When motherboard 70 slides into the engaged position, contact pads 301 on the bottom surface of motherboard 70 interface with spring members 302 of battery connector 300 to communicate power with the battery. The position of battery connector 300 and spacing between the spring members provides room to slide motherboard 70 forward when battery 78 is in place. Similarly, when motherboard 70 is engaged with the attachment members, battery 78 removes from main housing portion 14 by lifting out without impacting motherboard 70. In this manner, automated assembly and disassembly is supported, such as by robotic arms. FIG. 22A depicts a side view of motherboard 70 bottom contact pads 301 and battery 78 bottom contact pads 301 align to couple with spring clips of battery connector 300 when assembled in main housing portion 14.

FIG. 22B depicts an example of battery 78 that provides programmable parallel/serial battery back extensions to reuse, recycling and performance level adjustments. In the example embodiment, battery 78 is expandable by first and second battery packs 294 that fit in main housing portion 14 and electrically couple through opposing connector spring clips 292 and connector pads 290. In the example embodiment, each battery pack 294 has an arm that extends spring clips 292 towards a parent battery interface so that the outer side of the battery pack fits within the main housing portion. Spring clips 292 and contact pads 290 extend normal the battery and motherboard interface, although an alternative embodiment may have a linear arrangement based upon the type of shape of the main housing portion and position of the motherboard. The electrical interface and battery configuration may depend based upon the type of system and the system operating conditions. For instance, battery 78 BMU or the motherboard embedded controller may arrange the batteries to have a parallel interface with a reduced voltage and deeper current generation or a series interface with an increased voltage and lesser current generation. The voltage output of battery 78 may vary by changing one or more of the battery packs between series and parallel configurations when operating conditions that vary at the information handling system, such as during surges of power use due to heavy processor use or charging of the battery with external power available. Communication between the motherboard, the battery and the battery pack is managed with a BMU at each battery and communication of commanded battery configurations from the motherboard through each battery and battery pack in series. In one embodiment, CPU performance is managed based upon battery configuration for available voltages and currents, such as by throttling and surging the CPU as desired with corresponding adjustments to battery configurations. Similarly, configuration between series and parallel may help to extend the life of a battery and battery pack arrangement when a battery cell is detected as bad. Thus, for instance, a BMU may command an embedded controller to adjust CPU operating conditions based upon the battery configuration.

Figure 23:
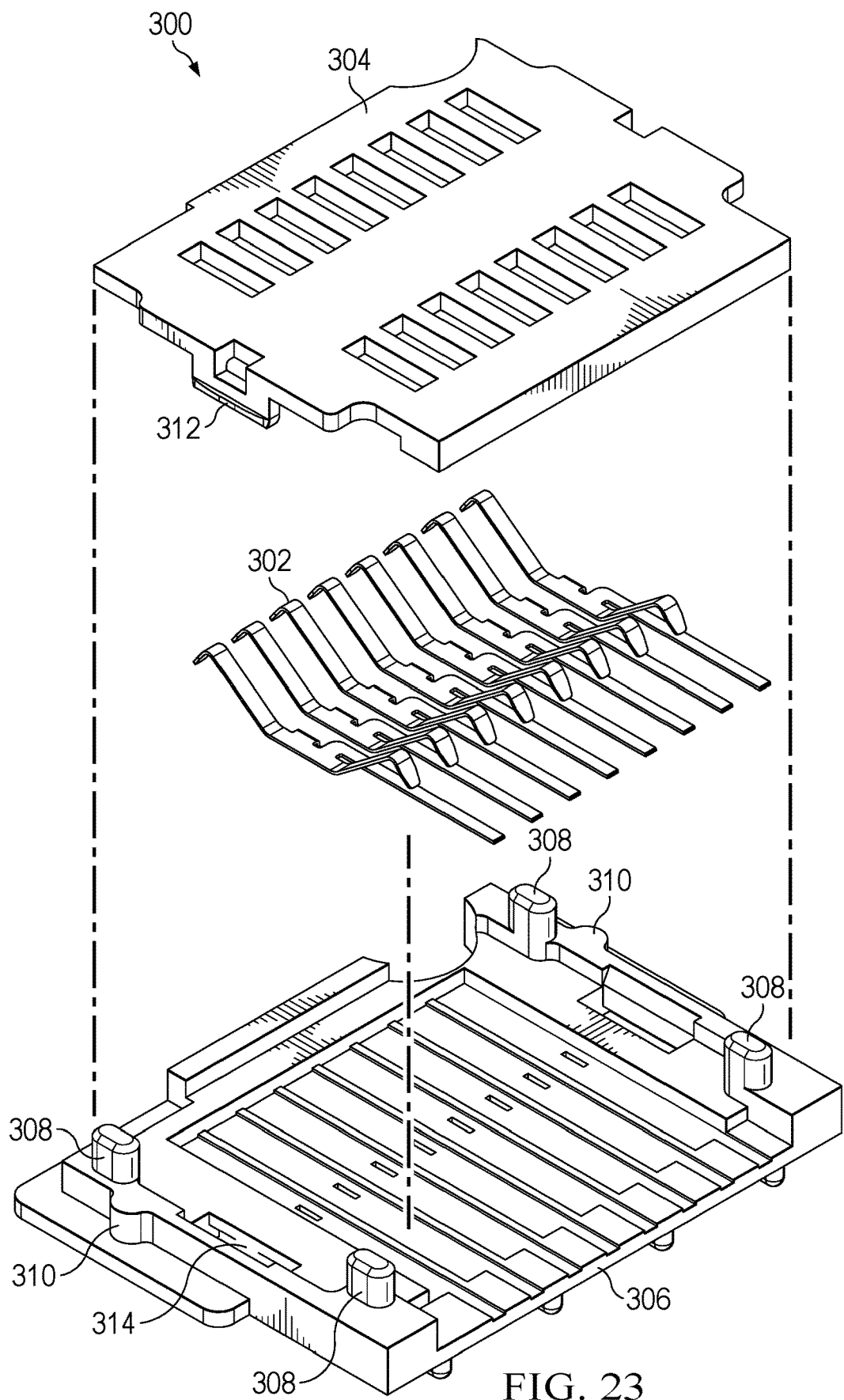
FIG. 23 depicts an exploded front perspective view of the cable-free battery connector.

Referring now to FIG. 23, an exploded front perspective view depicts the cable-free battery connector. A bottom portion 306 couples to the main housing portion and accepts metal spring fingers 302 that conduct power, ground and BMC-to-EC communications. A top portion 304 couples to bottom portion 306 to capture metal spring fingers 302 in place. Alignment posts 308 extend up from bottom portion 306 and above top portion 304 to insert in the battery and motherboard to ensure proper interfaces for the metal spring fingers. Alignment structures 310 extend out of both sides of bottom portion 306 as an alignment reference for mounting to the main housing portion. Top portion 304 clips into place on bottom portion 306 with resilient snaps 312 that fit into and engage with slots 314 so that connector 300 will not disassemble when coupled in an information handling system since the release is hidden from the end user. When an information handling system is refurbished, connector 300 may be reused in an assembled manner, broken down to replace or recoat metal spring fingers 302, or broken down to recycle the plastic and metal as separate materials with an automated break down process, such as interaction with robotic tools.

Figure 24:
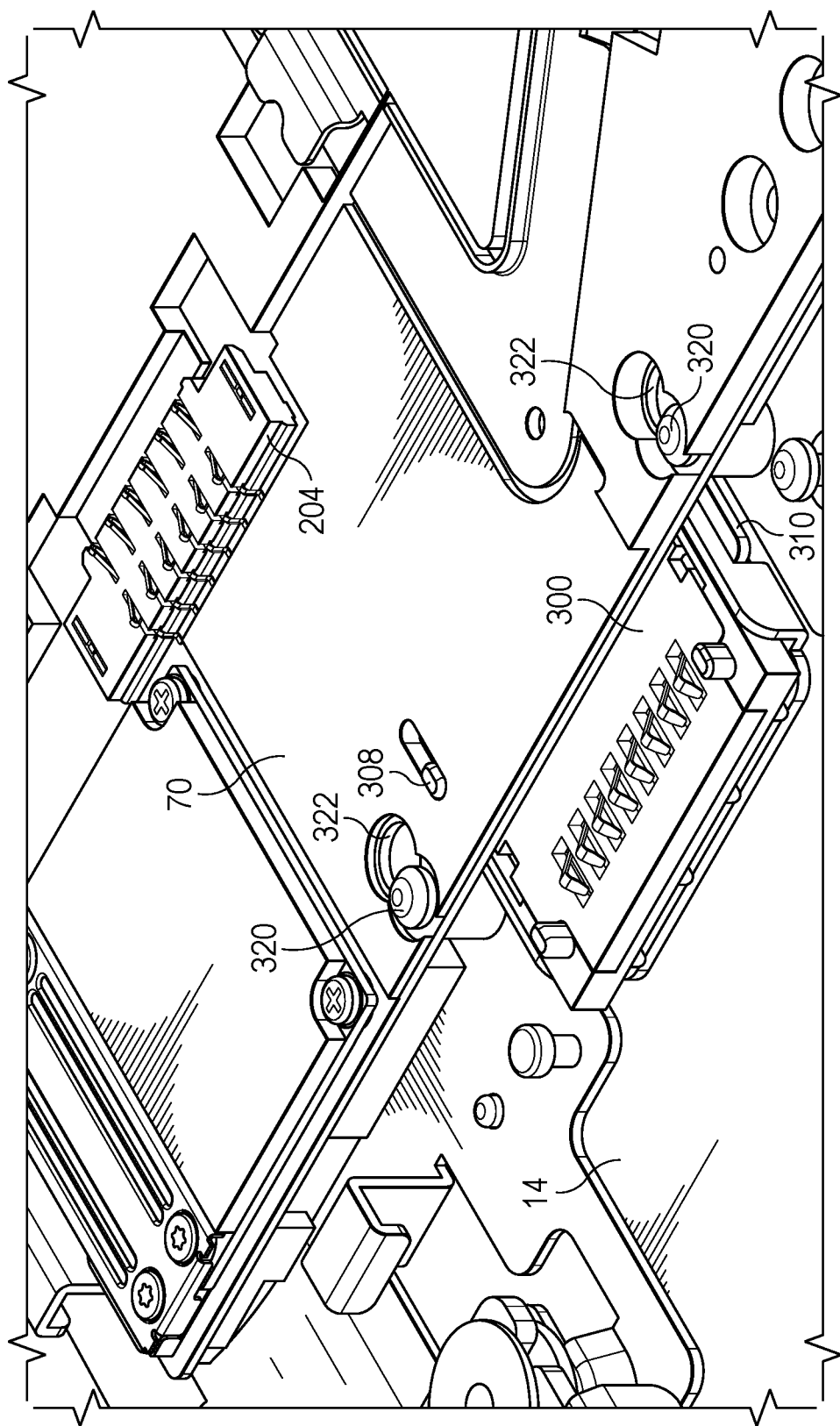
FIG. 24 depicts a front perspective view of the battery connector coupled to the main housing portion and having the motherboard coupled in place to electrically interface with the battery.

Referring now to FIG. 24, a front perspective view depicts battery connector 300 coupled to the main housing portion and having motherboard 70 coupled in place to electrically interface with the battery. Alignment post 308 fits through a slot of motherboard 70 so that motherboard 70 can slide over top of connector 300. Retention nut 320 fits into the wide portion of pear-shaped slot 322 so that motherboard 70 engages under a lip of retention nut 320 when slid forward. As is described above, motherboard 70 is then held in position to prevent rearward sliding by engagement of a cooling fan at one side of the motherboard. Keyboard connector is carried with motherboard 70 to align with the keyboard once the cover housing is coupled into place, thereby completing the battery connect signal. Connector 300 couples in an aligned position with alignment structure 310 fit into a coupling structure of main housing portion 14. The fit and alignment structures support fully automated assembly and disassembly of the information handling system, such as with robotic arms. Further, the components are built in a modular manner that encourages reuse of those having longer useful life and recycling of like materials after system breakdown.

Figure 25:
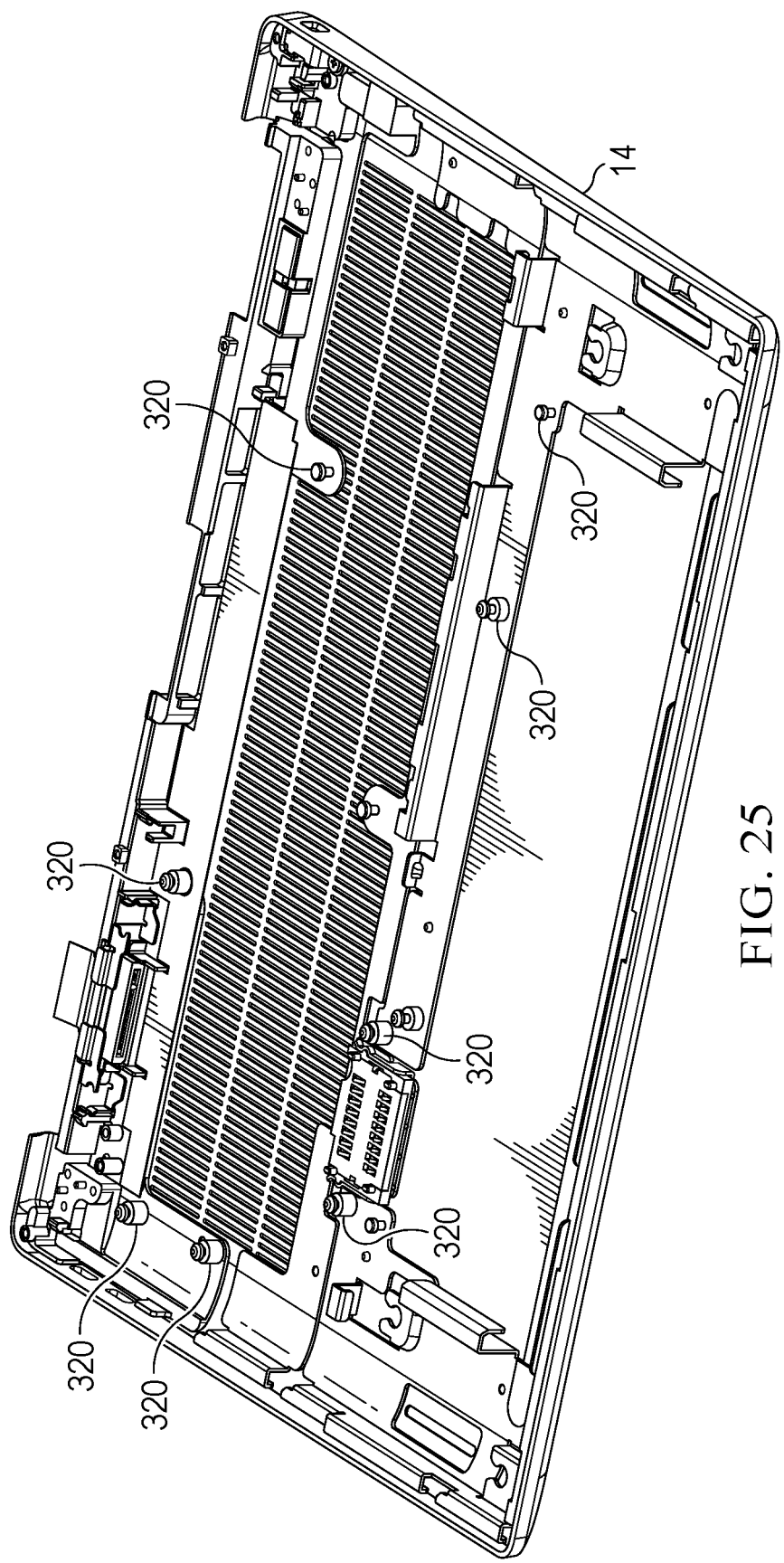
FIGS. 25, 25A and 25B depict an example of an assembly of components with retention nuts 320.
Figure 25A:
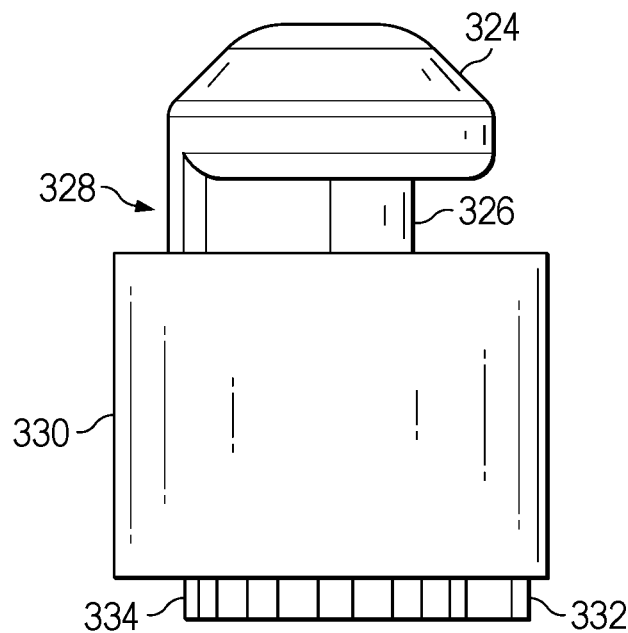
Figure 25B:
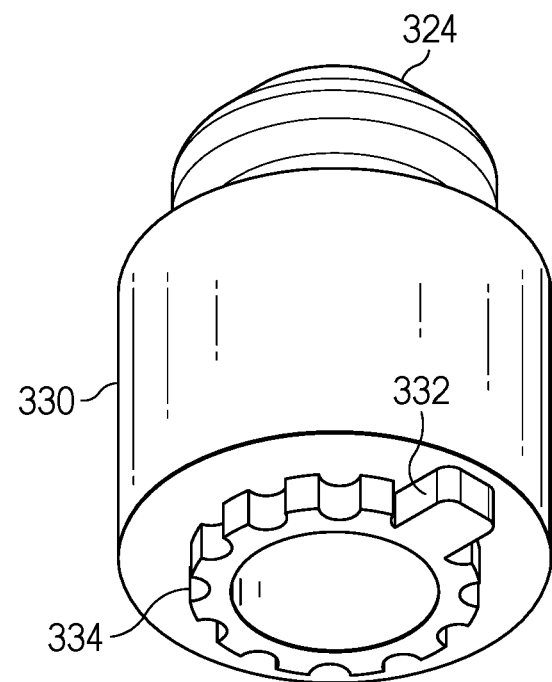

Referring now to FIGS. 25, 25A and 25B, an example of assembly of components with retention nuts 320 is depicted. FIG. 25 depicts an example of distribution of retention nuts 320 on the bottom surface of main housing portion 14 as desired to secure components to main housing portion 14. To aid automated assembly of information handling system 10, retention nuts 308 couple in position with a press fit or, alternatively an eye hole type of retention. FIG. 25A depicts a side view of retention nut 320 that couples in position with a clinch nut 334 having a directional element 332 at a base main body 330. A nipple portion 324 at the top side of main body 330 has an engagement portion 326 that provides lip to fit over the motherboard or other component that is to be coupled in place. Engagement portion 326 has an overtravel feature 328 on one side that stops a component from sliding relative to retention nut 320 past a certain distance. For instance, when nipple portion 324 fits into the larger circumference portion of a motherboard pear-shaped slot, engagement portion 326 extends over the top surface of the motherboard to hold it in position with sliding movement halted by overtravel feature 328. FIG. 25B depicts a bottom front perspective view of retention nut 320 to illustrate clinch nut 334, which has a desired alignment in the housing enforced by directional element 332.

Figure 26:
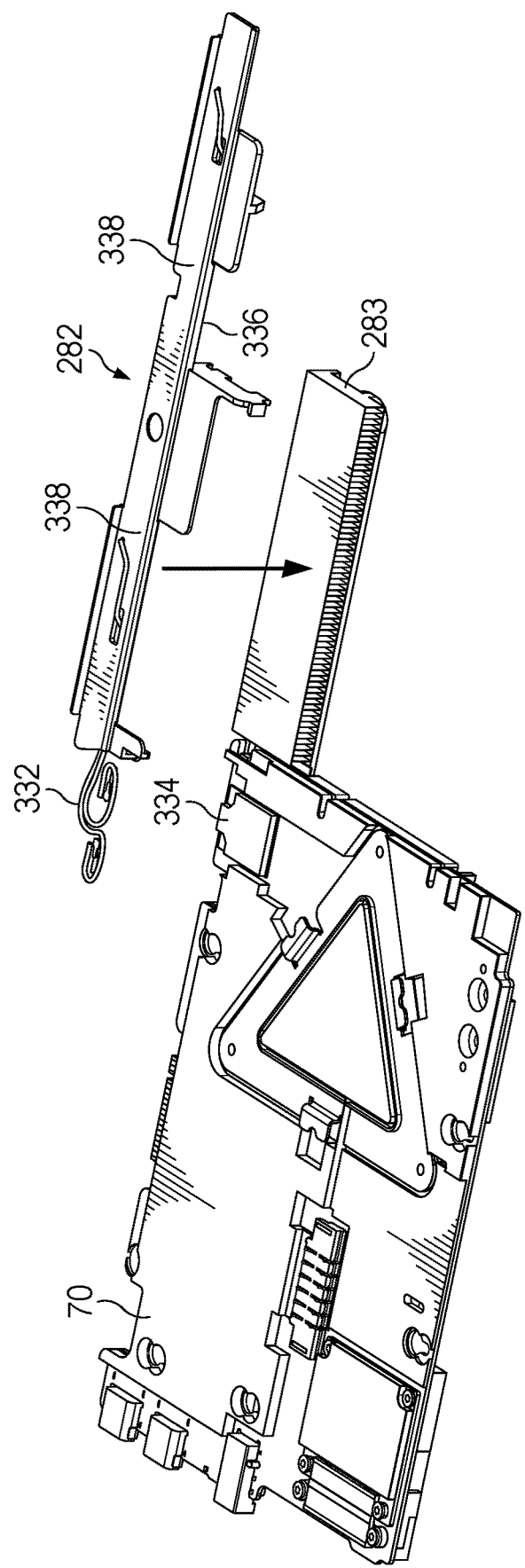
FIG. 26 depicts an antenna module integrated in a modular thermal solution.

Referring now to FIG. 26, an antenna module 338 integrated in modular thermal solution is depicted. Exhaust 282 is depicted exploded from cooling channel 283 and motherboard 70. A radio integrated circuit 334 couples to motherboard 70 and interfaces with the CPU to communicate information as wireless signals sent external to the information handling system. For example, radio integrated circuit 334 communicates with wireless local area networks (WLAN) in the 5 and 2.4 GHz bands, with wireless personal area networks (WPAN) like BLUETOOTH in the 2.4 GHz band and/or wireless wide area networks (WWAN) through commercial cell network frequency bands. A coaxial cable 332 carries the wireless signals between the radio and the antenna modules 338. Antenna modules 338 and coaxial cables 332 integrate into a single module assembly with exhaust 282 so that antenna modules 338 maintain a desired position for transmitting and receiving wireless signals, such as embedded within a nonconductive material 336 and relative to a ground plane provided by metal of cooling channel 283. In one embodiment, cooling channel 283 may include a free floating or ungrounded portion that acts as a parasitic element to direct wireless signals. The exhaust vent 282 as a completed module helps to optimize radio performance while leveraging the thermal solution as part of the antenna footprint for a more efficient architecture.

Figure 27B:
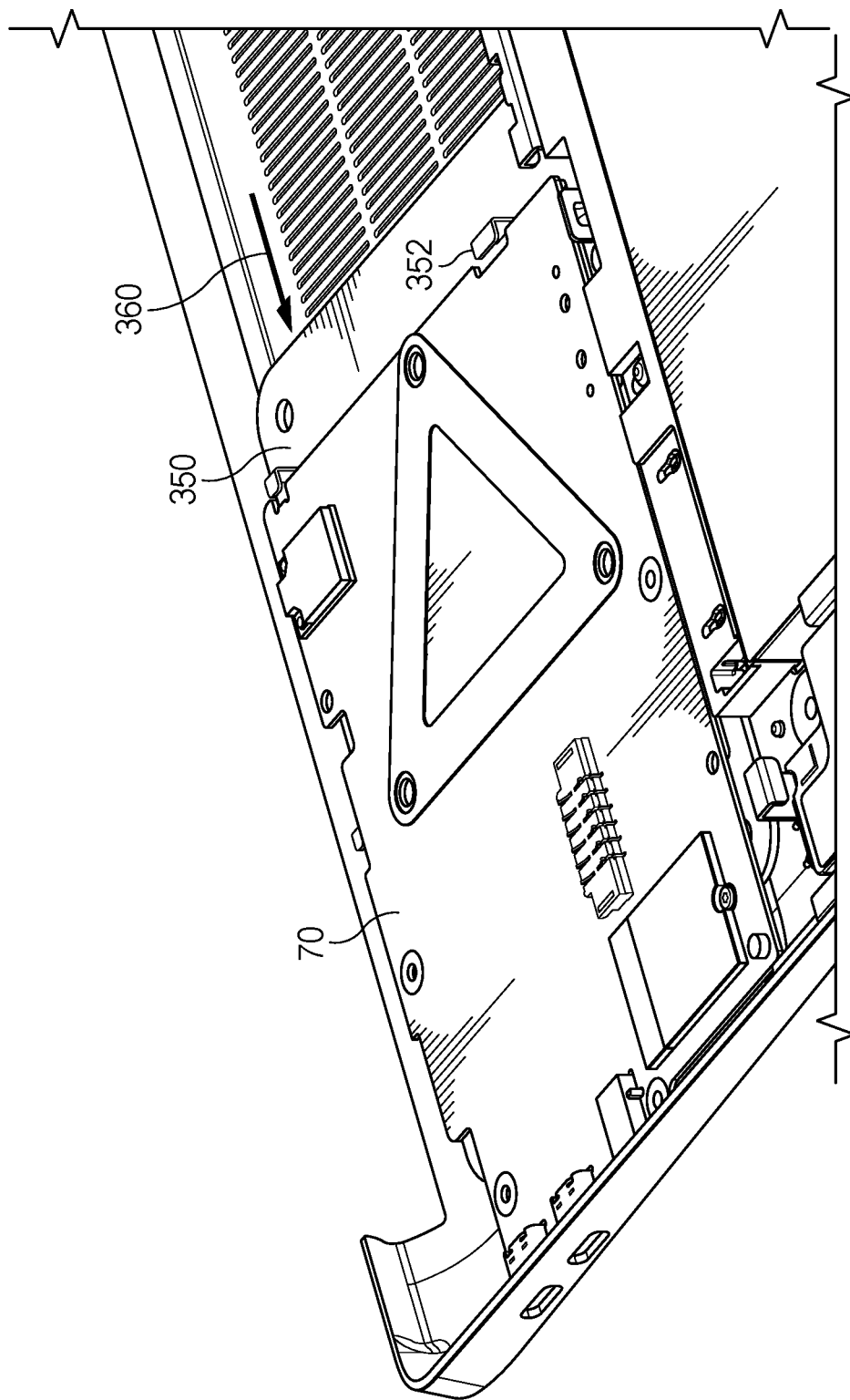
Figure 27C:
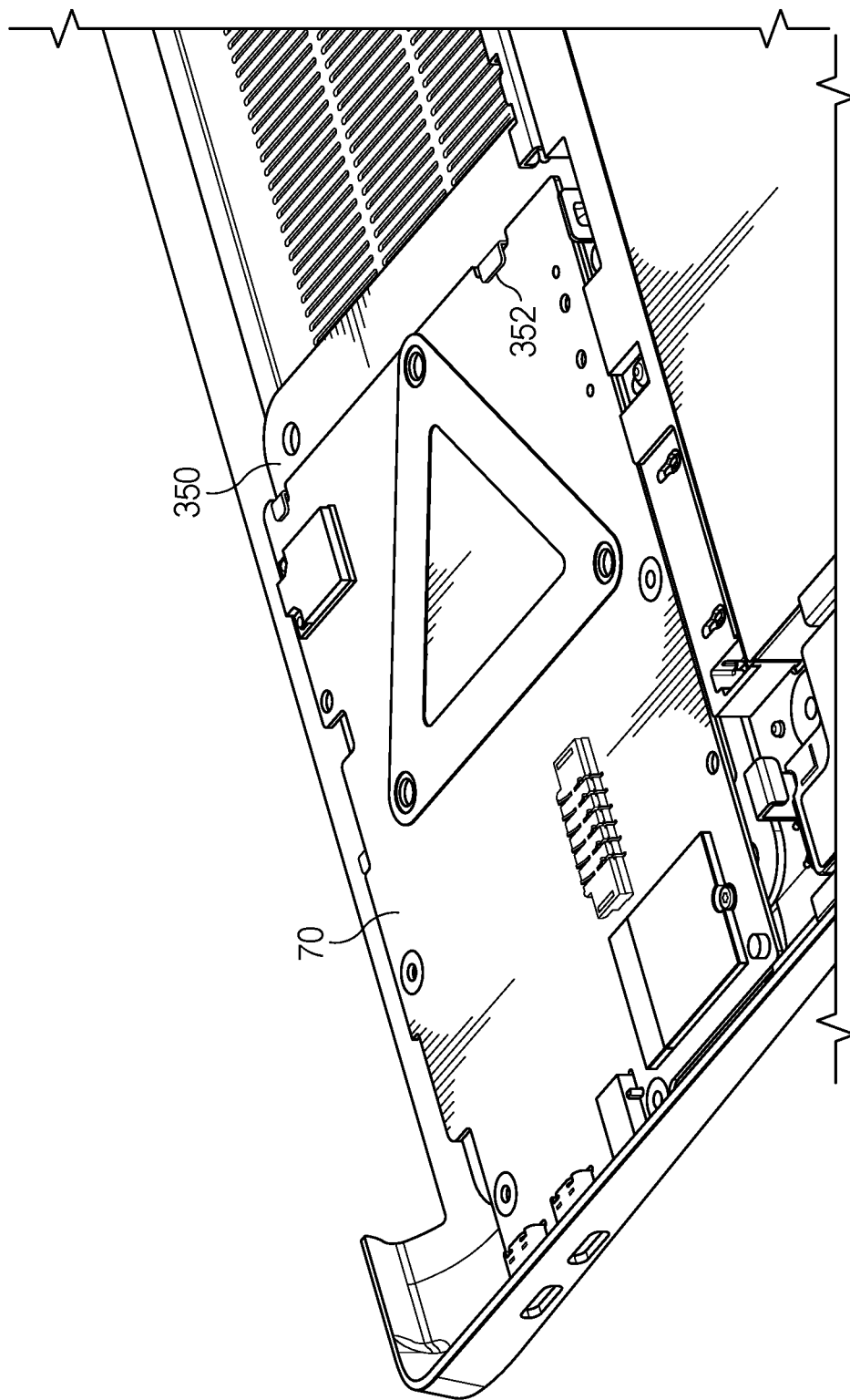

Referring now to FIGS. 27A, 27B and 27C, an alternative embodiment is depicted for coupling a motherboard to the information handling system main housing portion. FIG. 27A depicts motherboard 70 in position to fit on main housing portion 14 over a bi-stable flexure plate 350 configured to couple the motherboard in place. Bi-stable flexure plate 350 is slid to the right relative to a fixed position of a central portion 354 having a pin 357 or other coupling device to fix its position. Motherboard 70 is placed downward on bi-stable flexure plate 350 with a hook 352 slid to the right to provide space for motherboard 70 to rest in place, as indicated by arrow 358. FIG. 27B illustrates that once motherboard 70 rests on bi-stable flexure plate 350, a push to the right as indicated by arrow 360 overcomes the bias of the fixed central portion 354 so that hook 352 engages over top of motherboard 70. FIG. 27C depicts hook 352 coupled over motherboard 70 so that motherboard 70 is coupled in place with a bias of central portion 354 holding bi-stable flexure plate 350 in place.

Figure 28A:
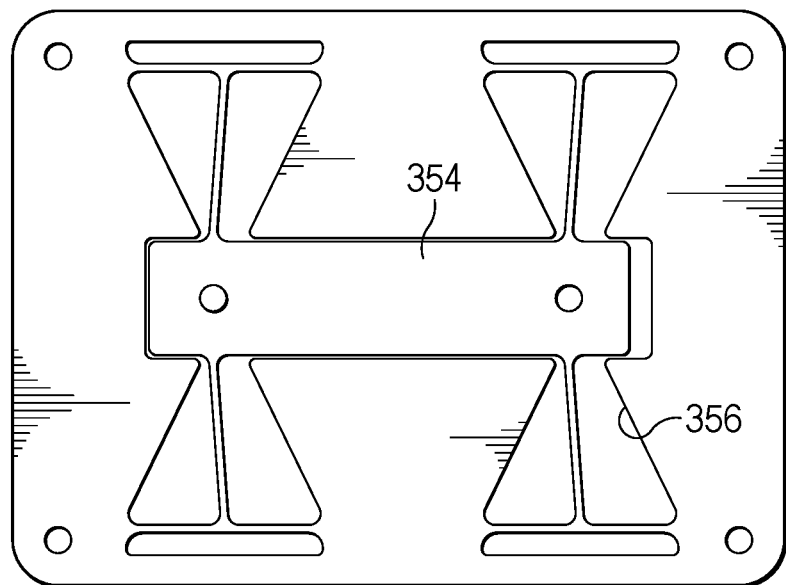
FIGS. 28A and 28B depict an example of a flexible slide motion arrangement for coupling a motherboard to the main housing portion.
Figure 28B:
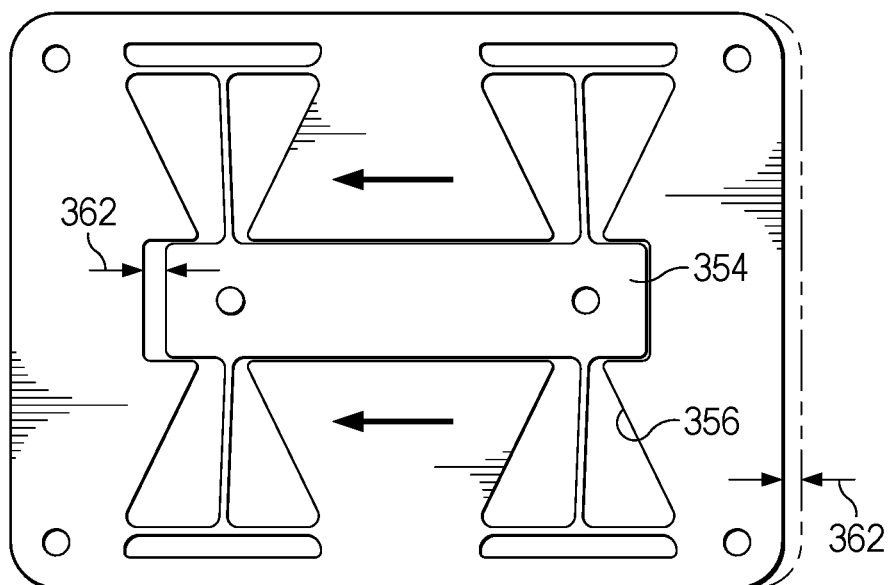

Referring now to FIGS. 28A and 28B, an example is depicted of a flexible slide motion arrangement for coupling motherboard 70 to the main housing portion. FIG. 28A depicts the central portion 354 in an unlocked position having a gap 362 to the right side of bi-stable flexure plate 350. Eight triangular shaped openings are formed by a structure 356 on opposing sides of central portion 354. FIG. 28B depicts that a gap 362 moves from the right side to the left side of central portion 354 when bi-stable flexure plate 350 is slid to the right as indicated by the arrows. In the example embodiment, gap 362 is approximately 4 mm. When gap 362 is on a side of central portion 354, the length of the central member of structure 356 works against movement of the gap to the other side central portion 354. In order to shift bi-stable flexure plate 350 to the locked position, the central arm between the triangle structures has to flex so that the resilient nature of the material biases the bi-stable flexure plate 350 to assume a position to the right or to the left of central portion 354 and need a substantial force to change the position. The amount of force needed to couple and release motherboard 70 is adjusted by adjusting the type and amount of material used to define structure 356, including the size of the triangles.

Figure 29:
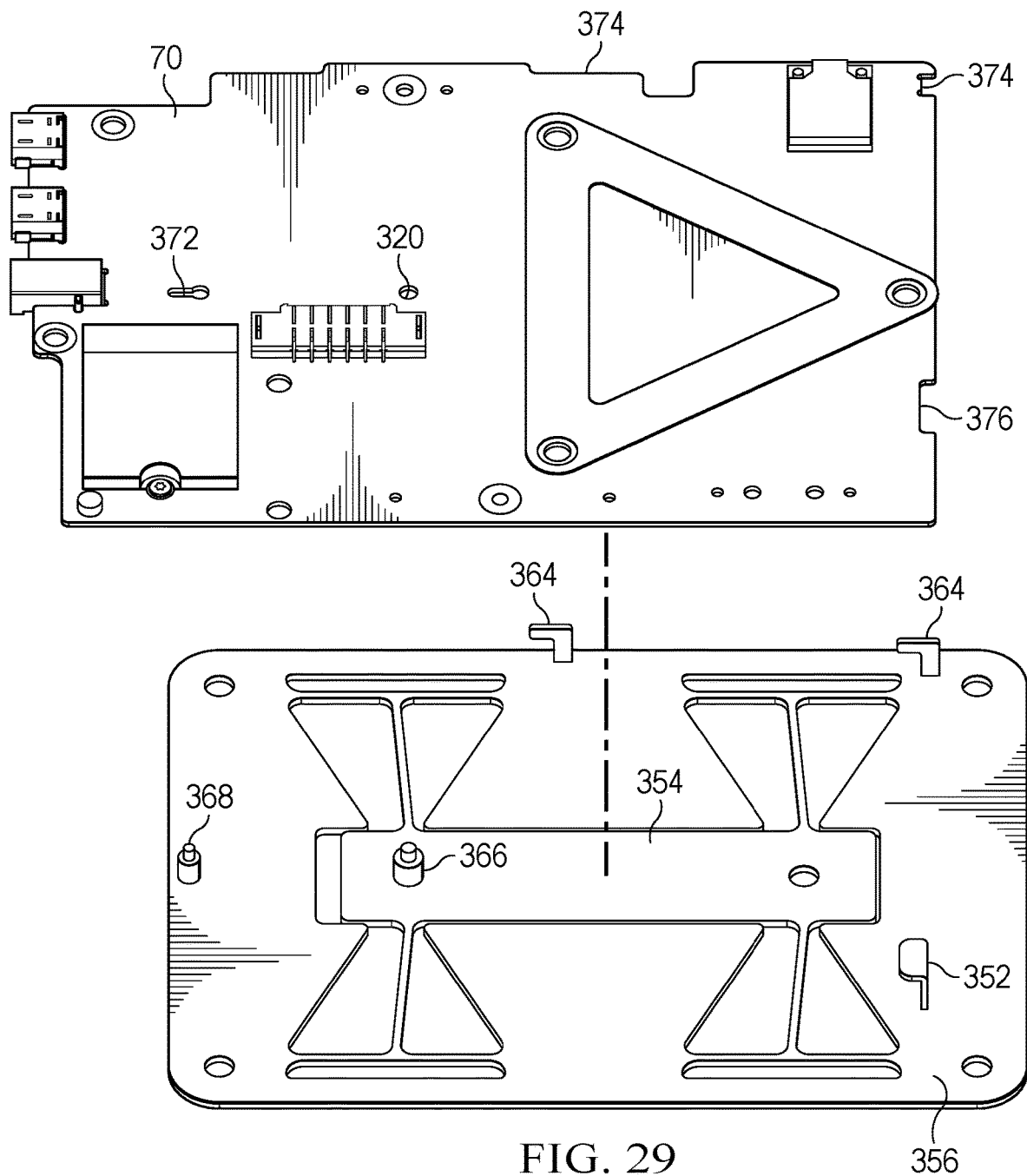
FIG. 29 depicts a bi-stable flexure plate for coupling a motherboard to a main housing portion.

Referring now to FIG. 29, a bi-stable flexure plate is depicted for coupling a motherboard to a main housing portion. In the example embodiment, a central pin 366 fits through an opening 370 of motherboard 70 to hold motherboard 70 in position relative to central portion 354, which is itself coupled to a fixed position relative to the main housing portion. A sliding pin 368 engages in a slot opening 372 to allow the bi-stable flexure plate 350 to slide relative to mother board 70 during locking and unlocking. Side coupling clips 364 align with slots 374 of motherboard 70 and hook 352 aligns with slot 376. A push left or right on the bi-stable flexure plate 350 changes the bias of triangle structure 356 to adjust between locked and unlocked positions relative to motherboard 70. In one embodiment, bi-stable flexure plate 350 is made of a resilient plastic by an injection mold process and pins 366 and 368 elevate mother board 70 in a raised position to aid with thermal management.

Although the present invention has been described in detail, it should be understood that various changes, substitutions and alterations can be made hereto without departing from the spirit and scope of the invention as defined by the appended claims.

What is claimed is:

1. An information handling system comprising:
a housing having an interior;
a motherboard coupled to the housing interior;
a processor coupled to the motherboard and operable to execute instructions that process information;
a memory coupled to the motherboard and interfaced with the processor, the memory operable to store the instructions and information;
a radio coupled to the motherboard and interfaced with the processor, the radio operable to communicate information as wireless signals;
an exhaust coupled to the housing proximate the motherboard and integrating an antenna interfaced with the radio and operable to transmit and receive the wireless signals;
a coaxial cable interfaced with antenna and the radio to communicate the wireless signals between the antenna and radio; and
a nonconductive material integrating the antenna and coaxial cable with the exhaust, the coaxial cable extending from the exhaust to couple with the radio.

2. The information handling system of claim 1 wherein the radio communicates wireless signals in a 2.4 GHz band.

3. The information handling system of claim 1 further comprising:
a cooling fan coupled to the housing proximate the motherboard to direct air through the exhaust to exterior the housing; and
a cooling channel disposed between the cooling fan and exhaust and thermally coupled with the processor.

4. The information handling system of claim 3 wherein the cooling channel provides a ground plane for the antenna.

5. An information handling system comprising:
a housing having an interior;
a motherboard coupled to the housing interior;
a processor coupled to the motherboard and operable to execute instructions that process information;
a memory coupled to the motherboard and interfaced with the processor, the memory operable to store the instructions and information;
a radio coupled to the motherboard and interfaced with the processor, the radio operable to communicate information as wireless signals;
an exhaust coupled to the housing proximate the motherboard and integrating an antenna interfaced with the radio and operable to transmit and receive the wireless signals;
a cooling fan coupled to the housing proximate the motherboard to direct air through the exhaust to exterior the housing; and
a cooling channel disposed between the cooling fan and exhaust and thermally coupled with the processor;
wherein:
the cooling channel provides a ground plane for the antenna;
the cooling fan extends a connector to a bottom surface of the motherboard; and
the motherboard has cooling fan contact pads to interface with the connector to provide power and control to the cooling fan.

6. The information handling system of claim 5 further comprising:
plural retention nuts coupled to the housing;
wherein the motherboard has plural openings aligned with the plural retention nuts, the motherboard sliding from a rearward released position to a forward engaged position having the motherboard engaged under a lip of the plural retention nuts.

7. The information handling system of claim 6 wherein the cooling fan couples to the motherboard when the motherboard is in the engaged position to retain the motherboard in the engaged position.

8. The information handling system of claim 7 further comprising an embedded controller interfaced with the cooling fan and controlling a speed of the cooling fan with a pulse width modulation signal.

9. A method for assembly of an information handling system, the method comprising:
integrating an antenna in an exhaust;
coupling the exhaust to a housing of the information handling system aligned with a cooling fan; and
interfacing the antenna with a radio coupled to a motherboard in the housing to communicate wireless signals;
embedding the antenna in a nonconductive material of the exhaust;
embedding a coaxial cable in the nonconductive material, the coaxial cable interfaced with the antenna and having a radio connector extending out of the nonconductive material; and
interfacing the radio and antenna through the coaxial cable.

10. The method of claim 9 further comprising:
sliding a cooling fan connector interface of the cooling fan to engage a cooling fan connector of the motherboard; and
communicating power and control information from the motherboard to the cooling fan through the cooling fan connector to the cooling fan connector interface.

11. The method of claim 10 wherein:
the motherboard cooling fan connector is at a bottom side of the motherboard; and
the cooling fan connector interface slides orthogonal to the motherboard sliding to engage the motherboard cooling fan connector.

12. The method of claim 11 further comprising:
coupling a housing cover to the housing over the motherboard; and
extending a cooling fan lock member from the housing cover to engage the cooling fan in a position that retains the cooling fan position.

13. The method of claim 12 further comprising:
sliding the motherboard from a rear to a forward position to engage under a lip of a retaining nut; and
retaining the motherboard in the forward position by engagement of the motherboard with the cooling fan.

14. The method of claim 13 further comprising:
coupling a cooling channel between the cooling fan and the exhaust; and
communicating wireless signals having the cooling channel as a parasitic element for the antenna.

15. An information handling system exhaust assembly comprising:
an exhaust configured to direct airflow from a cooling fan out of a housing and having at least some nonconductive material;
an antenna module embedded in the nonconductive material;
a coaxial cable embedded in the nonconductive material and interfaced with the antenna module; and a coaxial cable connector extending out of the exhaust and configured to couple to a radio to communicate wireless signals with the antenna module.

16. The information handling system exhaust assembly of claim 15 further comprising:
a cooling channel coupled between the cooling fan and the exhaust;
wherein the cooling channel has a conductive material configured as a parasitic element to direct wireless signals.

17. The information handling system exhaust assembly of claim 15 further comprising:
a cooling channel coupled between the cooling fan and the exhaust;
wherein the cooling channel has a conductive material configured as a ground plane of the antenna module.

* * * * *